United States Patent
Tsujikawa et al.

(10) Patent No.: US 6,721,207 B2
(45) Date of Patent: *Apr. 13, 2004

(54) NON-VOLATILE MEMORY SYSTEM INCLUDING A CONTROL DEVICE TO CONTROL WRITING, READING AND STORAGE AND OUTPUT OPERATIONS OF NON-VOLATILE DEVICES INCLUDING MEMORY CELLS AND DATA LATCHES

(75) Inventors: Tetsuya Tsujikawa, Hamura (JP); Atsushi Nozoe, Hino (JP); Michitaro Kanamitsu, Ome (JP); Shoji Kubono, Akishima (JP); Eiji Yamamoto, Kodaira (JP); Ken Matsubara, Ome (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/211,342

(22) Filed: Aug. 5, 2002

(65) Prior Publication Data

US 2002/0191459 A1 Dec. 19, 2002

Related U.S. Application Data

(63) Continuation of application No. 10/011,723, filed on Dec. 11, 2001, now Pat. No. 6,507,520, which is a continuation of application No. 09/539,633, filed on Mar. 30, 2000, now Pat. No. 6,233,174, which is a continuation of application No. 09/250,157, filed on Feb. 16, 1999, now Pat. No. 6,046,936.

(30) Foreign Application Priority Data

Feb. 16, 1998 (JP) .............................................. 10-32776

(51) Int. Cl.$^7$ .............................................. G51C 16/04
(52) U.S. Cl. .............................. 365/185.28; 365/185.29
(58) Field of Search ........................ 365/185.28, 185.29, 365/185.01

(56) References Cited

U.S. PATENT DOCUMENTS

| | | | |
|---|---|---|---|
| 5,570,315 A | 10/1996 | Tanaka et al. | 365/185.22 |
| 5,602,789 A | 2/1997 | Endoh et al. | 365/185.03 |
| 5,761,122 A | 6/1998 | Nakamura et al. | 365/185.21 |
| 5,768,191 A | 6/1998 | Choi et al. | |
| 5,870,218 A | 2/1999 | Jyouno et al. | 365/185.03 |
| 5,982,667 A | 11/1999 | Jyouno et al. | 365/185.22 |
| 6,222,763 B1 | 4/2001 | Sato et al. | |
| 6,226,708 B1 | 5/2001 | McGoldrick et al. | 711/103 |

FOREIGN PATENT DOCUMENTS

| | | |
|---|---|---|
| JP | 62-099996 | 5/1987 |
| JP | 9297996 | 11/1997 |

OTHER PUBLICATIONS

"Flash Memory—Multi–Level Memory, US Makers Set About Technological Development Precedent and Bring to the Commercial Stage in 1995, Getting Over Reliability," (with English translation).

Primary Examiner—Hoai Ho
(74) Attorney, Agent, or Firm—Antonelli, Terry, Stout & Kraus, LLP

(57) ABSTRACT

A non-volatile memory system is provided with a control device and non-volatile memory devices, each including memory cells and data latches. The control device supplies commands to the non-volatile memory devices, including a write command, and first and second read commands. When the control device supplies the write command with write address information and data for storing in the non-volatile memory device, it stores the data to the data latches and then to the memory cells, and then verifies storage. When the control device supplies the first read command with read address information, the nonvolatile memory device reads data stored in the memory cells to the data latches and then outputs the data in the data latches to the control device. When the control device supplies the second read command, the non-volatile memory device outputs data in the data latches to the control device.

4 Claims, 57 Drawing Sheets

| MODE | FIRST COMMAND | SECOND COMMAND |
|---|---|---|
| READ | 00H | NO NEED |
| RECOVERY READ | 01H | NO NEED |
| ERASE | 20H | B0H |
| PROGRAM | 1FH | 40H |
| ADDITIONAL PROGRAM | 10H | 40H |
| RETRY PROGRAM | 1AH | NO NEED |
| PARTIAL ERASE | 2FH | B0H |
| REWRITE | 11H | 40H |

FIG. 4

| | TITLE | DEFINITION |
|---|---|---|
| I/O7 | Ready/$\overline{\text{Busy}}$ | "VOH"=Ready "VOL"=Busy |
| I/O6 | Reserved | |
| I/O5 | Erase Check | "VOH"=Fail "VOL"=Pass |
| I/O4 | Program Check | "VOH"=Fail "VOL"=Pass |
| I/O3 | Reserved | |
| I/O2 | Reserved | |
| I/O1 | Reserved | |
| I/O0 | Reserved | |

STATUS REGISTER

| PROGRAM DATA | I/O 4 | I/O 0 | DLL | DLR |
|---|---|---|---|---|
| 01 | 0 | 1 | 0 | 1 |
| 00 | 0 | 0 | 0 | 0 |
| 10 | 1 | 0 | 1 | 0 |
| 11 | 1 | 1 | 1 | 1 |

INPUT PROGRAM DATA

OPERATION VOLTAGE

PROGRAM FLOW (CASE 1)

"10" PROGRAM DATA

ERRATIC/DISTURB DETECTION OPERATION

FIG. 21

| DATA LATCH PROCESS | CALCULATION CONTENT (SENSE LATCH DATA OF SELECTED MAT SIDE) |
|---|---|
| "01" PROGRAM DATA | $A+\bar{B}$ |
| "00" PROGRAM DATA | $A+B$ |
| "10" PROGRAM DATA | $\bar{A}+B$ |
| "00" ERRATIC DETECTION DATA | $\overline{A+B}$ |
| "10" ERRATIC DETECTION DATA | $A \cdot \bar{B}$ |
| "11" DISTURB DETECTION DATA | $A \cdot B$ |

A: UPPER DIGIT DATA    B: LOWER DIGIT DATA

FIG. 22

| A UPPER DIGIT | B LOWER DIGIT | $A+\bar{B}$ | $A+B$ | $\bar{A}+B$ | $\overline{A+B}$ | $A \cdot \bar{B}$ | $A \cdot B$ |
|---|---|---|---|---|---|---|---|
| 0 | 1 | 0 | 1 | 1 | 0 | 0 | 0 |
| 0 | 0 | 1 | 0 | 1 | 1 | 0 | 0 |
| 1 | 0 | 1 | 1 | 0 | 0 | 1 | 0 |
| 1 | 1 | 1 | 1 | 1 | 0 | 0 | 1 |

VWV3 VERIFY
PRECHARGE G-BL

VRD1=1.0V+Vth
VRD2=0.5V−Vth

"10" ERRATIC DETECTION DATA LATCH PROCESS WAVEFORM
(R-SIDE SELECTED IN MULTI-POWER SUPPLY METHOD)

"11" DISTURB DETECTION DATA LATCH PROCESS WAVEFORM
(R-SIDE SELECTED IN MULTI-POWER SUPPLY METHOD)

FIG. 54

|  |  | SELECTED BLOCK | | NON-SELECTED BLOCK | |
|---|---|---|---|---|---|
|  |  | SELECTED WORD | NON-SELECTED WORD | SELECTED WORD | NON-SELECTED WORD |
| READ | | 2.4/3.2/4.0V<br>1.0V / Vss<br>Vss | Vss<br>1.0V / Vss<br>Vss | Vss<br>OPEN / OPEN<br>Vss | Vss<br>OPEN / OPEN<br>Vss |
| ERASE | | -16V<br>2.0V / 2.0V<br>2.0V | Vss<br>2.0V / 2.0V<br>2.0V | 2.0V<br>2.0V / 2.0V<br>2.0V | 2.0V<br>2.0V / 2.0V<br>2.0V |
| PROGRAM | PROGRAM DATA | 15.1/15.8/17.0V<br>Vss / OPEN<br>Vss | 4.5V<br>Vss / Vss<br>Vss | OPEN<br>OPEN / OPEN<br>Vss | Vss<br>OPEN / OPEN<br>Vss |
| | NON-PROGRAM DATA | 15.1/15.8/17.0V<br>6.5V / OPEN<br>Vss | 4.5V<br>6.5V / Vss<br>Vss | OPEN<br>OPEN / OPEN<br>Vss | Vss<br>OPEN / OPEN<br>Vss |
| | VERIFY | 2.8/3.6/4.5V<br>1.0V / Vss<br>Vss | Vss<br>1.0V / Vss<br>Vss | Vss<br>OPEN / OPEN<br>Vss | Vss<br>OPEN / OPEN<br>Vss |
| | ERRATIC DETECT DISTURB DETECT | 2.1/3.1/3.9V<br>1.0V / Vss<br>Vss | Vss<br>1.0V / Vss<br>Vss | Vss<br>OPEN / OPEN<br>Vss | Vss<br>OPEN / OPEN<br>Vss |

RETRY PROGRAM FLOW

RECOVERY READ FLOW

IN THE CASE THAT DATA OF ALL SECTORS ARE REWRITTEN

NON-VOLATILE MEMORY SYSTEM INCLUDING A CONTROL DEVICE TO CONTROL WRITING, READING AND STORAGE AND OUTPUT OPERATIONS OF NON-VOLATILE DEVICES INCLUDING MEMORY CELLS AND DATA LATCHES

This is a continuation of application Ser. No. 10/011,723, filed Dec. 11, 2001 now U.S. Pat No. 6,507,520, which is a continuation of Serial No. 09/539,633, filed Mar. 30, 2000 (now U.S. Pat. No. 6,233,174), which is a continuation application of Ser. No. 09/250,157, filed on Feb. 16, 1999 (now U.S. Pat. No. 6,046,936), the entire disclosures of which are hereby incorporated by reference.

BACKGROUND OF THE INVENTION

The present invention is related to a semiconductor device having a non-volatile storage element capable of storing at least 4 values of information (namely, 2 bits of information) into a single memory cell, for example, an electrically reprogramable non-volatile semiconductor memory device such as a flash memory, and furthermore, is related to a technique effectively applicable to a data processing system such as a file memory system with using this non-volatile semiconductor memory device.

Conventionally, non-volatile semiconductor storage devices such as flash memories have been proposed. These storage devices are capable of storing information by injecting and/or extracting electrons with respect to floating gates. A flash memory owns a memory cell transistor having a floating gate, a control gate, a source, and a drain. In this memory cell transistor, when electrons are injected into the floating gate, a threshold voltage would be increased, whereas when electrons are extracted from the floating gate, the threshold voltage would be decreased. The memory cell transistor may store therein information in response to the higher/lower threshold voltages with respect to a word line voltage (namely, voltage applied to control gate) used to read out data. Although not having restriction intentions, the lower threshold voltage condition of the memory cell transistor will be referred to as an "erasing state", and the higher threshold voltage condition thereof will be referred to as a "writing state" in this specification.

Among these flash memories, such a flash memory is available that information having more than 4 values can be stored in a single memory transistor. For example, such multi-level memories are described in Japanese Publication "NIKKEI MICRODEVICE" issued in November, 1994, pages 48 to 49, and further Japanese laid-opened Patent Application No.9-297996/1997 opened in 1997.

SUMMARY OF THE INVENTION

In a multi-level memory, for example, if a selection can be made of one state from an erasing state and first to third writing states whose threshold voltages are different from each other with respect to this erasing state, then information having four values can be stored in a single memory cell transistor. If an erasing operation is carried out before a writing operation, then information having four values can be stored by determining that all of the first to third writing states is not selectable, or any one of the first to third programing states is selected. In this programing operation, such program control information is required so as to determine as to whether or not the programing operations are selected in order to separately obtain the first programing state through the third programing state. To save such program control information, a sense latch circuit and a data latch circuit, provided on each of bit lines, may be employed.

A sense latch circuit is constructed of, for example, a static latch. One end of each of bit lines is connected to a pair of input/output terminals of this sense latch circuit, and a drain of the above-described memory cell transistor is connected to each of these bit lines. Moreover, a data latch circuit is connected to the other end of each of bit lines. When either a readout voltage or a verify (verification) voltage is applied to a control gate of the memory cell transistor, the above-described sense latch circuit senses as to whether or not a current may flow through the source-to-drain path. At this time, the bit line provided on one operation non-selected side of the sense latch circuit is precharged to a reference level. Also, when data is written by forming a high potential difference between the control gate of the memory cell transistor and the drain thereof, the drain voltage is increased, or decreased every memory cell, so that it is possible to discriminate the program selection to the memory cell from the program non-selection to the memory cell. In this case, the sense latch circuit latches the data in correspondence with the program selection, and the program non-selection. This latched data corresponds to the above-explained program control information.

Such program control information is produced via a data converting circuit every 2 bits of externally supplied program data, and then is latched by the sense latch circuit of the program-selected bit line and by each of the data latch circuits for the bit line pair which commonly use this sense latch circuit. In the case that the programing operation is carried out in unit of a word line, the program control information is previously latched into the above-described sense latch circuit and data latch circuit as to all of bit lines. Which commonly use the word line.

In the programing operation, a decision is first made as to whether or not the memory cell is brought into the first program state in accordance with the program control information latched by the sense latch circuit. Next, another decision is made as to whether or not the memory cell is brought into the second program state in accordance with the program control information which has been internally transferred from one data latch circuit to the sense latch circuit. Moreover, a further decision is made as to whether or not the memory cell is brought into the third program state in accordance with the program control information which has been internally transferred from the other data latch circuit to the sense latch circuit. In this manner, the information having the four values specified by the 2-bit data can be stored into a single memory cell. In the above-explained programing operations from the first programing state to the third programing state, such a verify operation is carried out as to whether or not the threshold voltage of the memory cell reaches the threshold voltage allocated to each of the first to third programing states.

At this time, there is such a memory cell which is brought into an overprograming state among these memory cells with respect to each of the first to third programing states. In this memory cell, the threshold voltages under preceding/succeeding programing states cannot be discriminated from each other. For instance, the threshold voltage of the memory cell of the first programing state becomes high, which cannot be discriminated from the threshold voltage of the second programing state. In such a case, in order to retry the programing operation from the beginning stage, after the erasing operation is carried out with respect to the memory cell to be written, the above-explained programing operation is retried.

However, when the programing operations from the first programing state to the third programing state are once carried out, the program control information which has been first latched into the sense latch circuit would be overwritten by another program control information internally transferred from the data latch circuit to thereby disappear. As a result, when the reprograming operation is performed due to the overprograming operation, the same program data must be again received from the external device. To this end, the control circuit for access-controlling the flash memory must save the program data in a work memory or the like for the time being after the programing operation is carried out with respect to the flash memory. Thus, the work load for access-controlling the flash memory would also be increased. The Inventors could reveal that this fact may lower the access efficiency of the flash memory, or the data processing efficiency.

Furthermore, in such a case that the programing operation itself will finally fail due to the failure operation of the reprograming operation caused by the overprograming operation, it is imaginable that the program data existed in this failure programing operation is stored into another storage area of this flash memory, or another flash memory. Similar to the previous case, the flash memory related to this failure programing operation can no longer save the program data at this time. As a consequence, also in this failure case, the control circuit for access-controlling the flash memory must save the program data in a work memory or the like for the time being after the programing operation for this flash memory. Thus, this fact may lower the access efficiency of the flash memory, or the data processing efficiency.

An object of the present invention is to provide a semiconductor device in which program data is not lost by a programing operation, and this program data is externally supplied to a data latch circuit in order to program information having multi-levels to the respective memory cells.

Another object of the present invention is to provide a semiconductor device which is no longer required to again receive the externally supplied program data in such a case that a programing operation of multi-level information is retried with respect to a memory cell.

A further object of the present invention is to provide such a semiconductor device that when a programing operation is accomplished under abnormal condition, the program data which has been internally saved at the end of this abnormal programing operation can be rewritten by designating another memory address.

A still further object of the present invention is to provide a semiconductor device that when a programing operation is accomplished under abnormal condition, the program data related to the end of this abnormal programing operation can be outputted outside this semiconductor device.

The above-described objects and other objects, and also novel features of the present invention may be apparent from a detailed description of the present specification and the accompanying drawings.

The typically disclosed invention will now be summarized as follows:

[1] A semiconductor device, according to a first aspect of the present invention, is featured by that in a semiconductor device capable of storing information having multi-levels into a single electrically erasable/programable non-volatile memory cell, in such a case that an overprogram state of the memory cell is detected by performing an overprogram detecting operation (either word disturb detection or erratic detection) in connection with a programing operation, even when the programing operation is retried by again performing the erasing operation, internal saving of the program data required for the programing operation can be guaranteed.

In other words, the semiconductor device is constituted by a sense latch circuit having one pair of input/output terminals; bit lines provided in correspondence with the respective input/output terminals of the sense latch circuit; a plurality of electrically erasable/programable non-volatile memory cells selectively connected to the bit lines; a data latch circuit coupled to each of the bit lines; input/output means capable of interfacing the data latch circuit with an external device; and control means for controlling data reading/erasing/programing operations with respect to the memory cell. The control means causes the data latch circuit to save externally supplied program data; produces program control information every time the data programing operation is carried out; and causes the latch circuit to latch the produced program control information for determining that the non-volatile memory cell is brought into any state of different threshold voltages, the non-volatile memory cell being selected to be connected to the bit line based upon the program data having plural bits saved in the data latch circuit.

In accordance with the above-explained control means, the externally supplied program data is latched into the data latch circuits, and a judgment is carried out as to whether or not the latched program data corresponds to which threshold value of the multi-levels every time the programing operation of the plural stages is performed. Then, the program control information control corresponding to this judgment result is latched into the sense latch circuit. In response to the program information latched in the sense latch circuit, the programing operation for setting the threshold voltages of the multi-levels to the memory cell is carried out in a stepwise manner. As a consequence, even when the programing operation is accomplished, the program data which has been originally and externally supplied is left in the data latch circuits. Accordingly, even when the programing operation of the multi-levels information with respect to the memory cell is carried out again based upon the detection result of the word disturb detecting operation, or the detection result of the erratic detecting operation, the program data is no longer again accepted from the external devices.

To detect the overprograming state, the following method may be employed. That is to say, the above-described control means furthermore judges as to whether or not a threshold voltage which should be set to a memory cell is equal to a threshold voltage corresponding to such a threshold voltage to be checked by an overprogram detection every time a verify reading operation required for the overprogram detection is performed by calculating the data latched by the data latch circuit; the control means causes the sense latch circuit to latch the judgment result; in the case that the judgment result data latched in the sense latch circuit means the corresponding threshold voltage, the control means precharges the bit line; and the control means checks as to whether or not the precharge state of the bit line is changed by the verify reading operation to thereby detect the overprograming state.

The above-explained control means can retry the programing operation after retrying the erasing operation when the overprograming state is detected.

[2] The present invention, according to a second aspect, is directed to a more concrete calculating/controlling means. The calculating/controlling means according to the first aspect is employed so as to latch the program information into the sense latch circuit. In accordance with this second aspect, another semiconductor device is conceived which is capable of storing information having four values into a single electrically erasable/programable non-volatile memory cell by controlling the non-volatile memory cell to be brought into any one of an erasing state, a first programing state, a second programing state, and a third programing state, the threshold voltages of which are different from each other. At this time, the control means causes the data latch circuit to save externally supplied program data; calculates program control information capable of determining that a non-volatile memory cell selectively connected to the bit line is brought into any one of the erasing state, the first programing state; the second programing state, and the third state while using 2-bit program data as a unit, the 2-bit program data being saved by two data latch circuits connected to the one pair of bit lines for commonly using the sense latch circuit; causes the sense latch circuit to latch the calculated control information every time a programing operation is performed; and controls the first programing state to the third programing state in accordance with the latched programing control information.

Concretely speaking, when the sense latch circuit latches program control information for setting as a first logic value, output data on the side of a memory cell connection selecting bit line, the control means causes the memory cell connected to the bit line set as the first logic value to execute the programing operation. The program control information is calculated by the control means in such a manner that with respect to a first program data bit latched in the data latch circuit provided on the side of one memory cell connection selecting bit line and also a second program data bit latched in the data latch circuit provided on the side of the other memory cell connection non-selecting bit line, both the memory cell connection selecting bit lines commonly using the sense latch circuit, an OR gating operation between logically inverted data of the first program data bit and the second program data bit; another OR gating operation between the first program data bit and the second program data bit; and another OR gating operation between the first program data bit and logically inverted data of the second program data bit are carried out based upon the bit line precharge operation by the data latched in the data latch circuits and also the sense operation by the sense latch circuit; and every time the programing operation is performed, the control means causes the sense latch circuit to latch the OR-gated values sequentially acquired by said OR-gating operations; and causes such a memory cell of the memory cell connection selecting bit line in which the latched OR-gated value becomes the first logic value to perform the programing operation.

The above-described means for judging the overprograming state may be realized by the following more concrete example. The control means furthermore judges as to whether or not a threshold voltage which should be set to a memory cell is equal to a threshold voltage corresponding to such a threshold voltage to be checked by an overprogram detection every time a verify reading operation required for the overprogram detection due to the programing operation is performed by calculating the data latched by the data latch circuit; the control means causes the sense latch circuit to latch the judgment result; in the case that the judgment result data latched in the sense latch circuit means the corresponding threshold voltage, the control means precharges the bit line; and the control means checks as to whether or not the precharge state of the bit line is changed by the verify reading operation to thereby detect the overprograming state. The judging calculation is performed by the control means in such a manner that with respect to a first program data bit latched in the data latch circuit provided on the side of one memory cell connection selecting bit line and also a second program data bit latched in the data latch circuit provided on the side of the other memory cell connection non-selecting bit line, both the memory cell connection selecting bit lines commonly using the sense latch circuit, a negative logic OR gating operation between the first program data bit and the second program data bit; an AND gating operation between the first program data bit and logically inverted data of the second program data bit; and another AND gating operation between the first program data bit and the second program data bit are carried out based upon the bit line precharge operation by the data latched in the data latch circuits and also the sense operation by the sense latch circuit. Every time the overprograming detection operation is performed, the control means causes the sense latch circuit to latch as the judgment result data the negative logic OR-gated value and the AND-gated values sequentially acquired from the calculations; and when the sense latch circuit latches such judging result data that the output data on the side of the memory cell connection selecting bit line is equal to a second logic value, the control means precharges the memory cell connection selecting bit line via the precharge circuit.

[3] Even when the programing operation fails, the program data at this time is saved inside the semiconductor device by the above means. While paying an attention to this fact, in the case that the retry program command is accepted after the failure programing operation has been accomplished, the control circuit can program the program data already saved in the data latch circuits at the address supplied in connection with this retry program command. Since the semiconductor device owns such a retry function, the memory controller, or the control apparatus for access-controlling this semiconductor device changes either the program address or the sector address with respect to the semiconductor device in which the programing operation has failed, so that the memory controller, or the control apparatus can perform the reprograming operation.

Also, after the programing operation has been accomplished under abnormal condition, the subject to be rewritten may be changed into another semiconductor device. In this case, when the control circuit receives the recovery read command after the programing operation has failed, the control circuit outputs the program data saved in the data latch circuits DLL and DLR via the input/output means to the external device. Due to this recovery function, the control apparatus can readily reprogram the same data into another semiconductor device other than such a semiconductor device where the programing operation has failed. This control apparatus access-controls either the memory controller of the memory card, or the memory card constituted by the plurality of semiconductor devices.

[4] The reprograming operation may be performed in such a manner that after the erasing operation is carried out by the erase command, the programing operation is performed with respect to the same area by the program command. Such a reprograming process operation may be realized by a single command, namely one reprogram command. The above-described control means is operated as follows. When the first reprogram command is supplied, the reprogram address is fetched, and also the program data is fetched by the data latch circuit. After the second reprogram command is supplied, the area designated by the reprogram address is erased. Subsequently, the programing operation is controlled based upon the data saved in the data latch circuits. As a result, all of the data of a sector can be rewritten by way of a single command.

Also, data reprograming for a portion of a sector may be realized by a single command. That is to say, when a first reprogram command is supplied, the control means fetches a reprogram address and saves data of the fetched address into the data latch circuit; the control means designates a reprogram address within a range of the reprogram address after saving the data of the fetched address so as to latch the program data into the data latch circuit; after a second reprogram command is supplied, the control means erases the program data of the sector area designated by the reprogram address; and subsequently, the control means controls the programing operation based upon the data saved in the data latch circuit and stored at the sector area designated by the reprogram address.

[5] In the case that a semiconductor device is utilized as a file memory, while a management area is allocated to a sector of this semiconductor device, the remaining portion thereof may be opened as a user area. For example, information related to reprograming times and failure/good sectors is stored into the management area. While data is erased in unit of a sector by a user, such a command for automatically setting the management area out of erasing operation is supported. As a result, the semiconductor device and furthermore the file memory can be made more convenient. In view of this point, a partial erasing command may be supported. In other words, when a first partial erasing command is supplied, the control means acquires a sector address; next, when a second partial erasing command is supplied, the control means saves data of a predetermined area into a data latch circuit corresponding to the predetermined area within an area designated by the sector address and also sets data indicative of an erasing state to a data latch circuit corresponding to other areas within the area designated by the sector address; and furthermore, after the control means performs the erasing operation with respect to the area designated by the sector address, the control means executes the program control operation in accordance with the data set to the data latch circuit.

[6] A memory card may be realized by packaging on a card board, the semiconductor device, a memory controller for access-controlling the semiconductor device, and an external interface circuit connected to the memory controller. Also, a data processing system may be arranged by comprising the semiconductor device, a memory controller for access-controlling the semiconductor device, and a processor for controlling the memory controller.

While paying an attention to a retry programing command, a data processing system may be arranged by comprising the semiconductor device, and a control apparatus for outputting both a retry program command and a program address to the semiconductor-device when the control apparatus detects that a programing operation by the semiconductor device is accomplished under failure state. Also, while paying an attention to a recovery read command, a data processing system is arranged by comprising the semiconductor device, and further a control apparatus for outputting a recovery read command to the semiconductor device when the control apparatus detects that a programing operation by the semiconductor device is accomplished under failure state, and also for capturing program data outputted from the semiconductor device to which the recovery read command is supplied, and further for controlling to program the fetched program data into another semiconductor device.

BRIEF DESCRIPTION OF THE INVENTION

FIG. 1 is a schematic block diagram for representing an overall flash memory 1, according to a first embodiment of the present invention, capable of reading/programing 2 bits of information from/into a single memory cell;

FIG. 2 illustratively indicates a device of an example of a memory cell transistor;

FIG. 4 is an explanatory diagram for indicating an example of a corresponding relationship between contents of the respective bits of a status register and input/output terminals I/O0 to I/O7;

Figure 5:
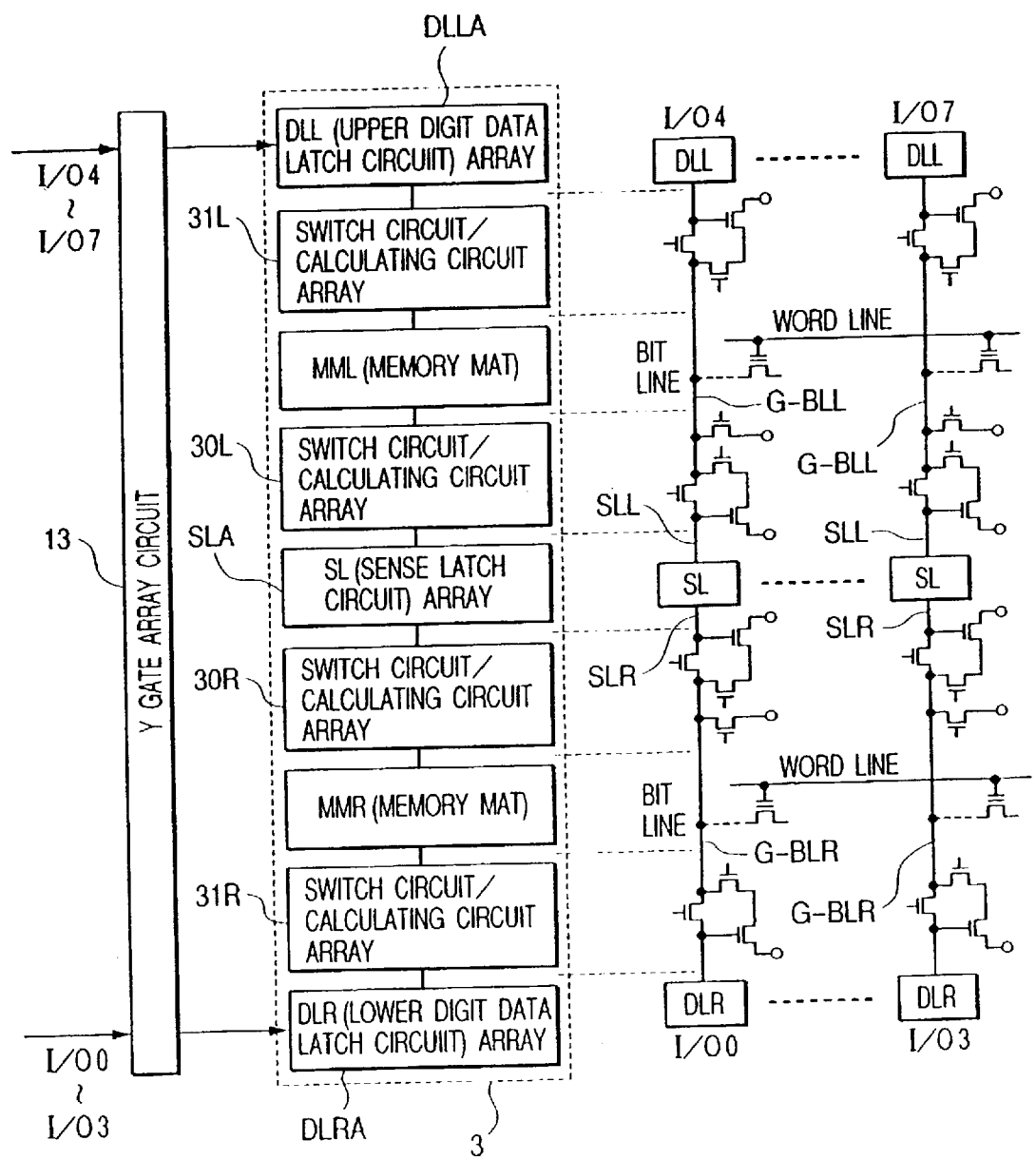
Figures 6, 7:
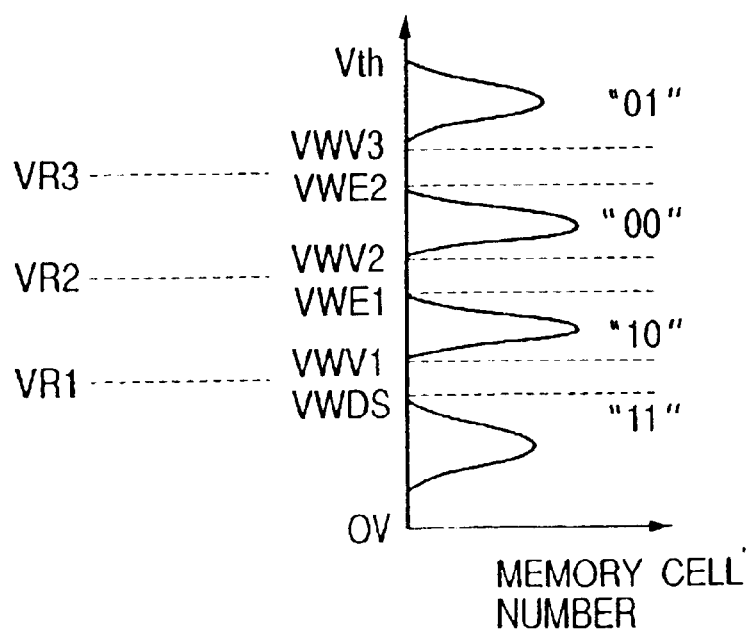
Figure 8:
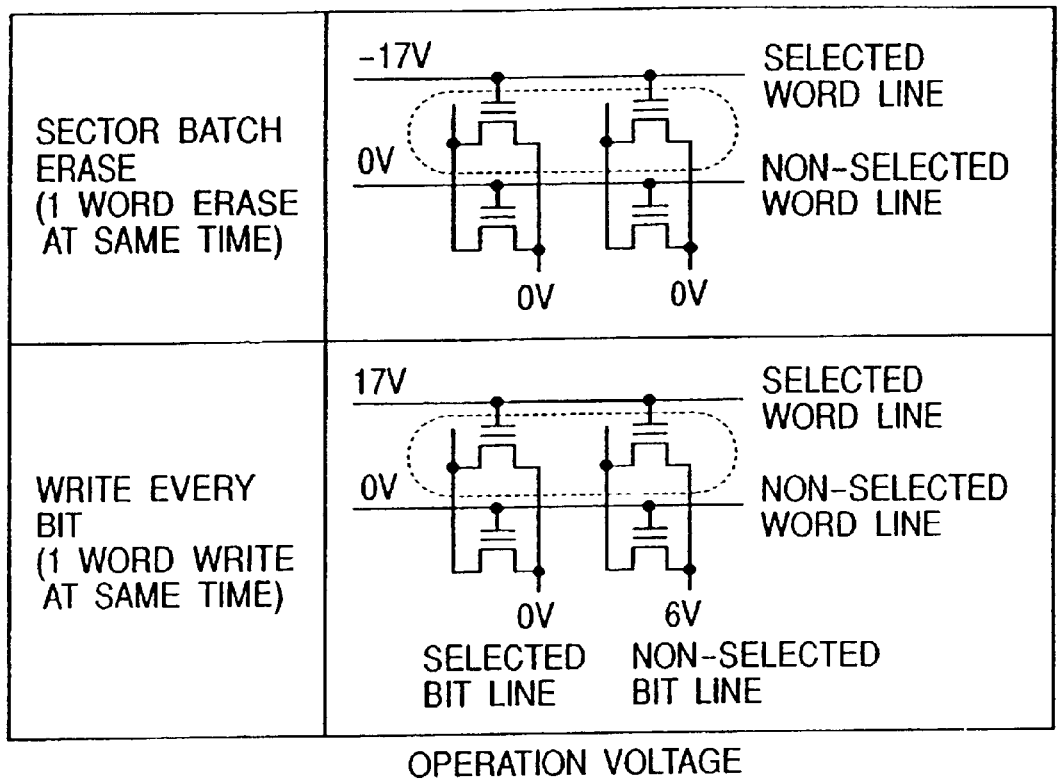
Figure 9:
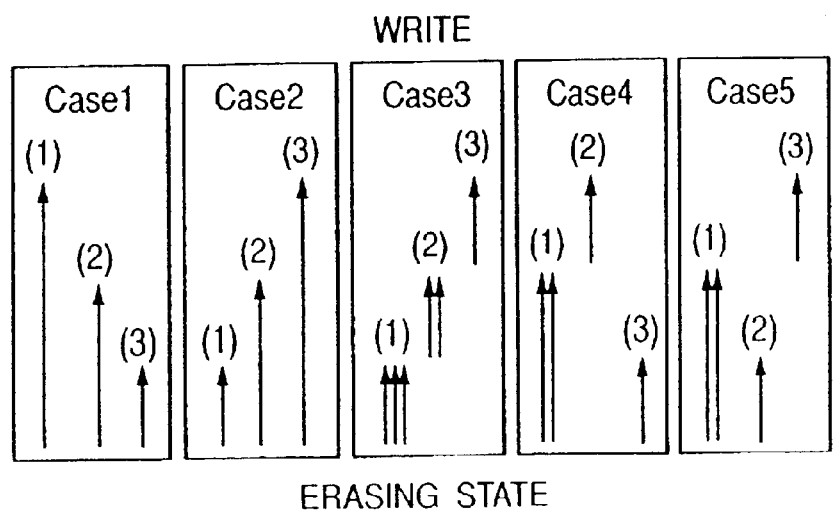
Figure 10:
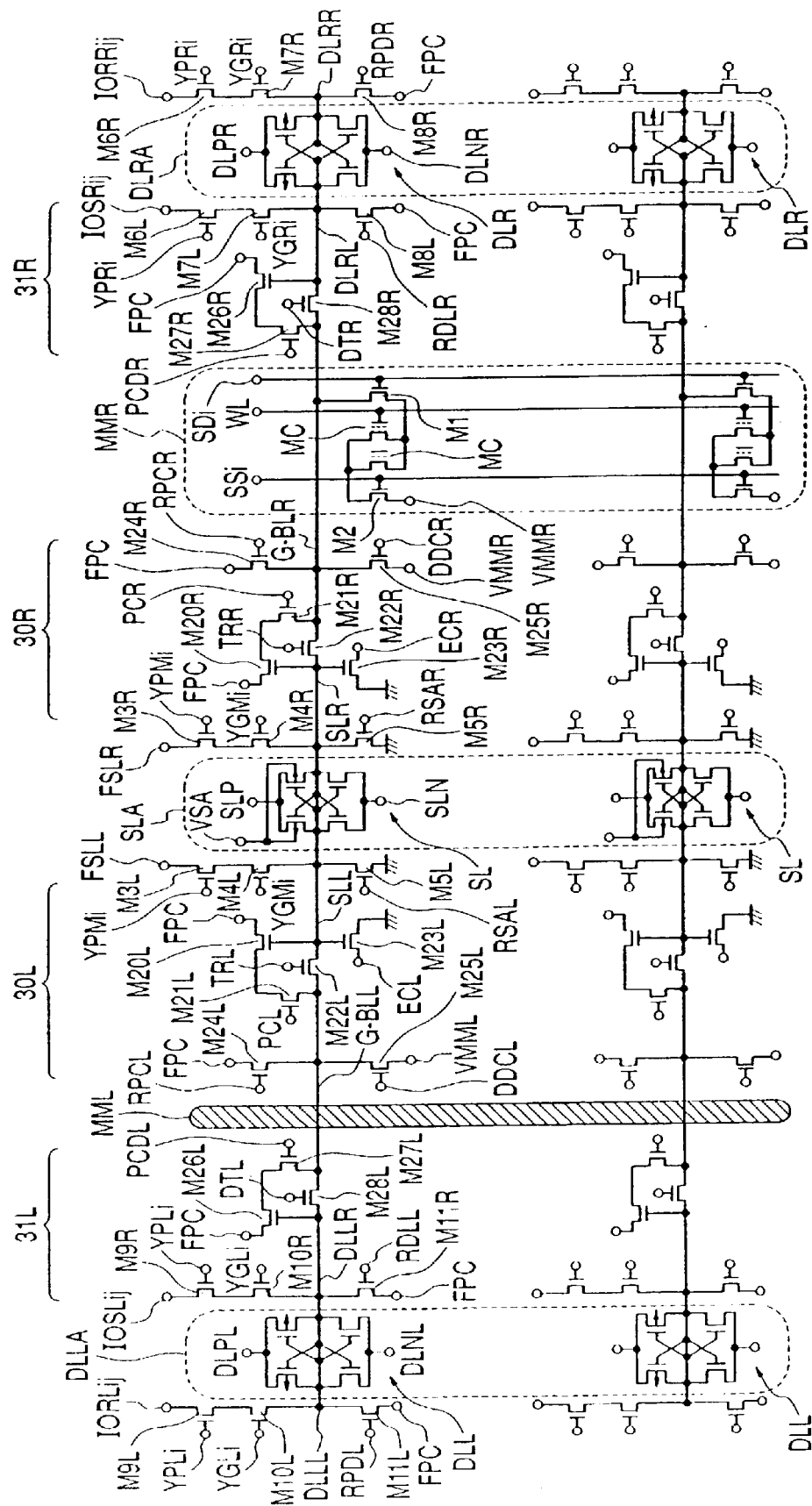
Figure 11:
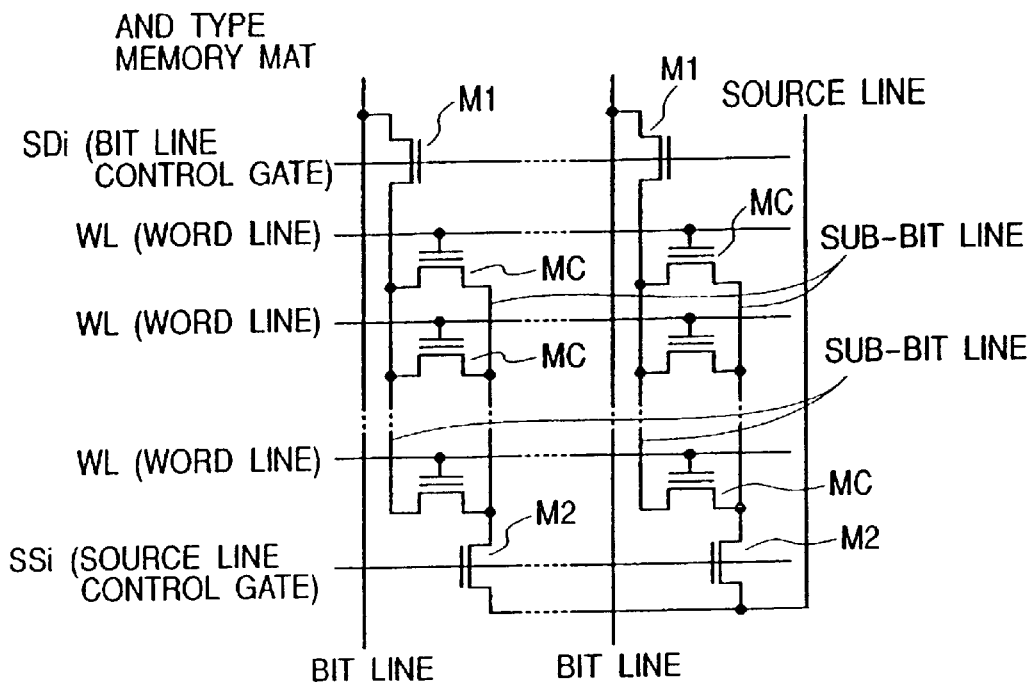
Figure 12:
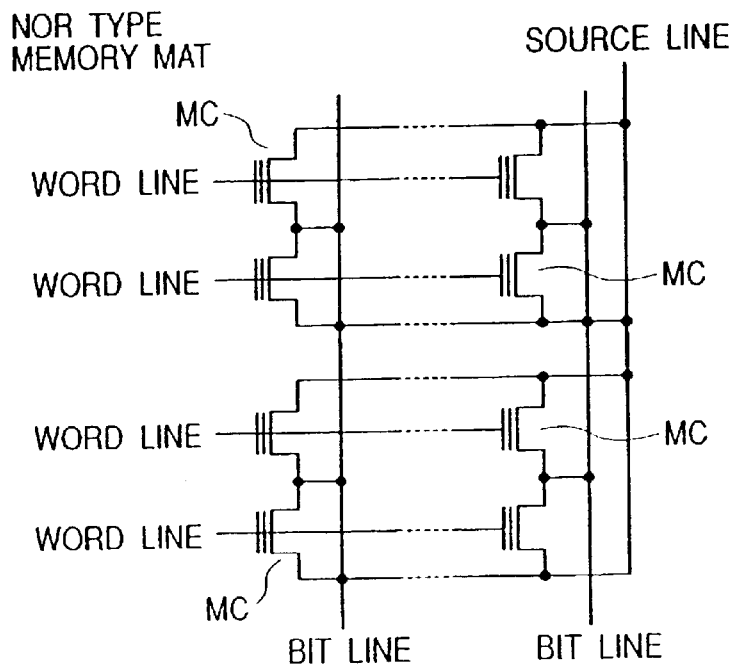
Figure 13:
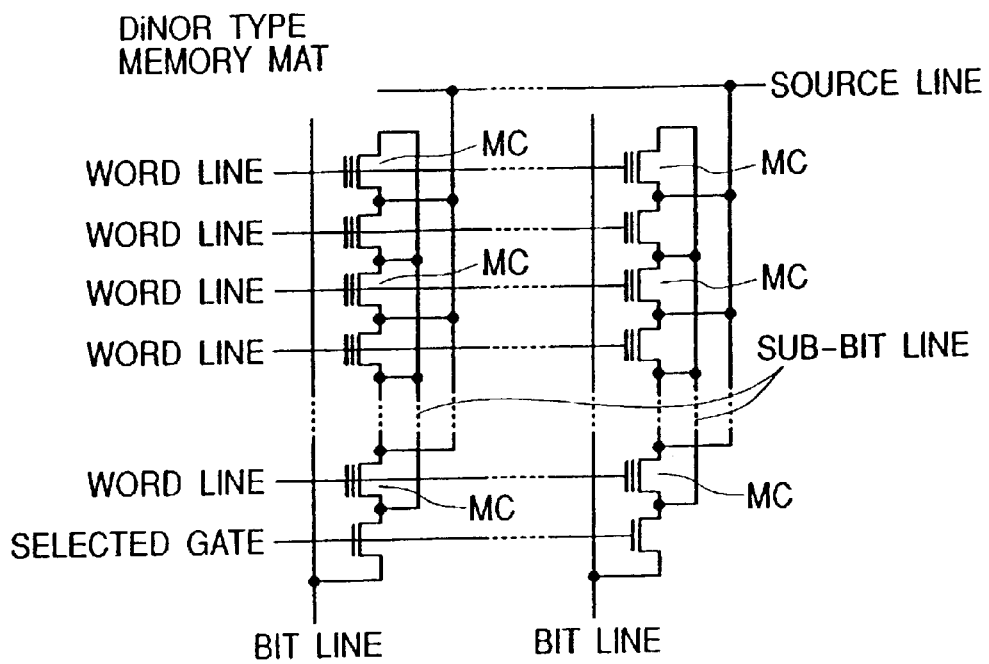
Figure 14:
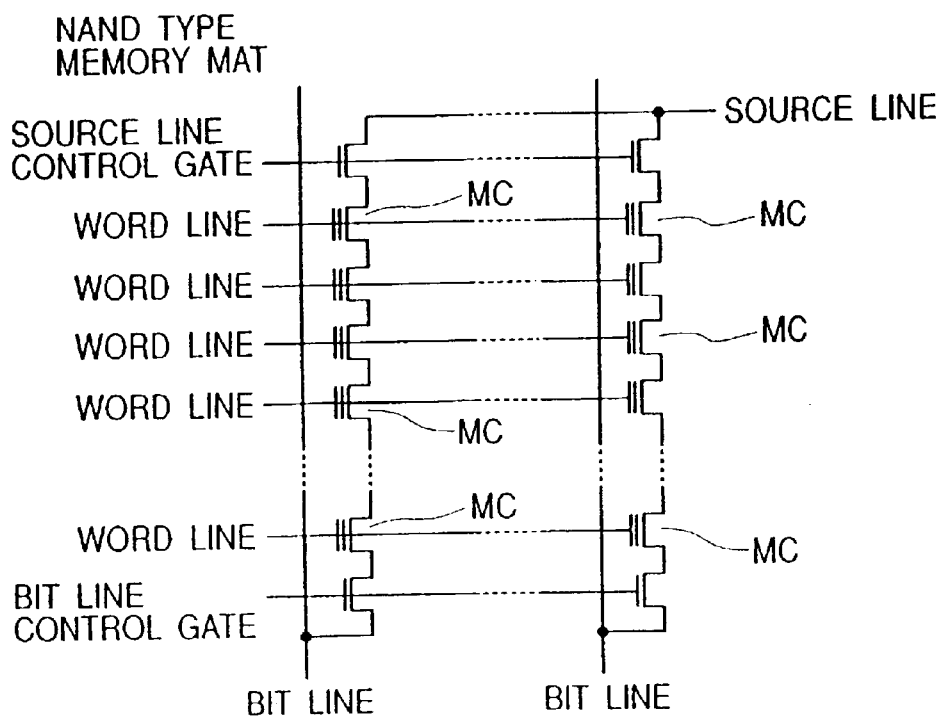
Figure 15:
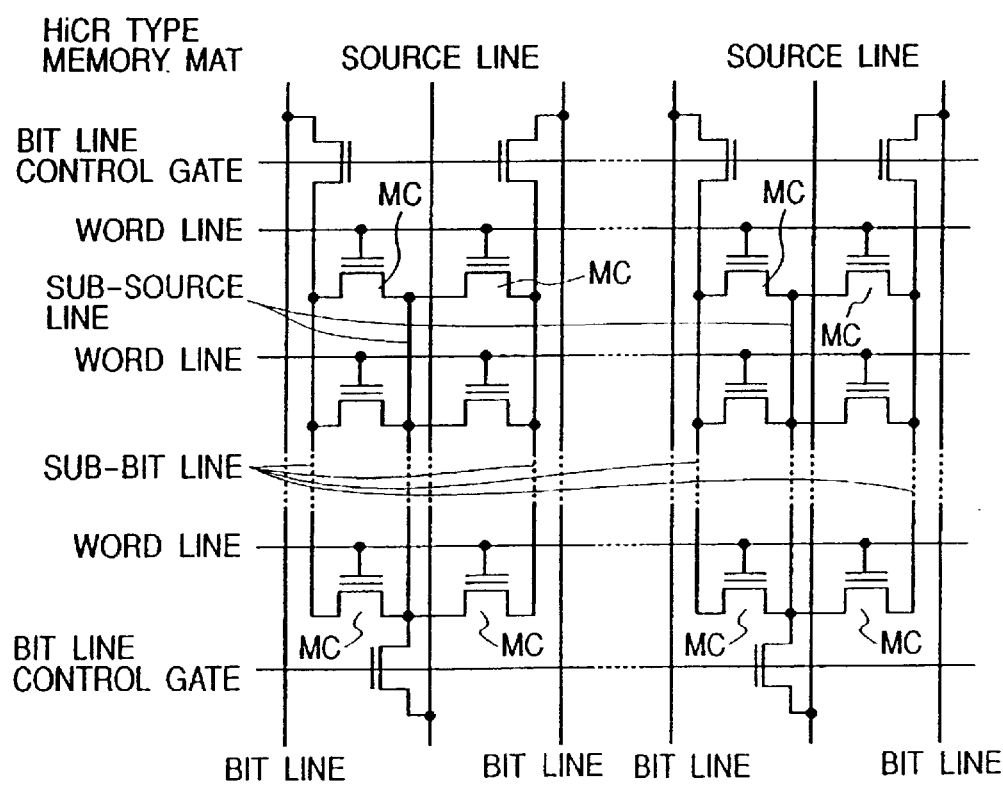
Figure 16:
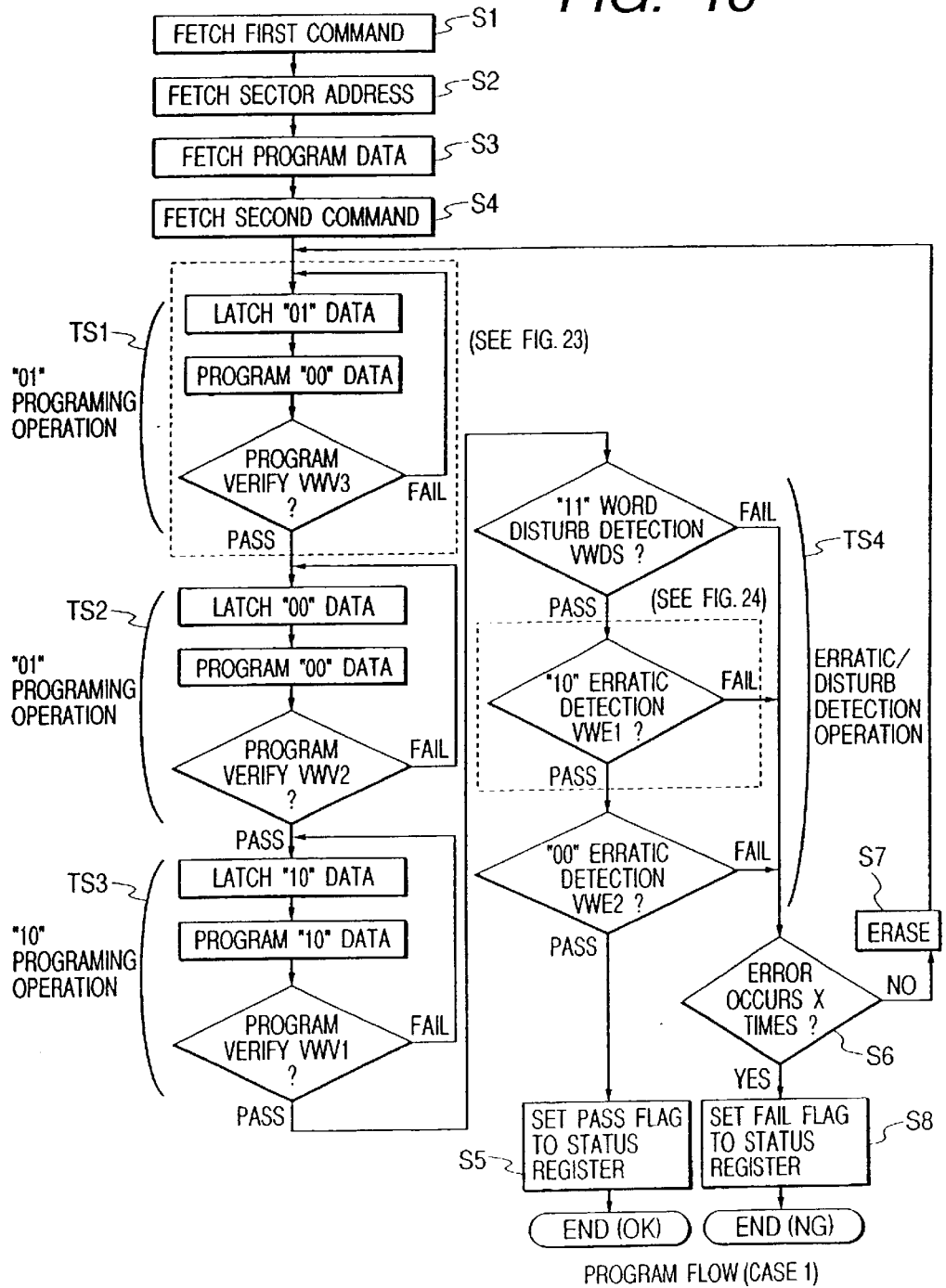
Figure 17:
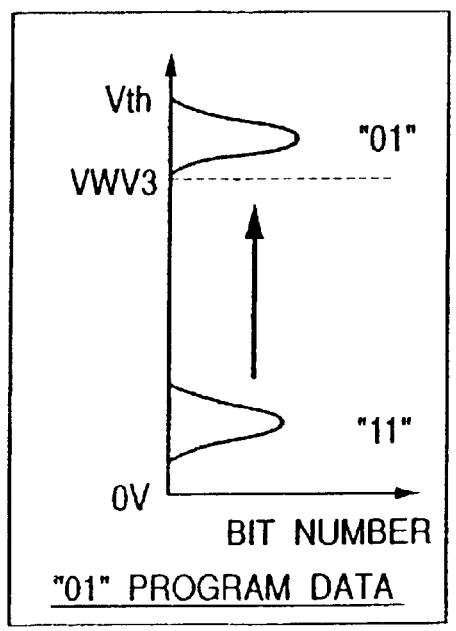
Figure 18:
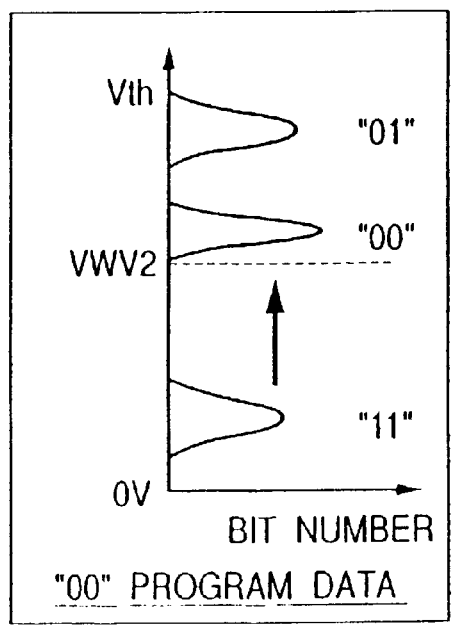
Figure 19:
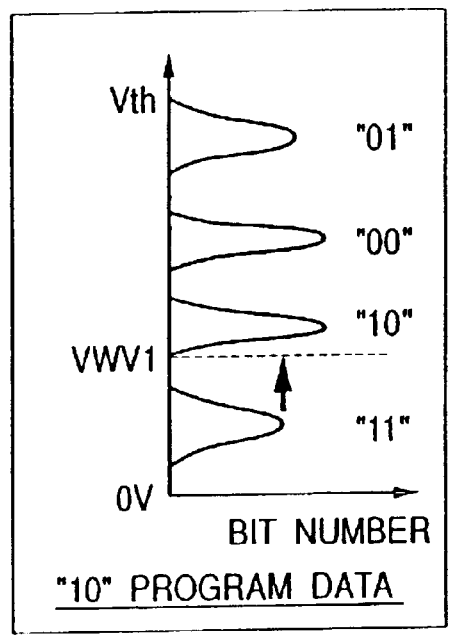
Figure 20:
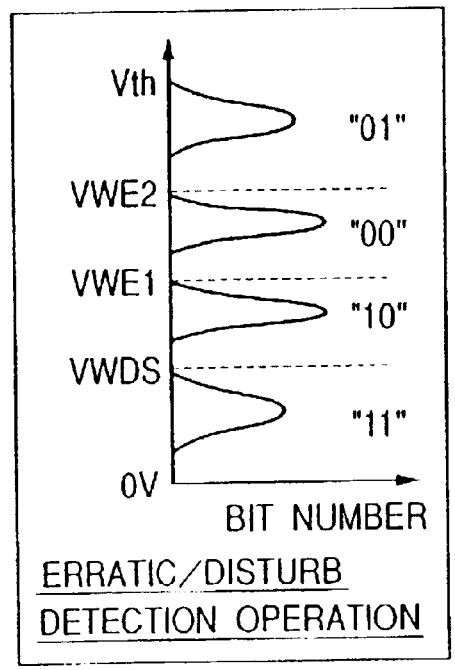
Figure 23:
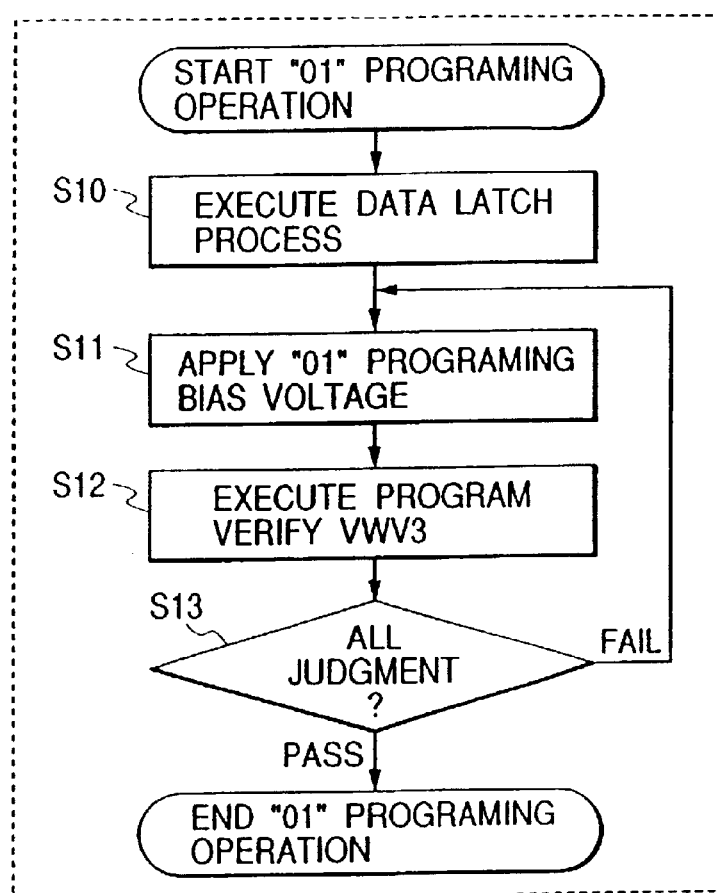
Figure 24:
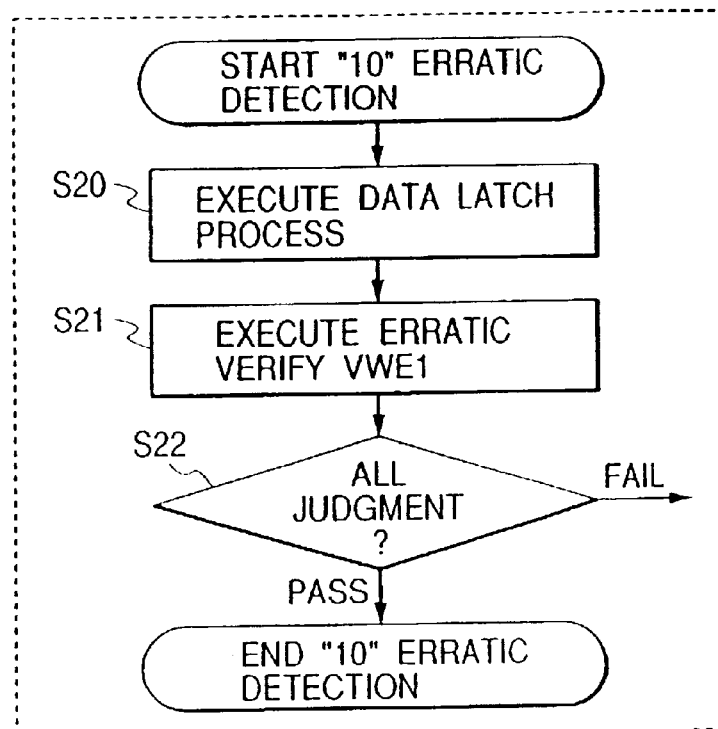
Figure 25:
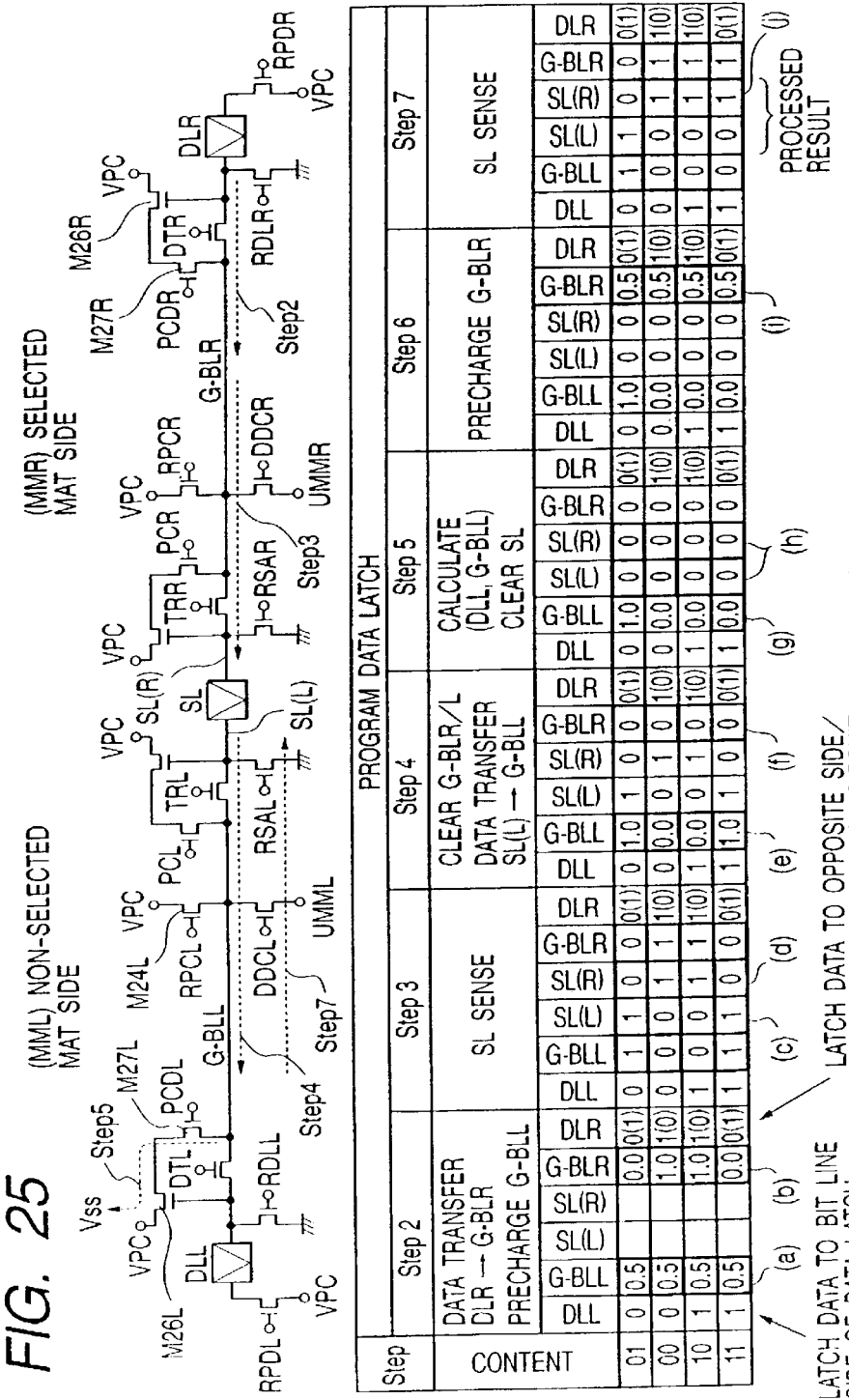
Figure 26:
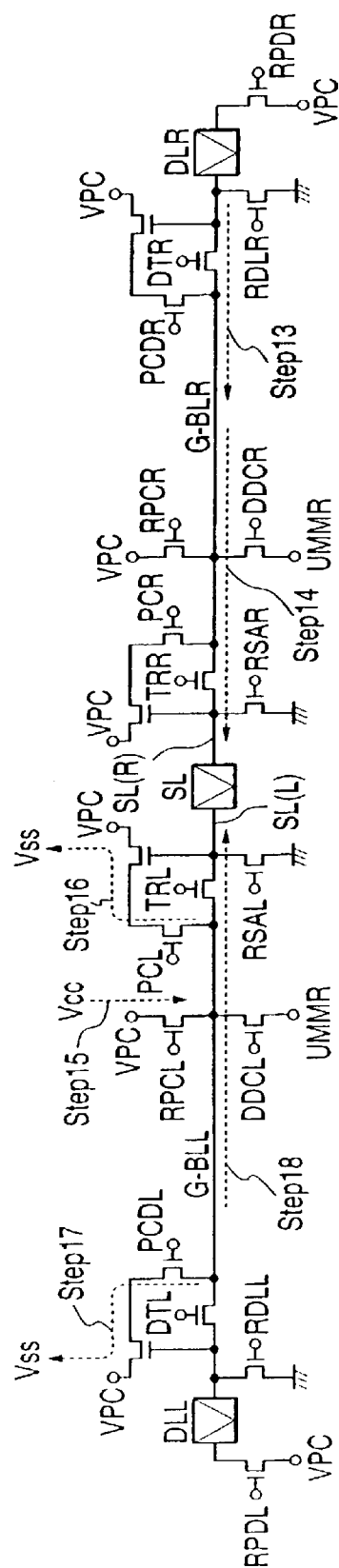
Figure 27:
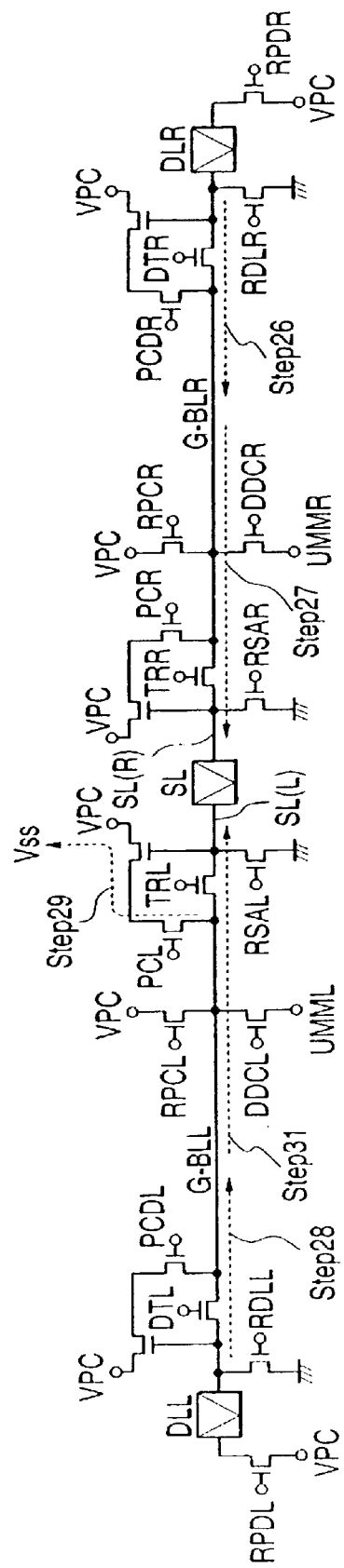
Figure 28:
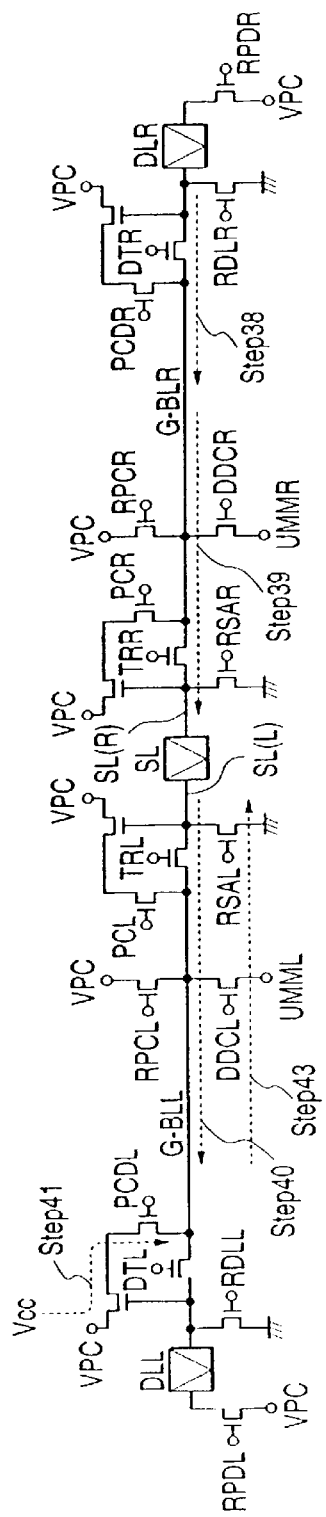
Figure 29:
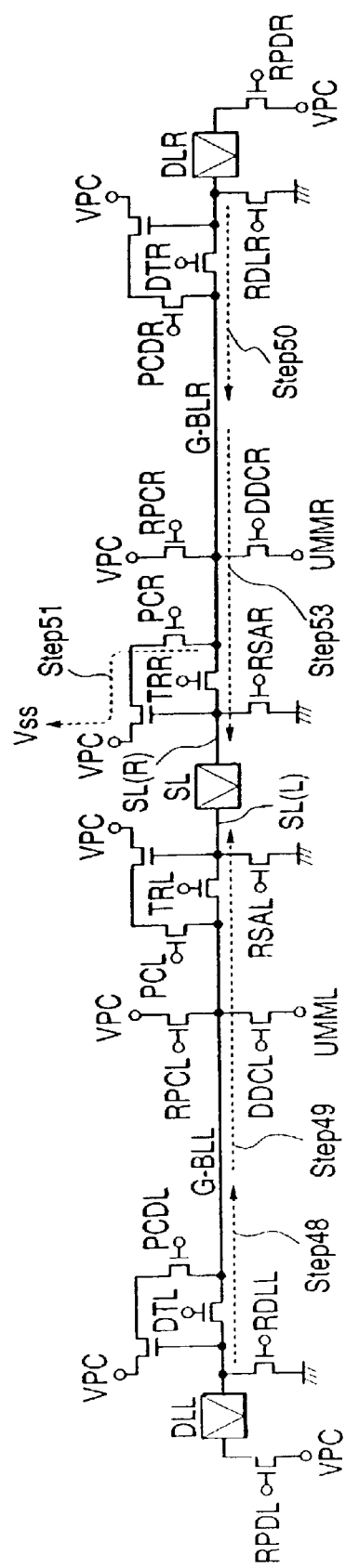
Figure 30:
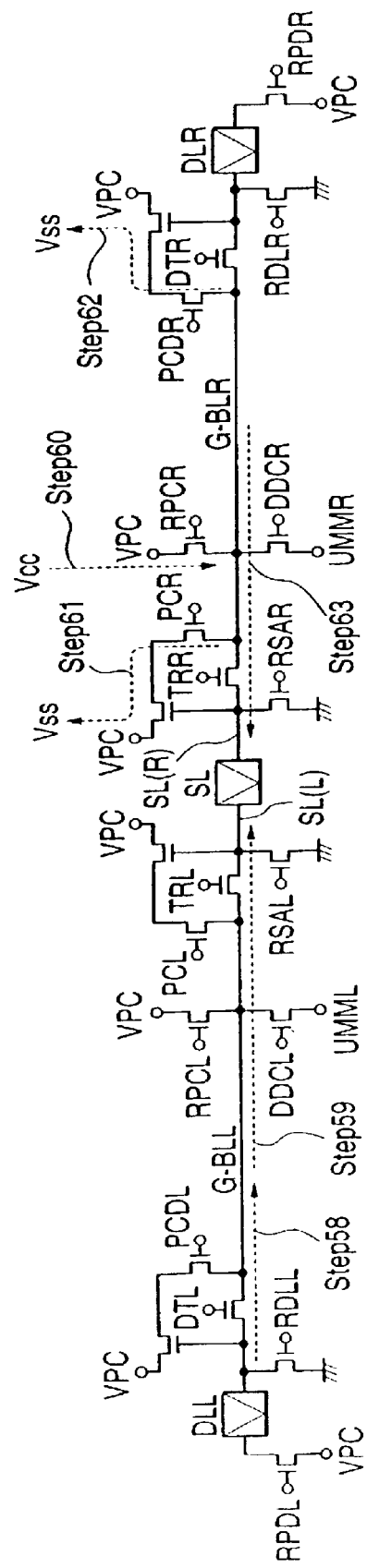
Figure 31:
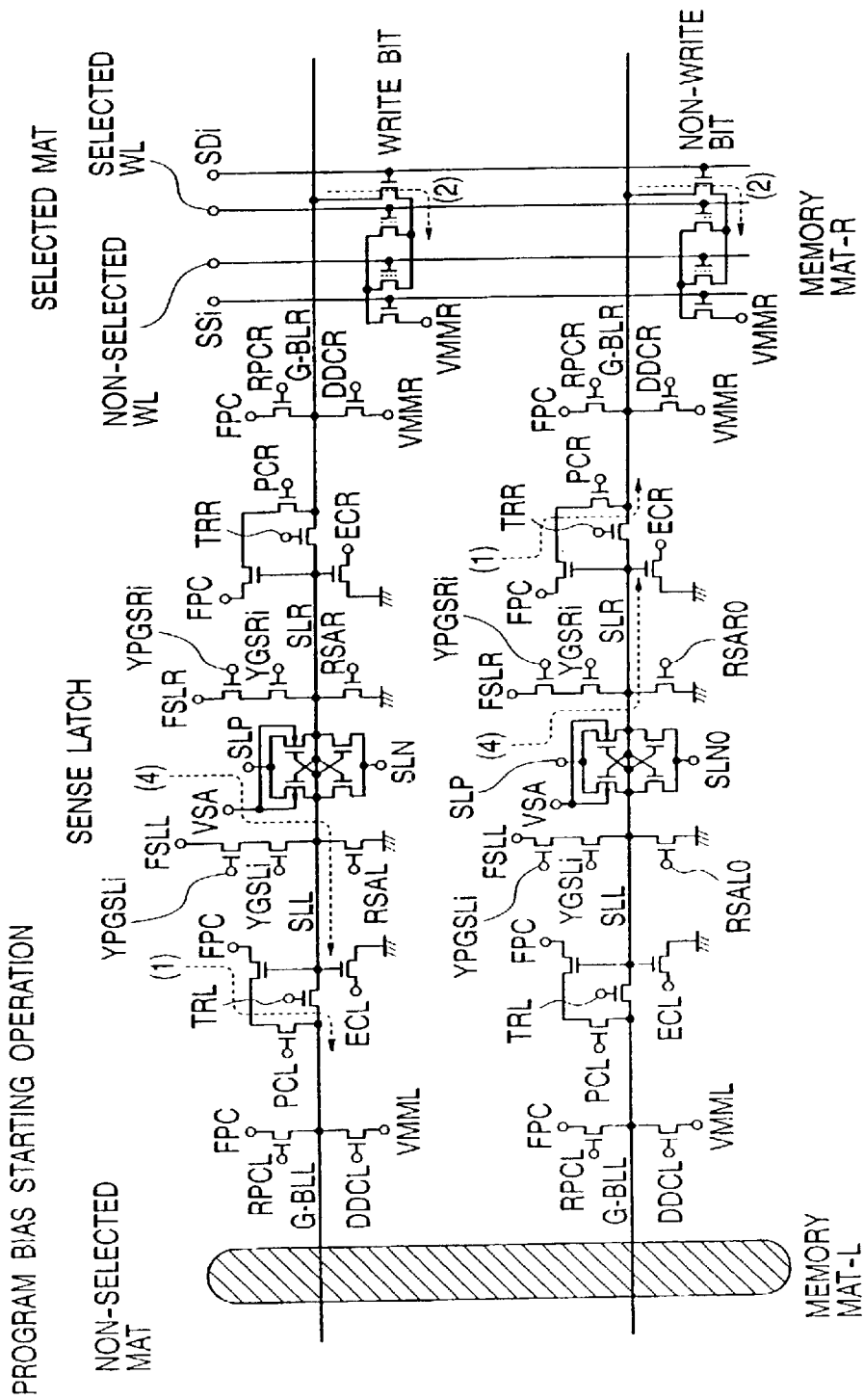
Figure 32:
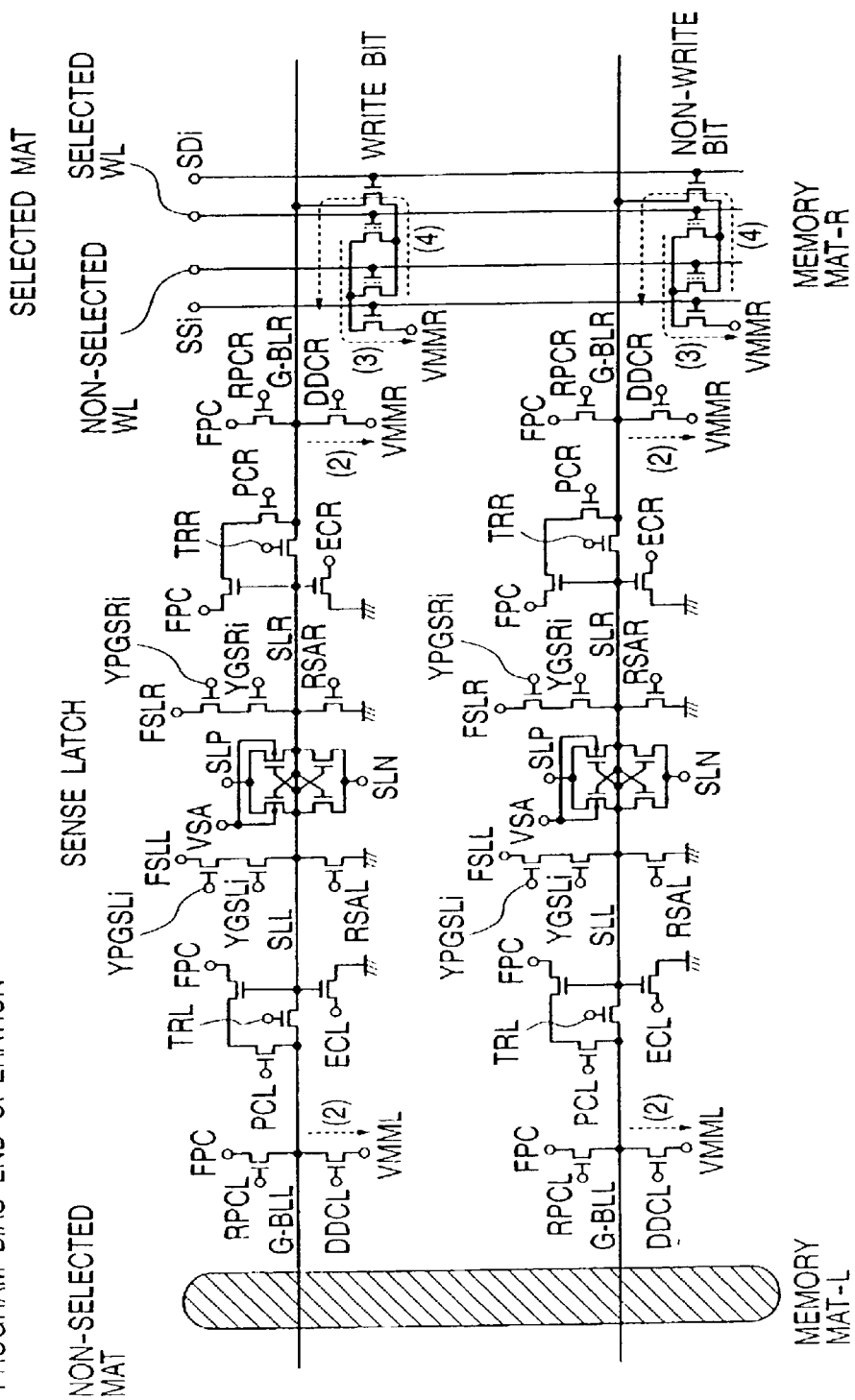
Figure 33:
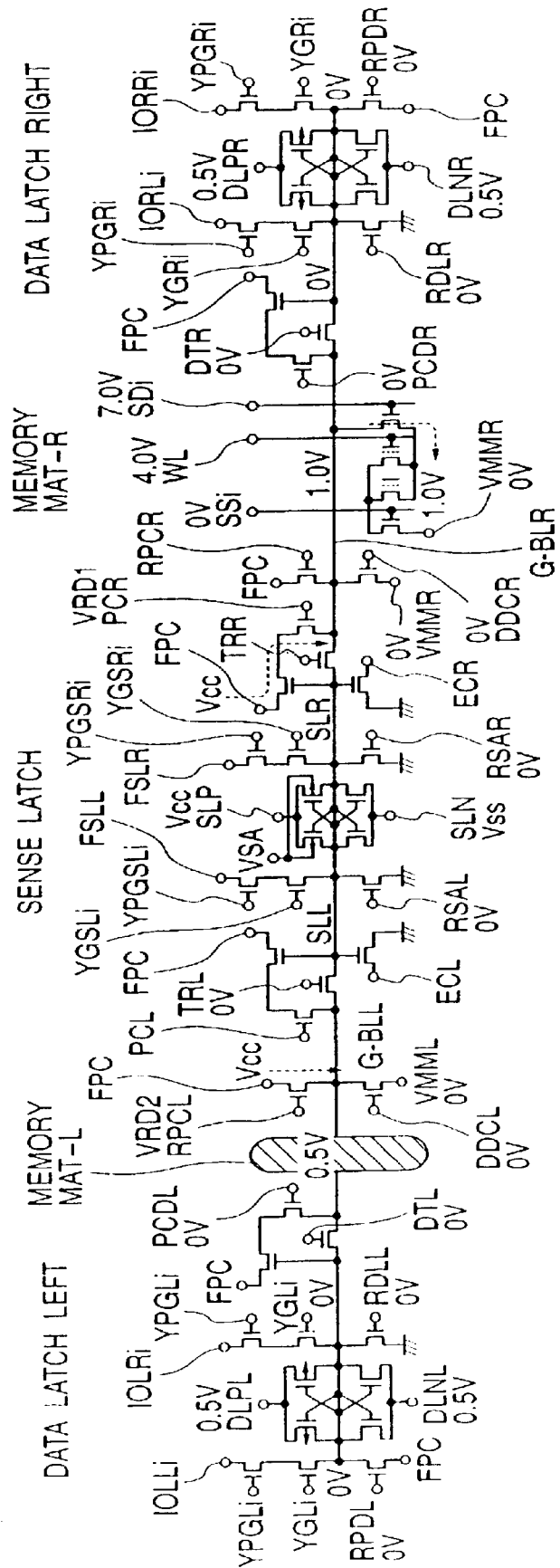
Figure 34:
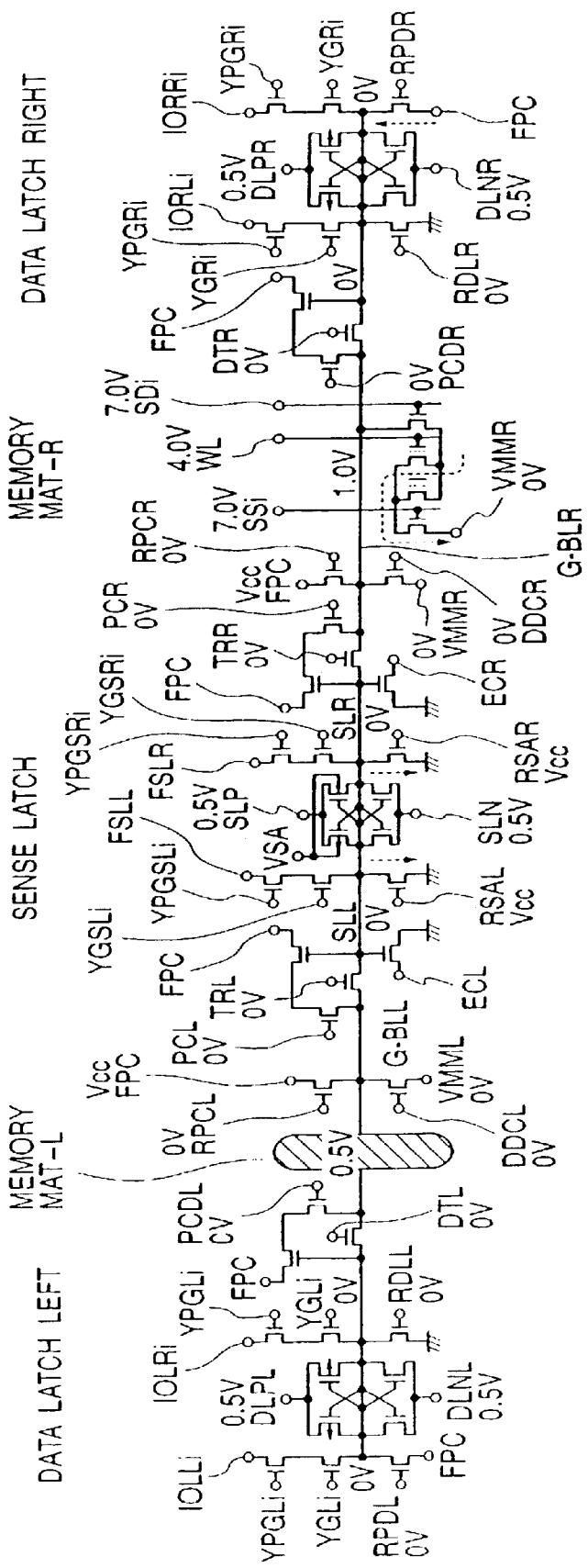
Figure 35:
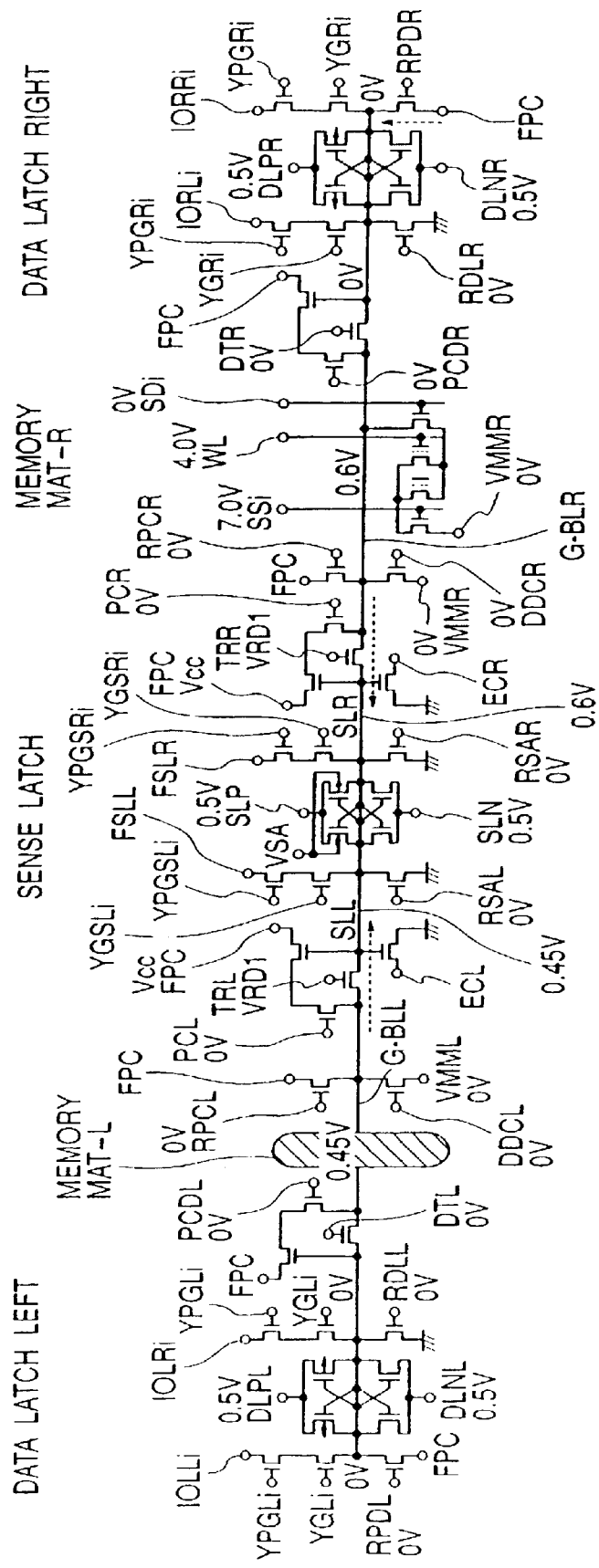
Figure 36:
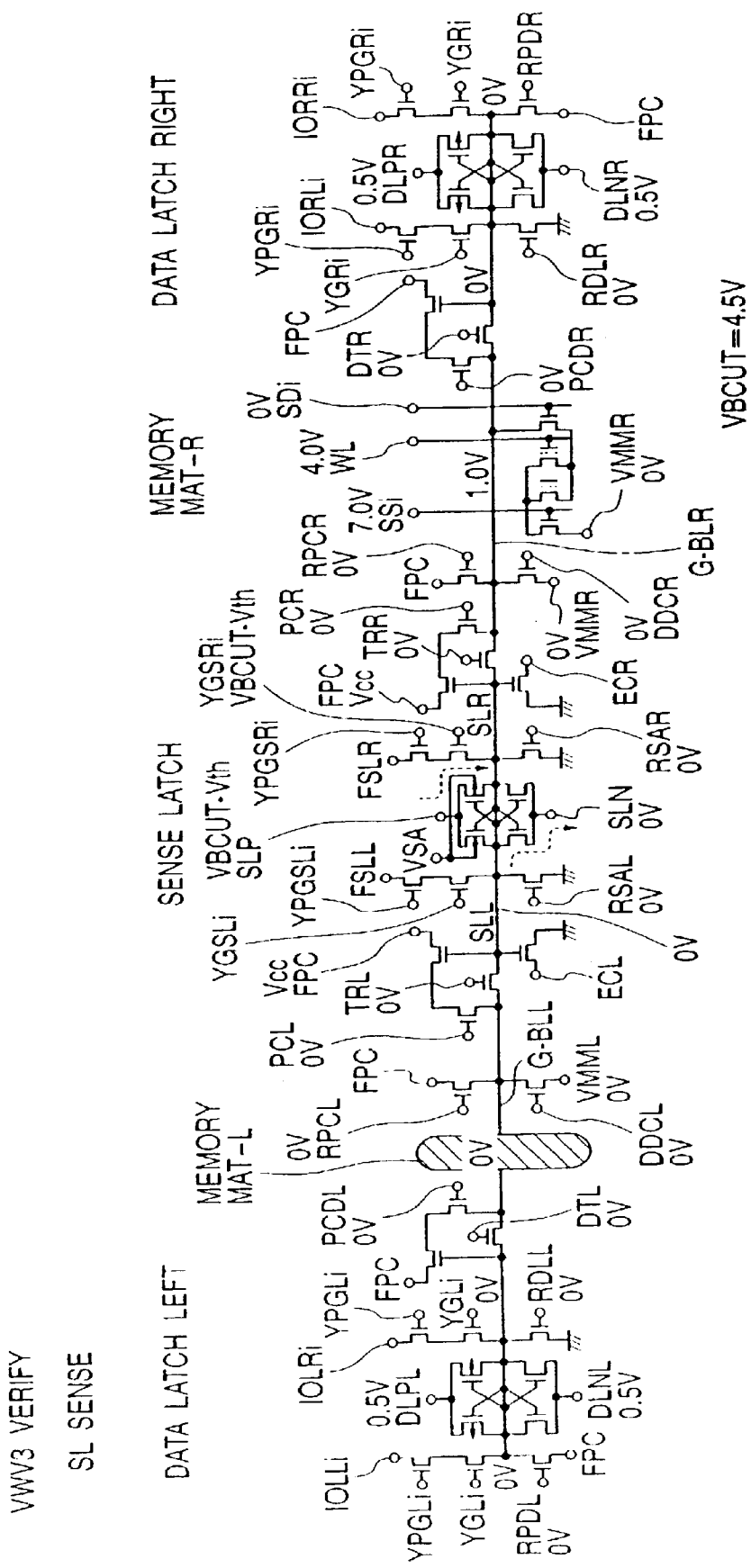
Figure 37:
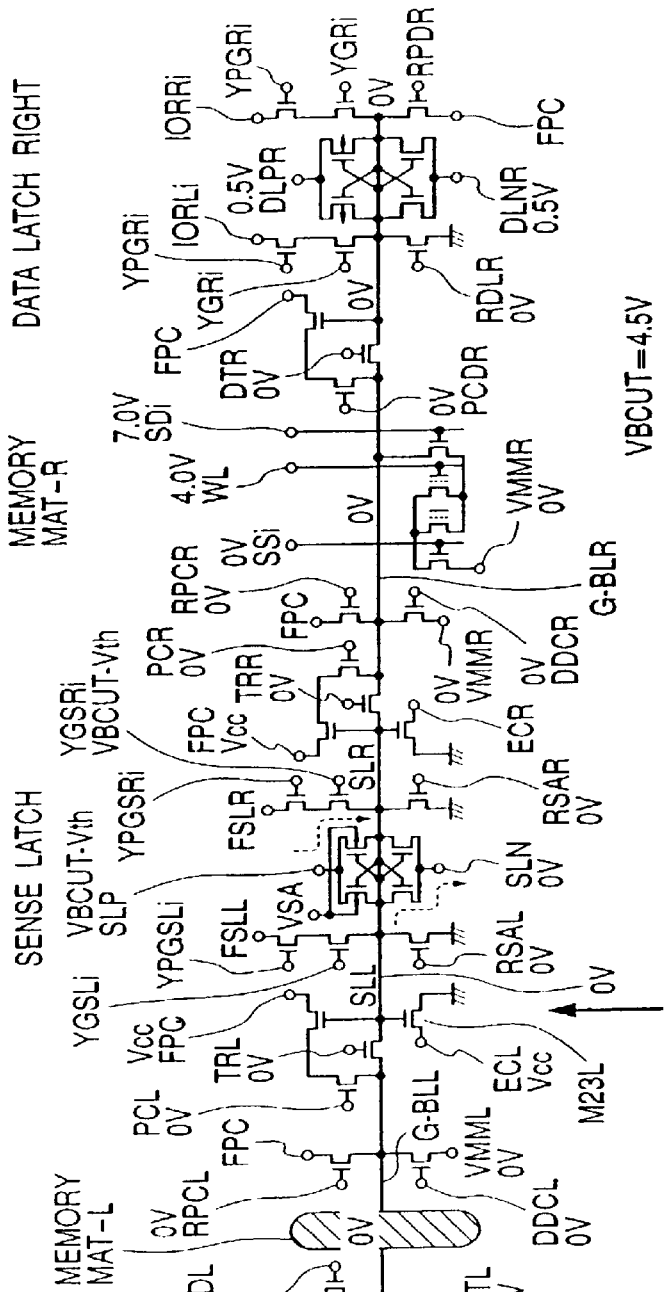
Figure 38:
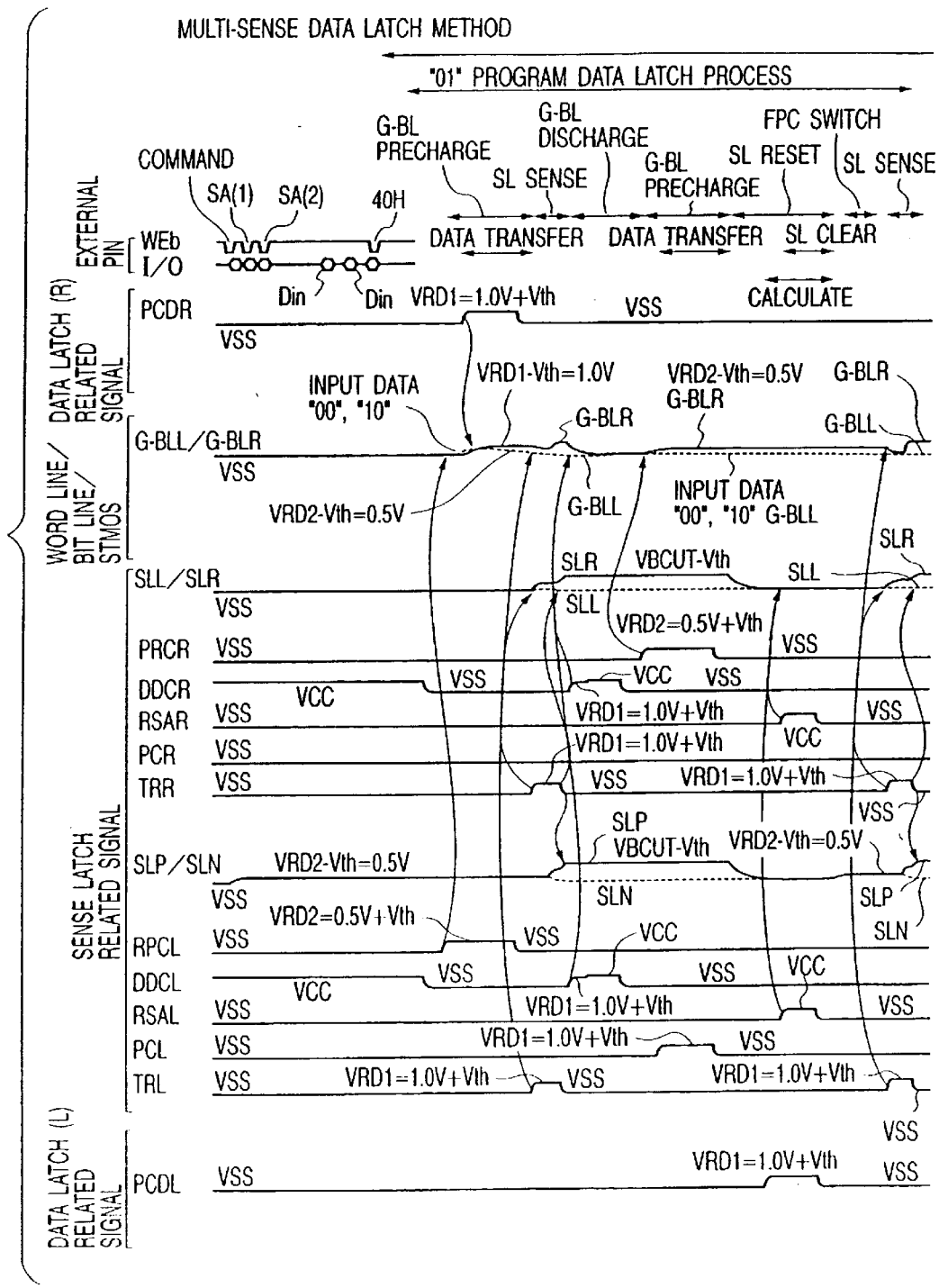
Figure 39:
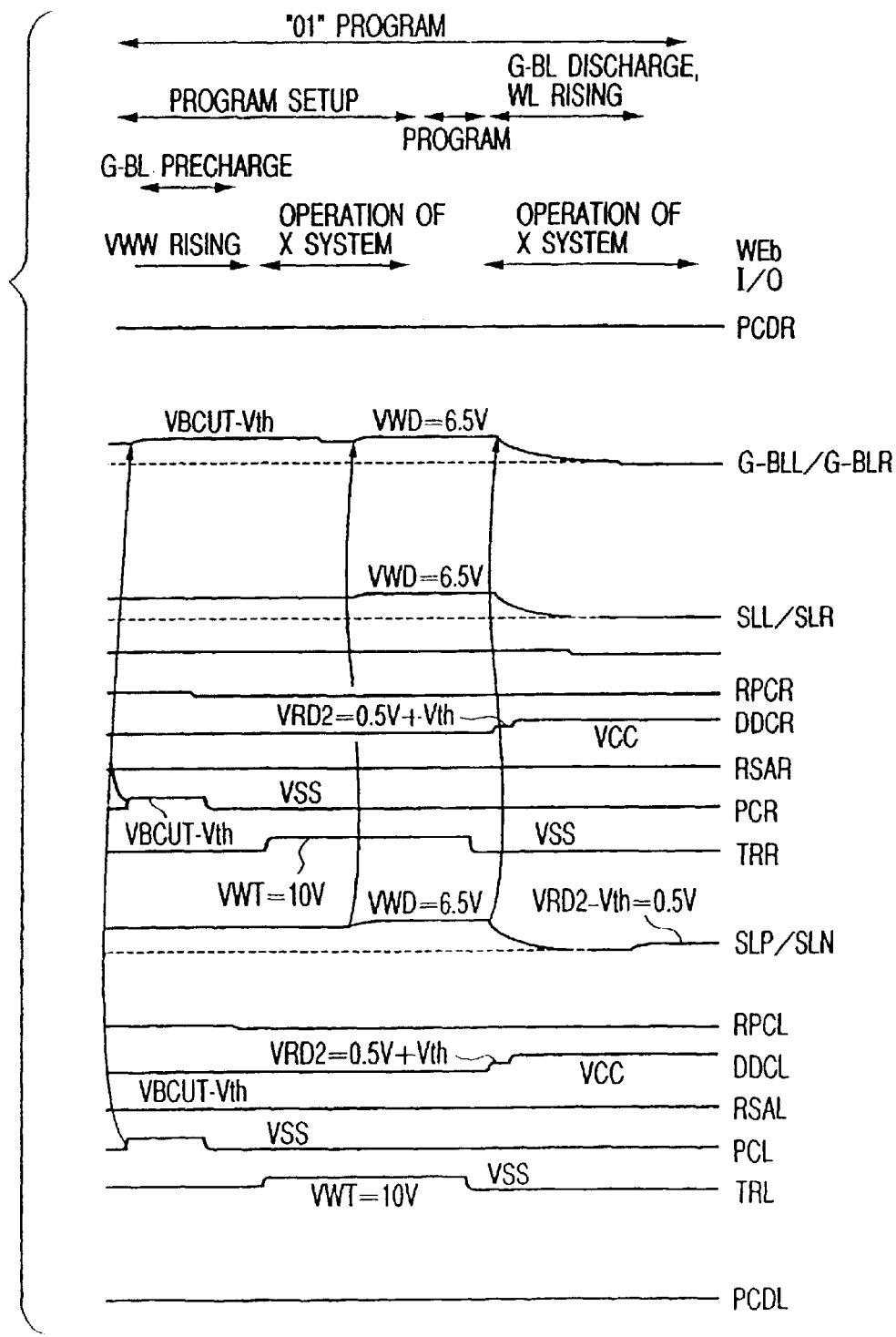
Figure 40:
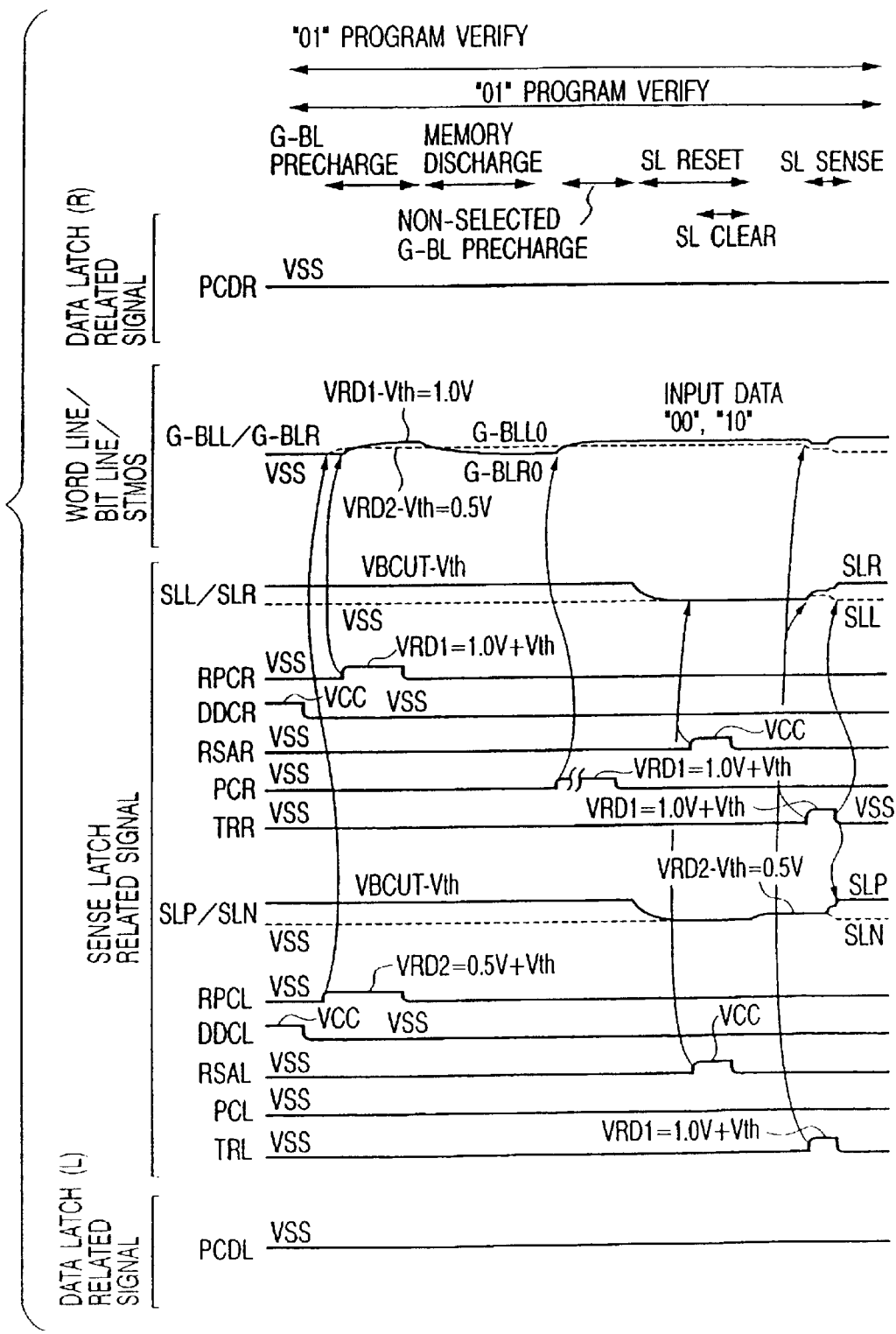
Figure 41:
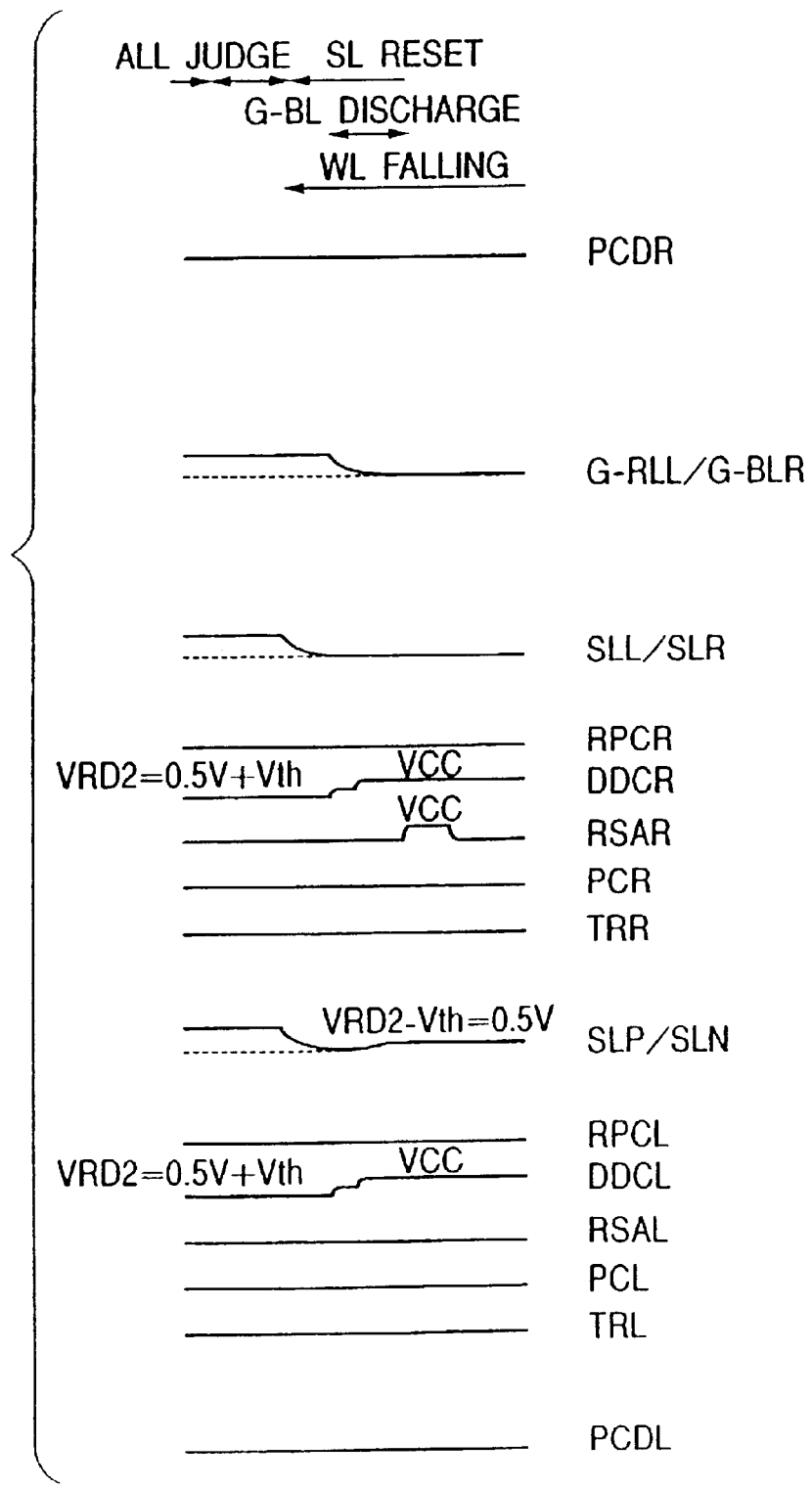
Figure 42:
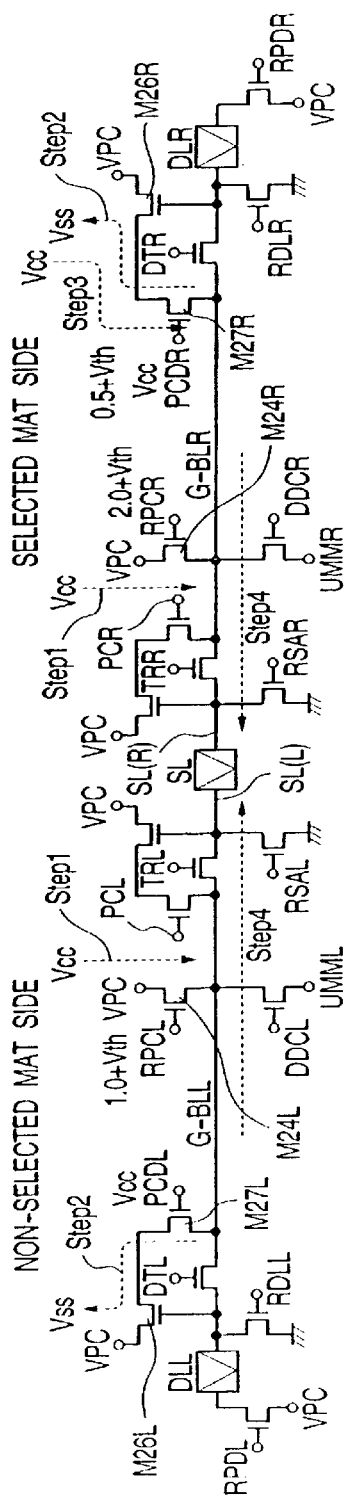
Figure 43:
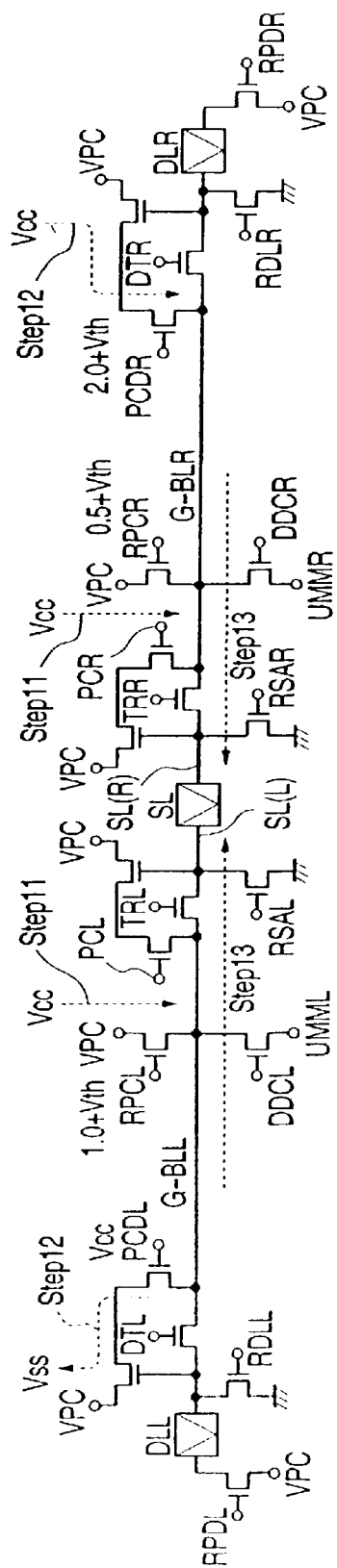
Figure 44:
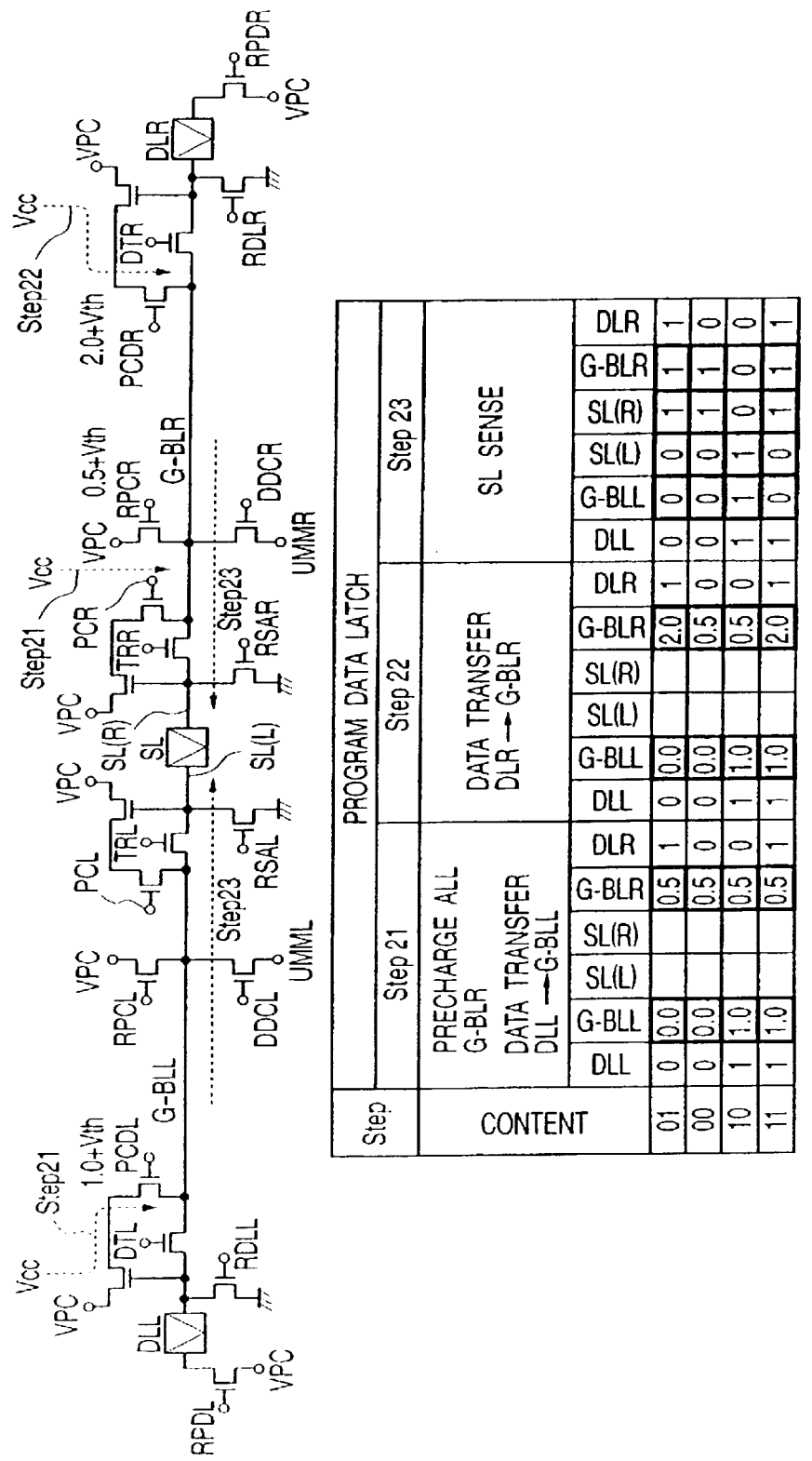
Figure 45:
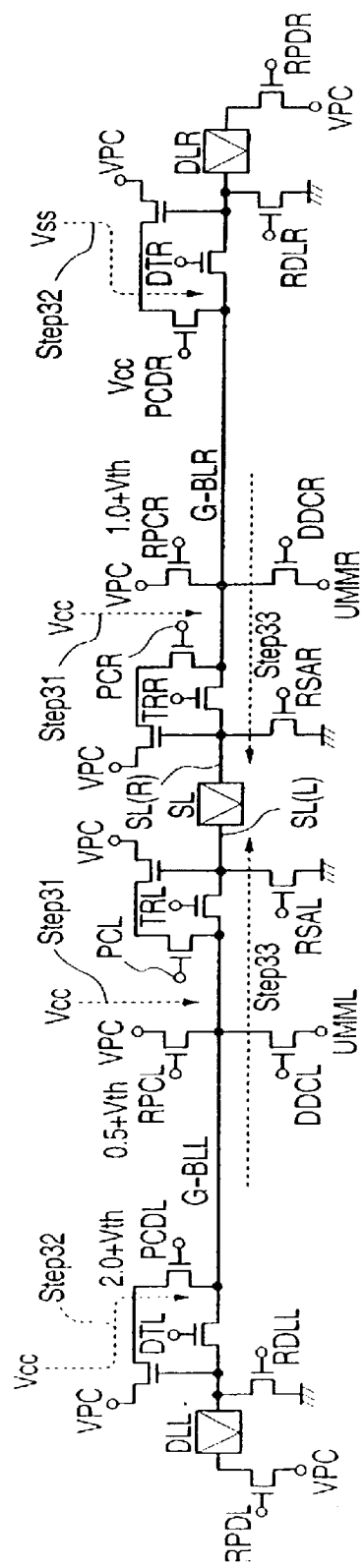
Figure 46:
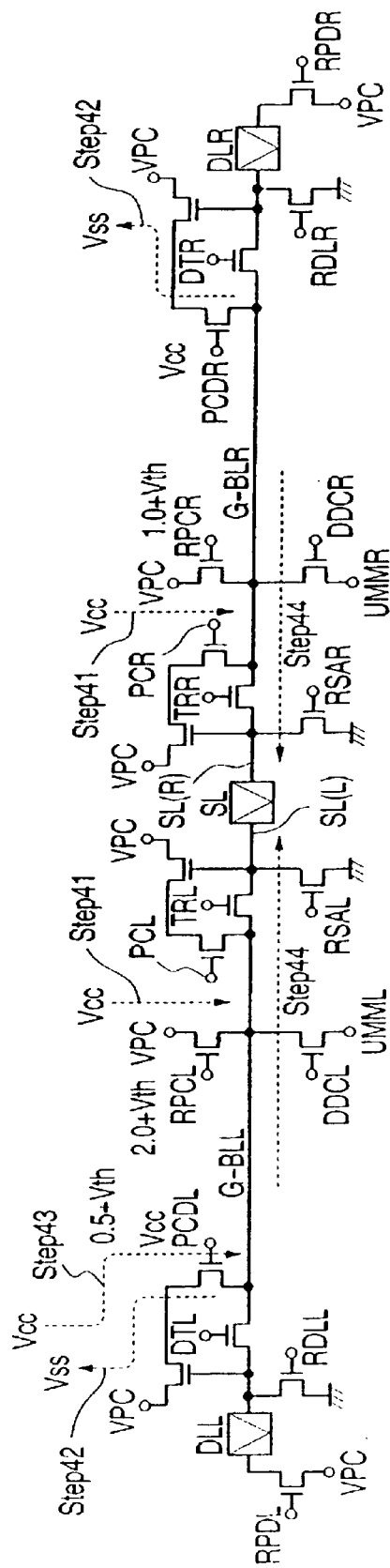
Figure 47:
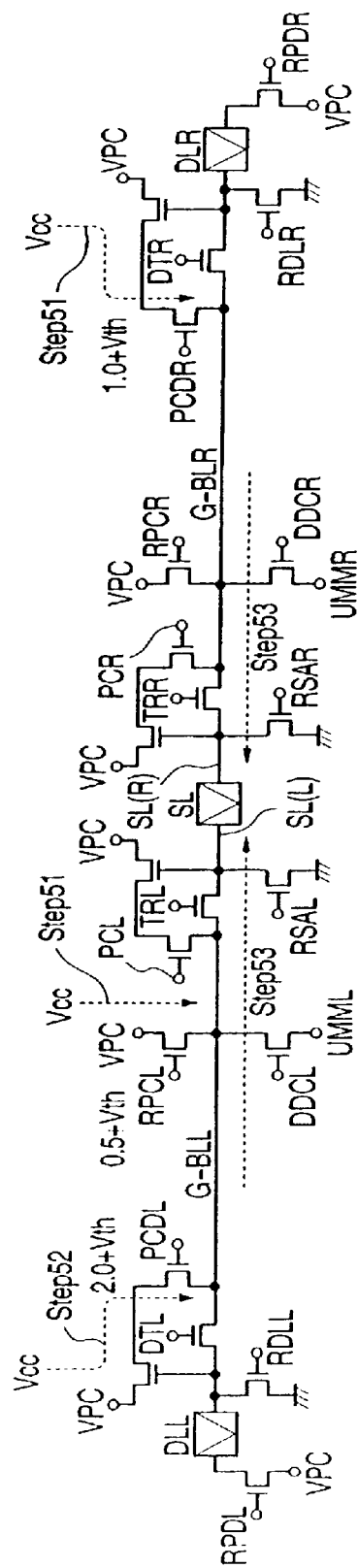
Figure 48:
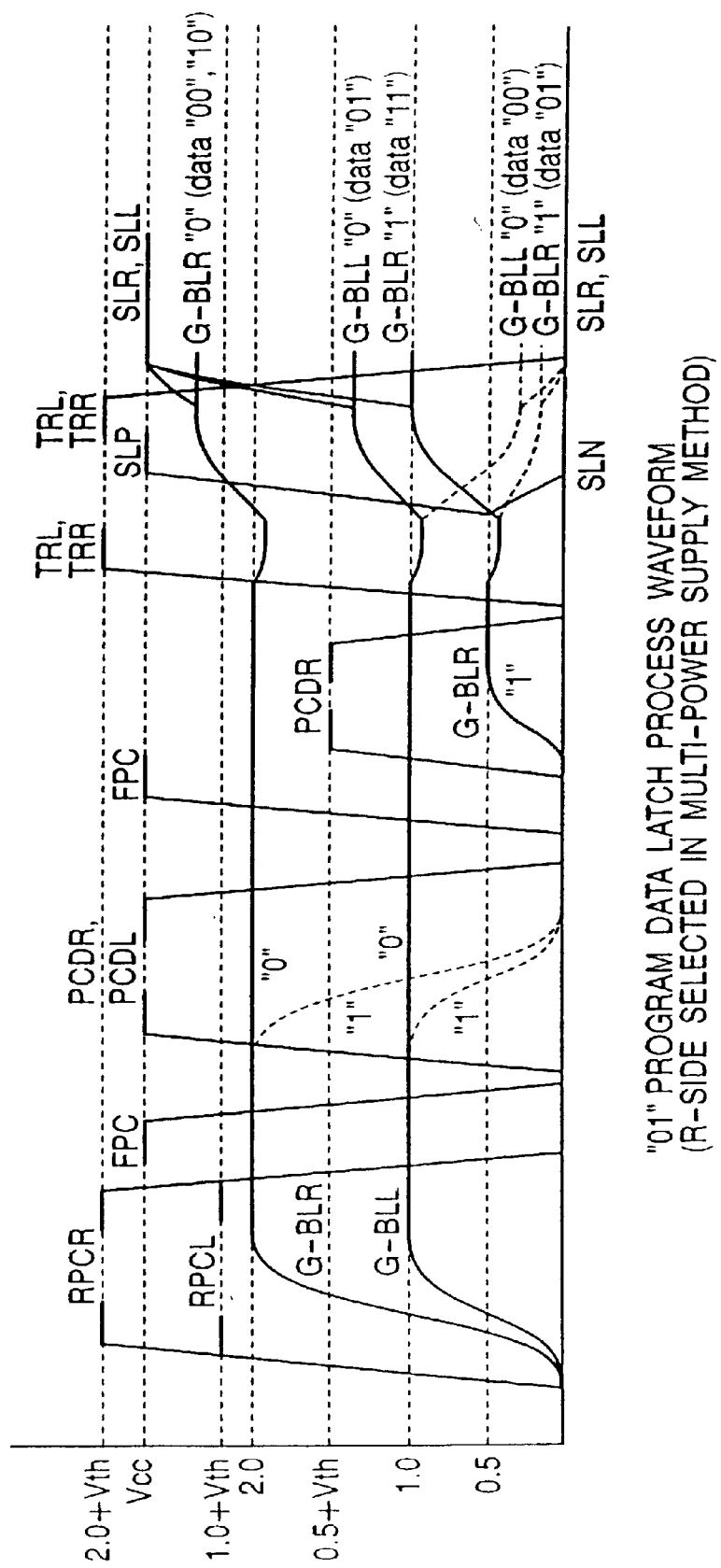
Figure 49:
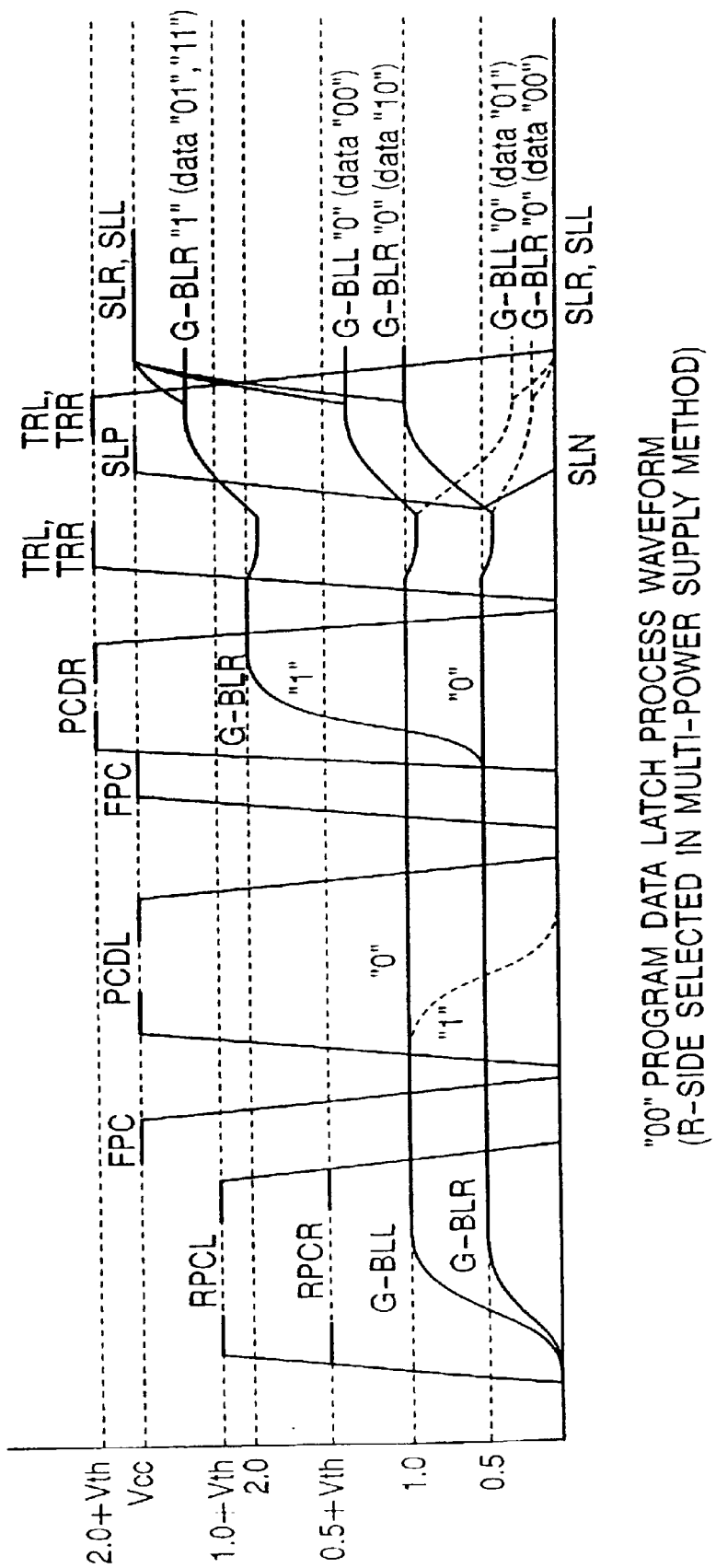
Figure 50:
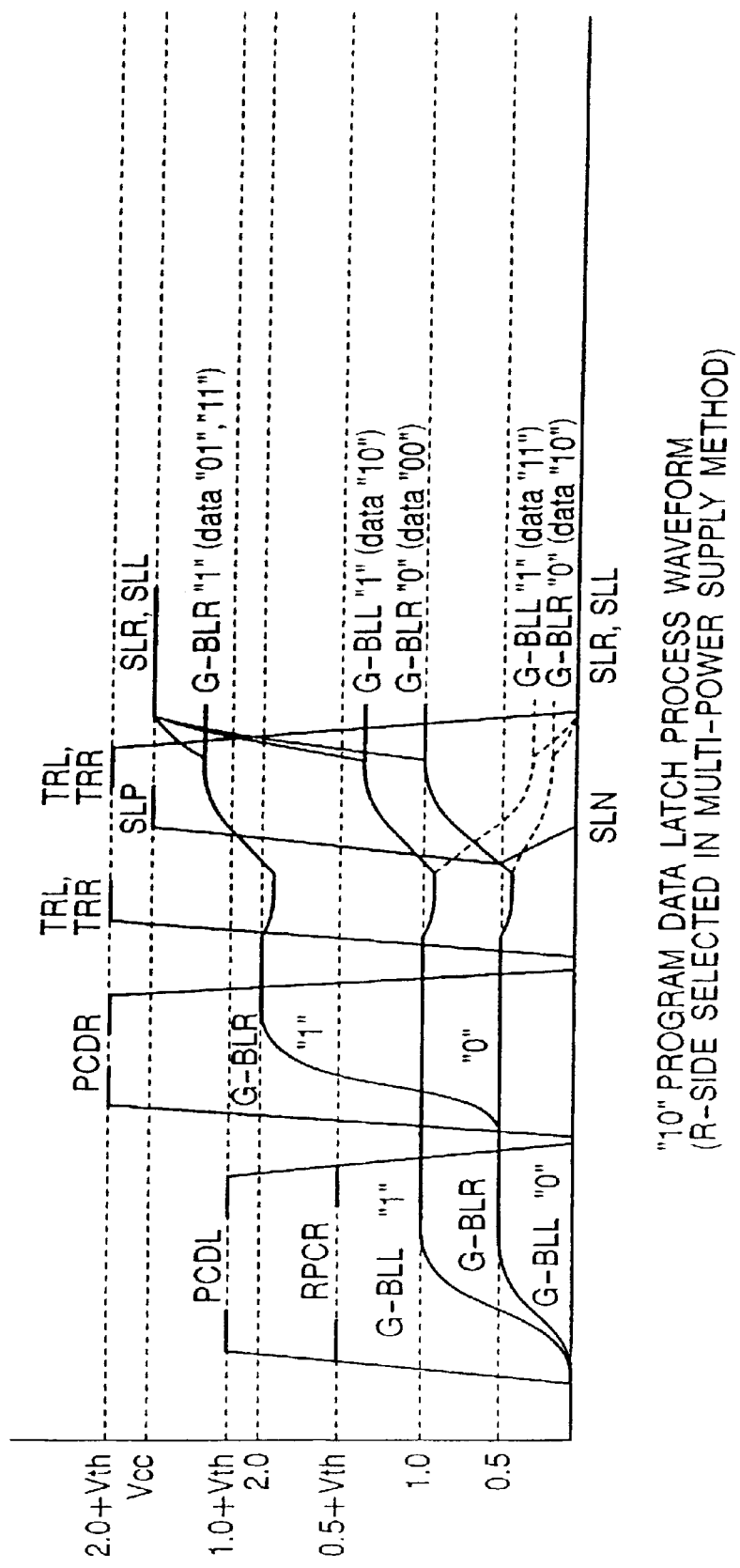
Figure 51:
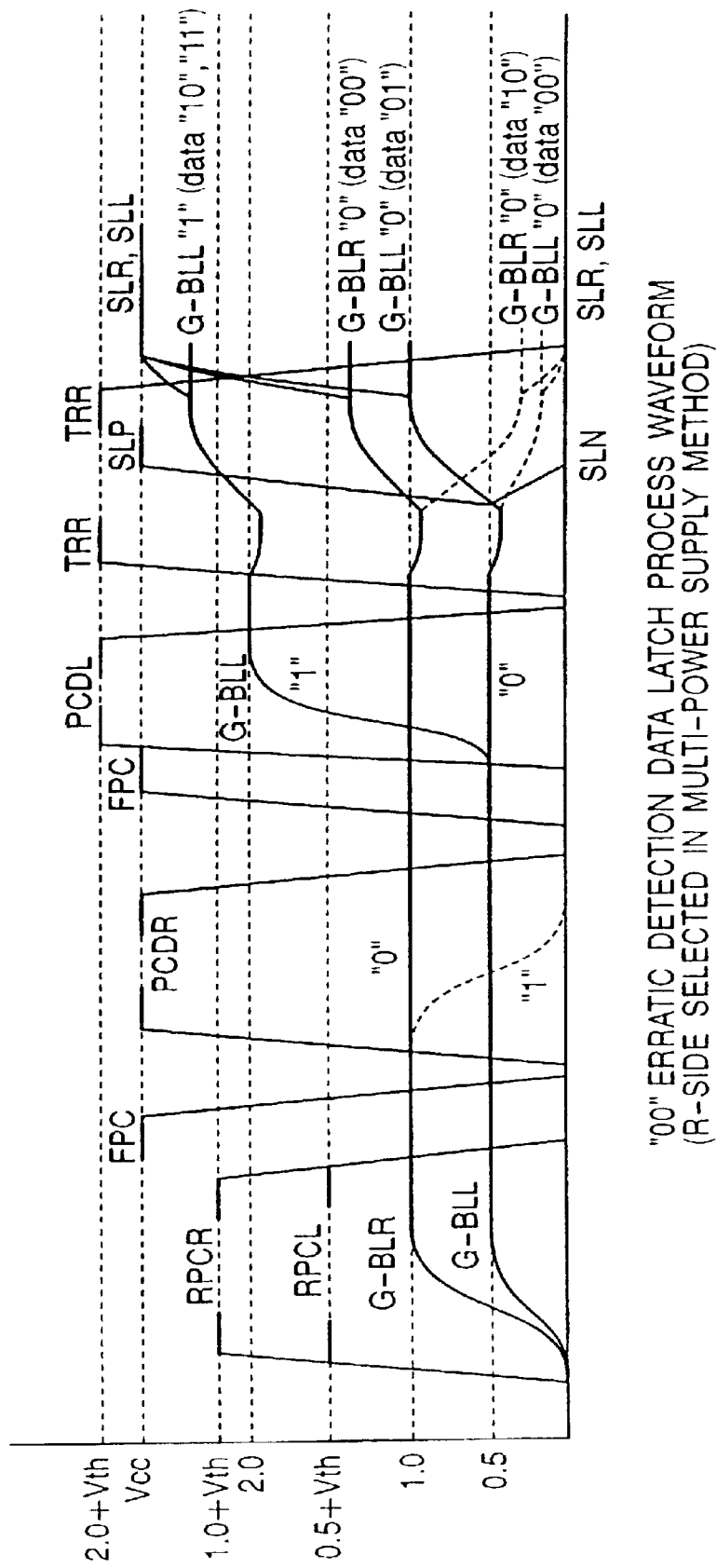
Figure 52:
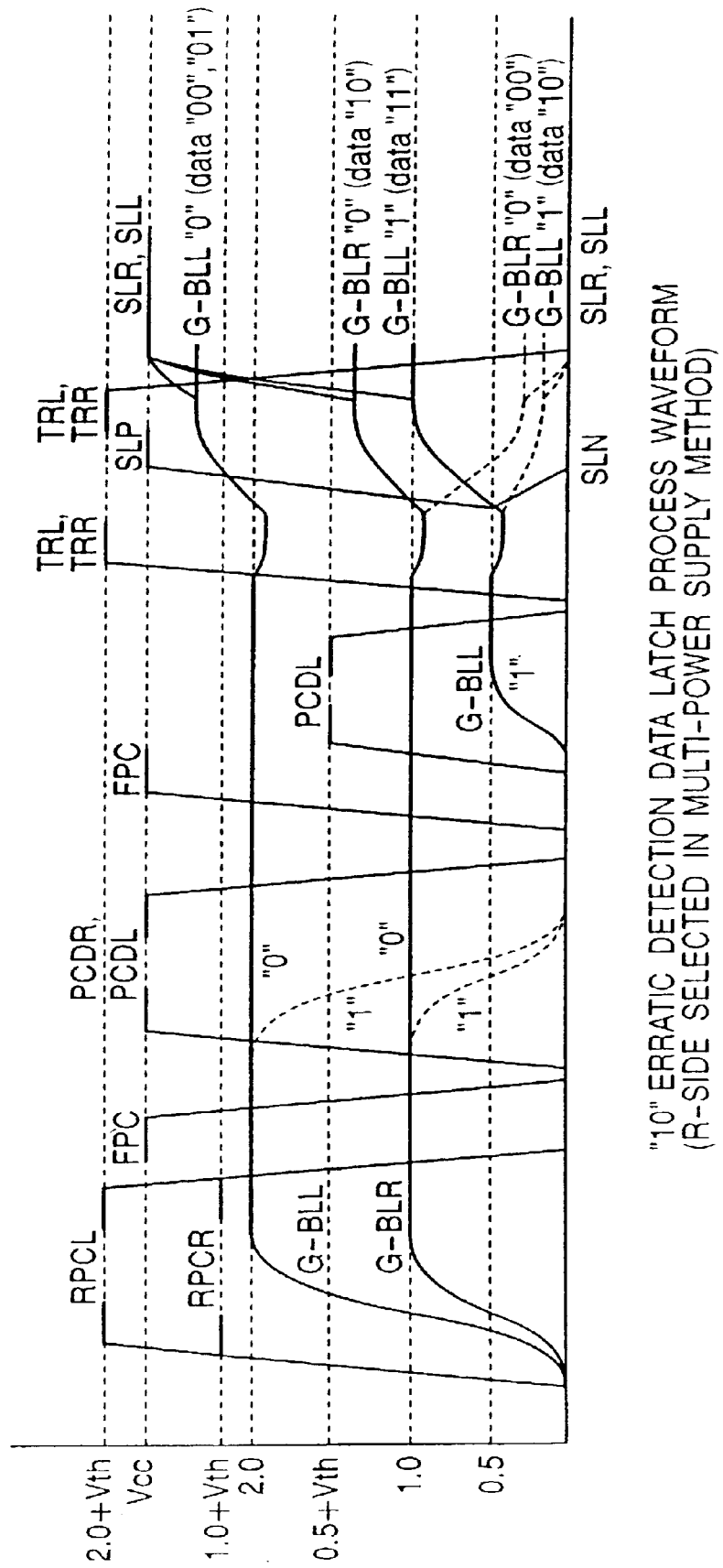
Figure 53:
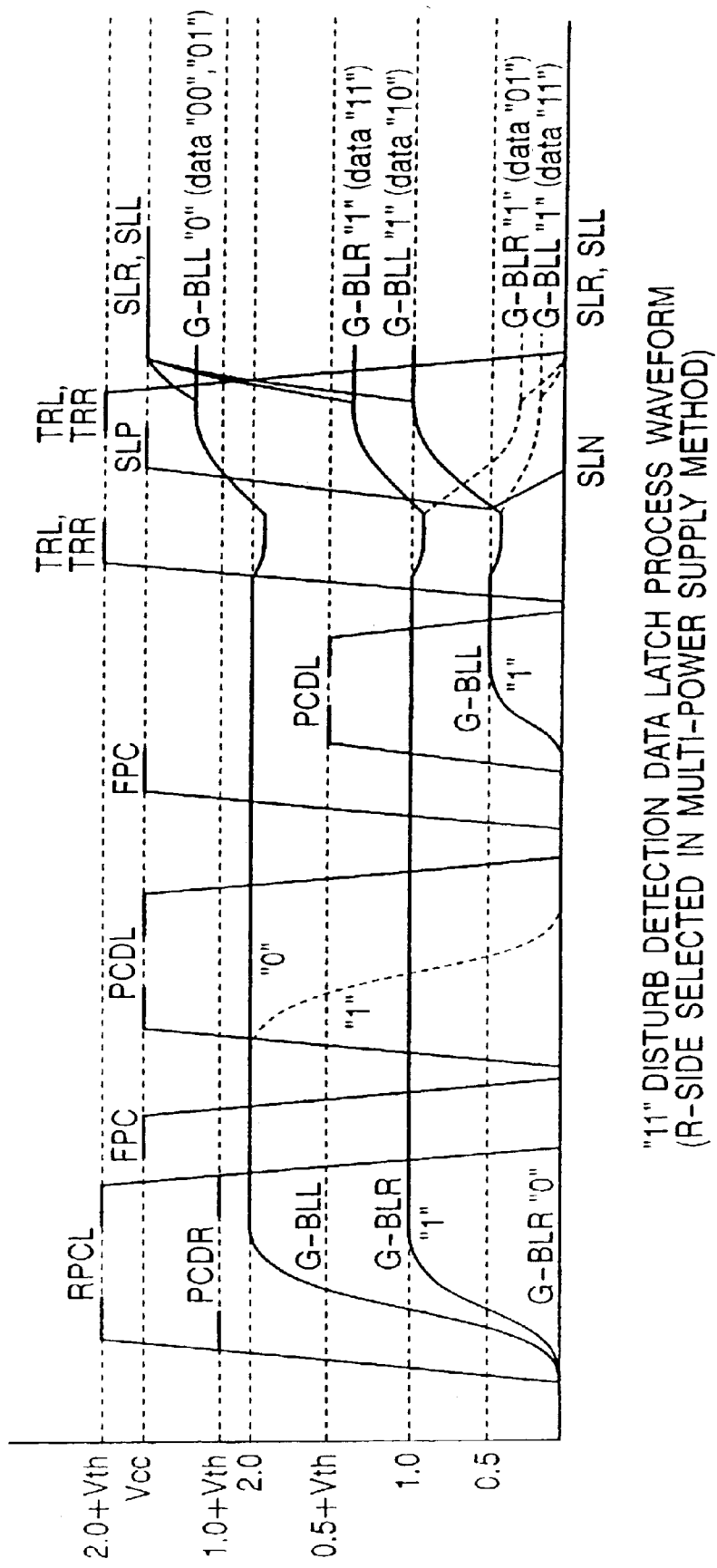
Figure 55:
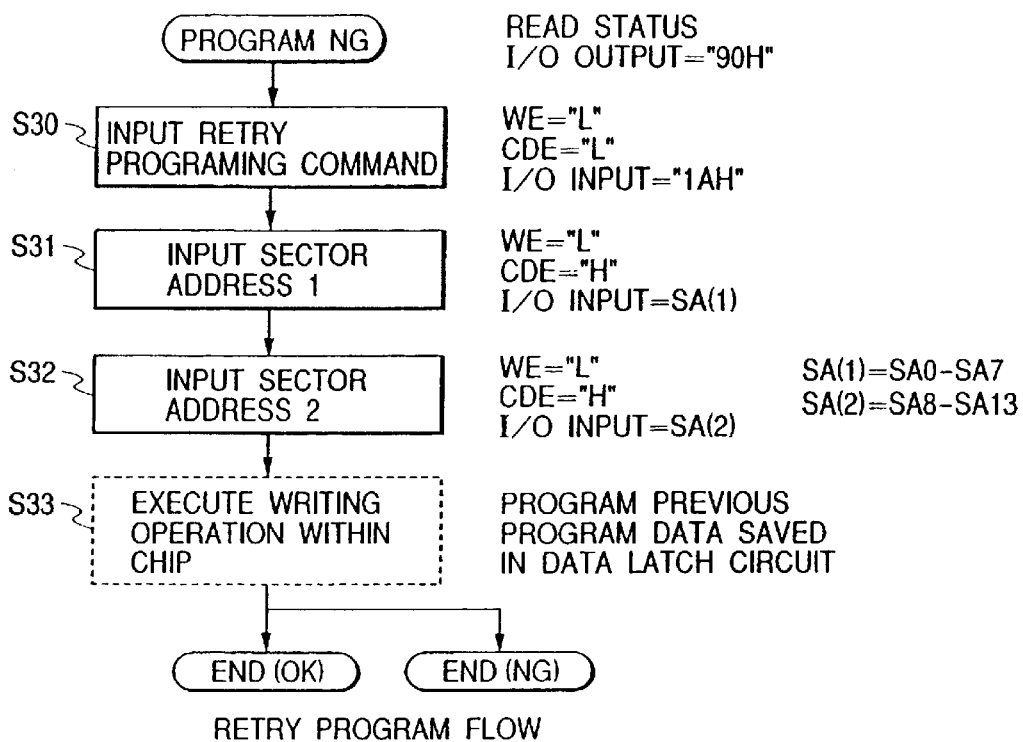
Figure 56:
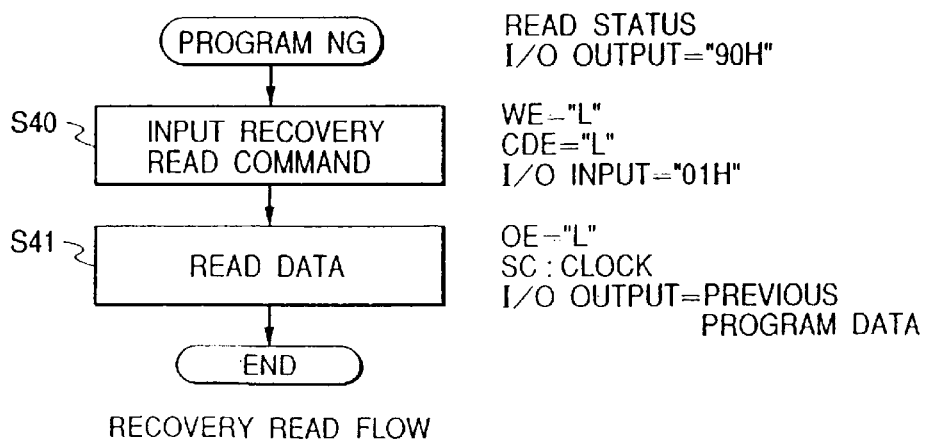
Figure 57:
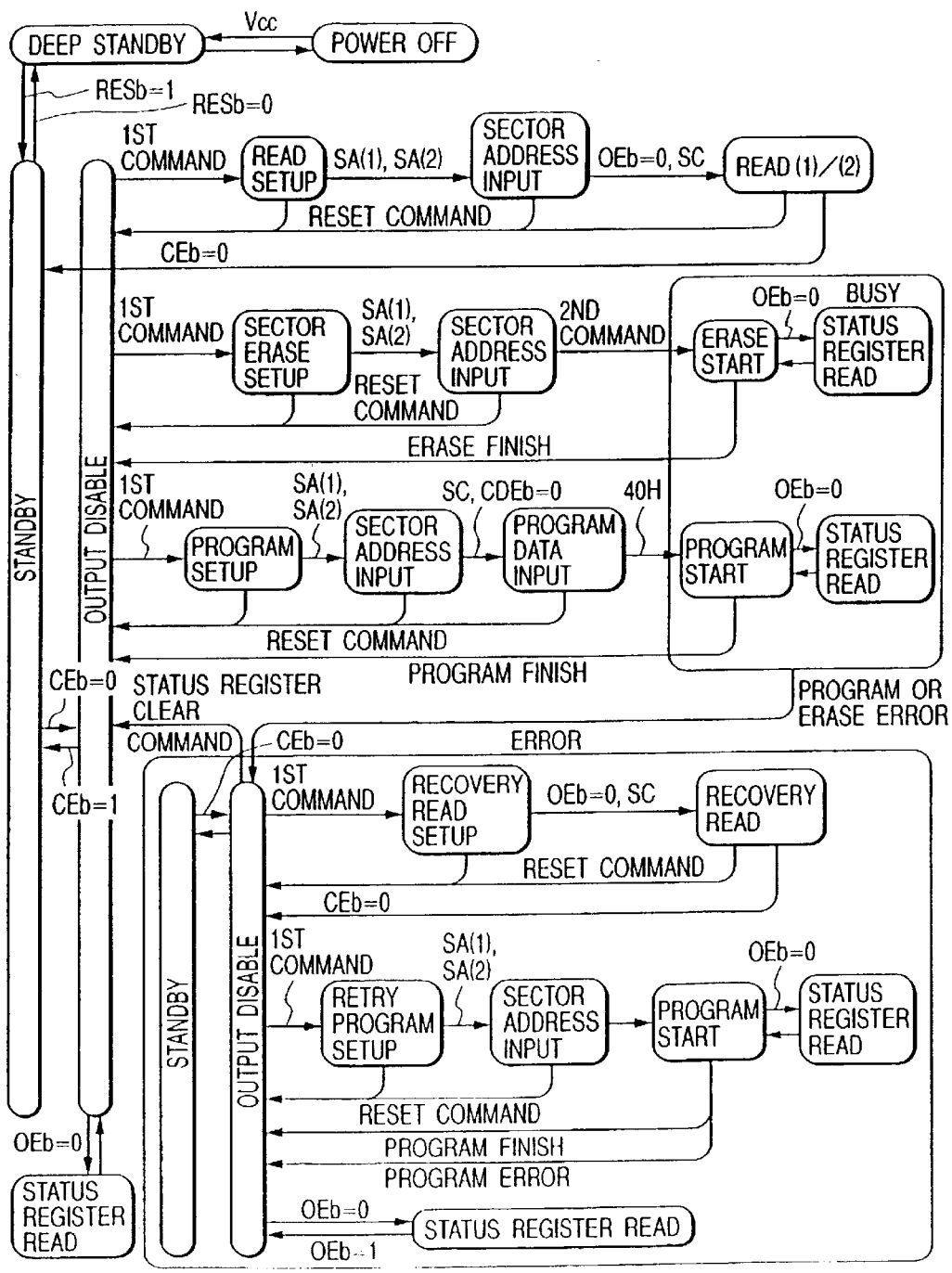
Figure 58:
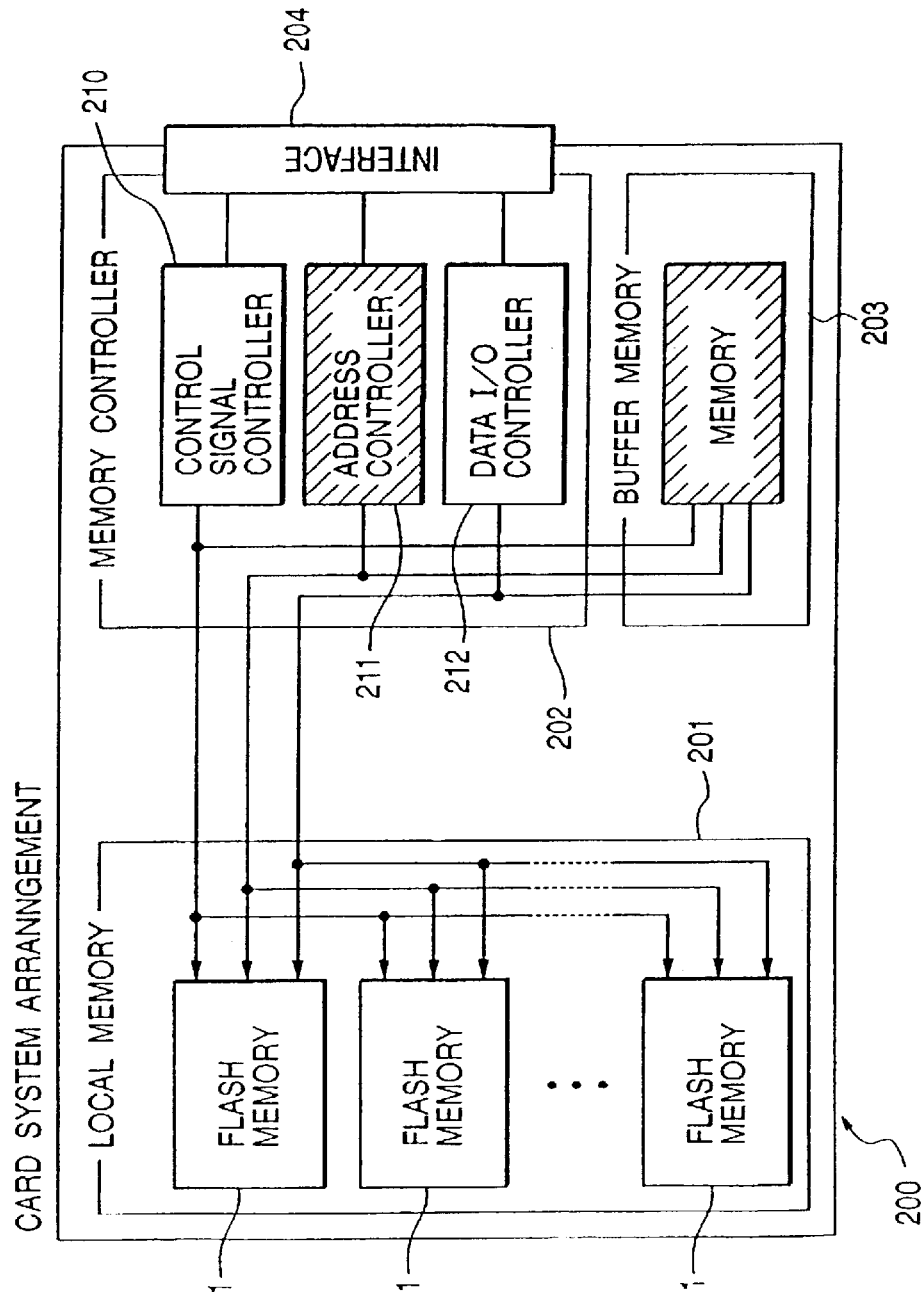
Figure 59:
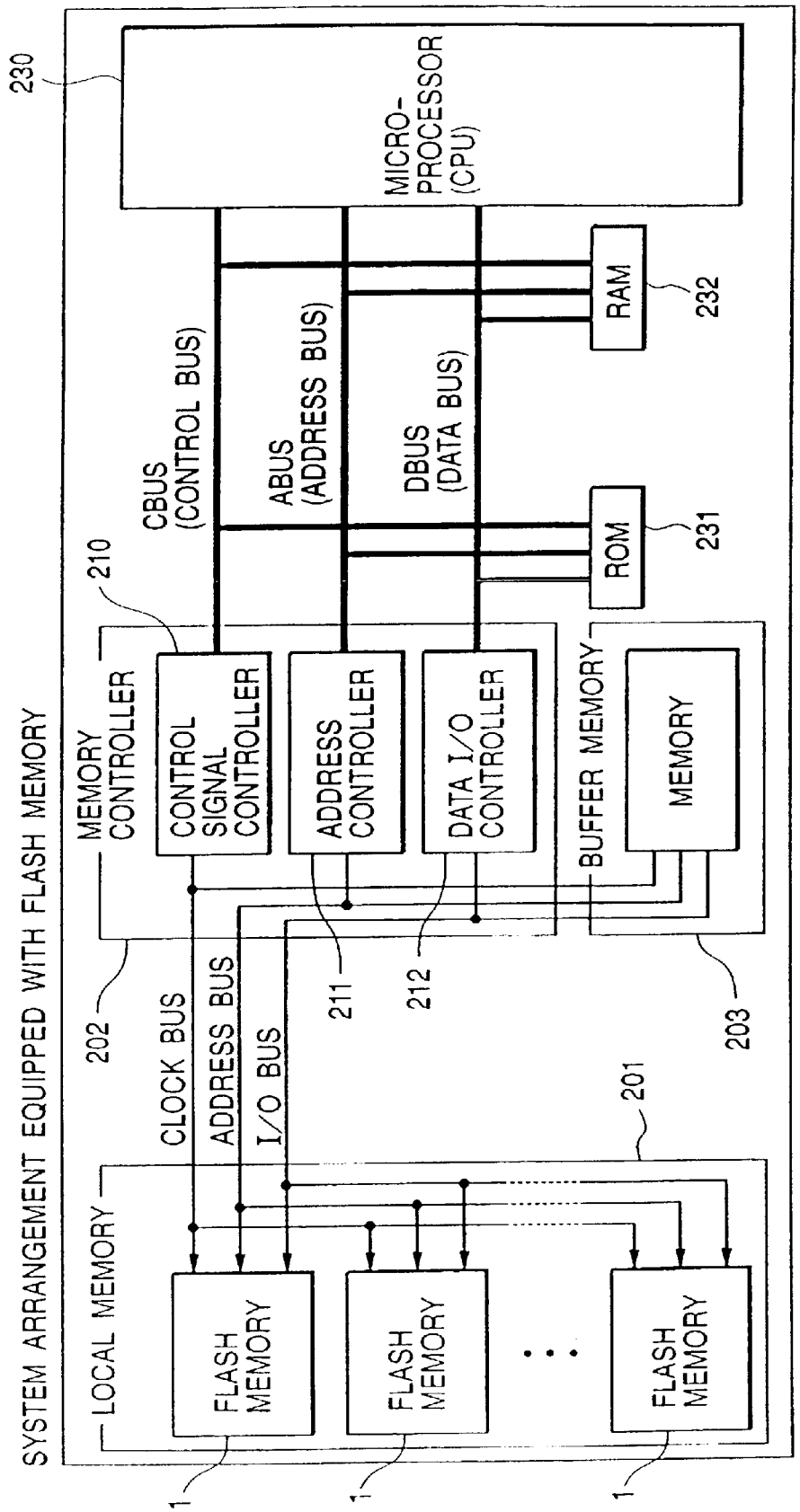
Figure 60:
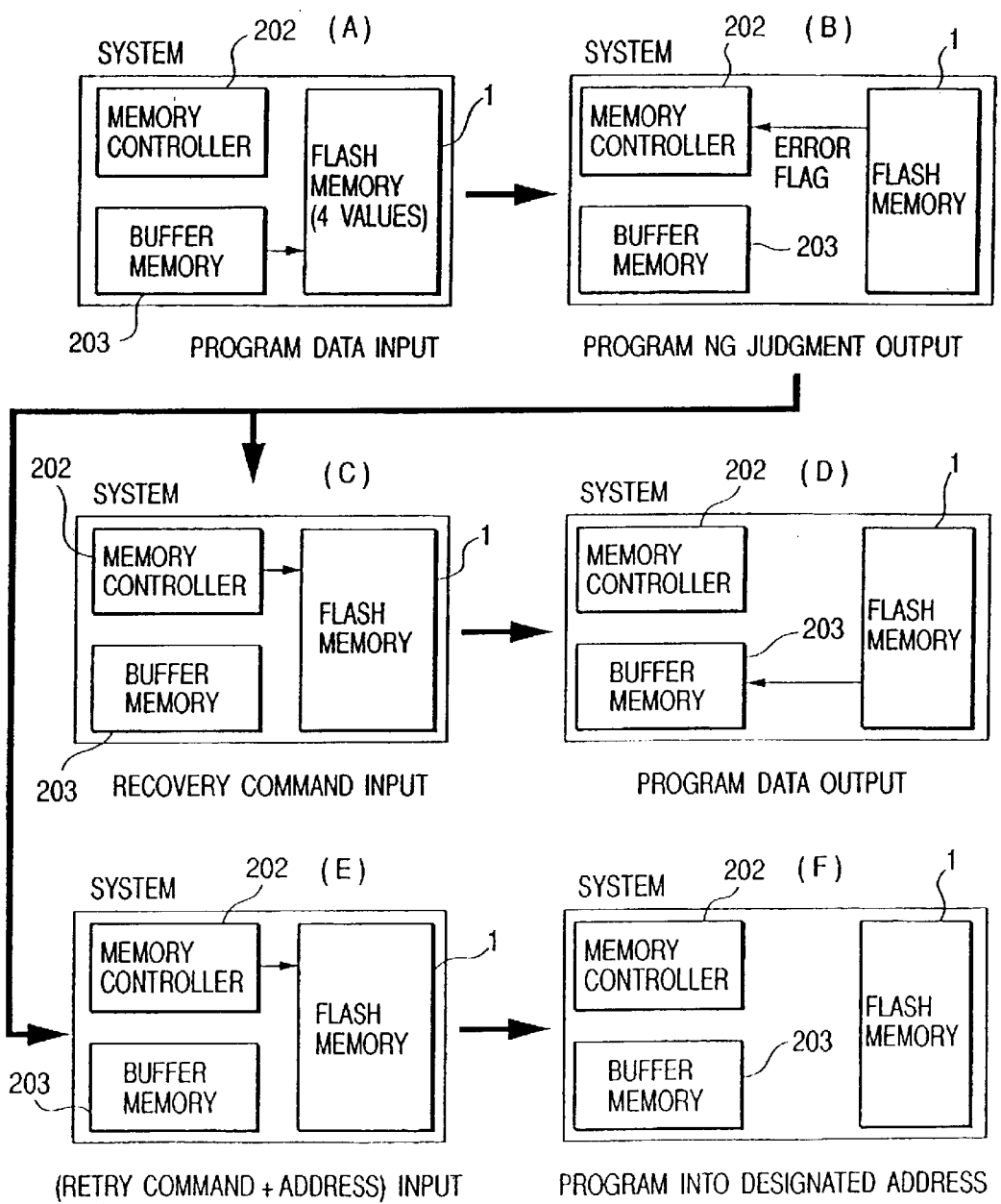
Figure 61:
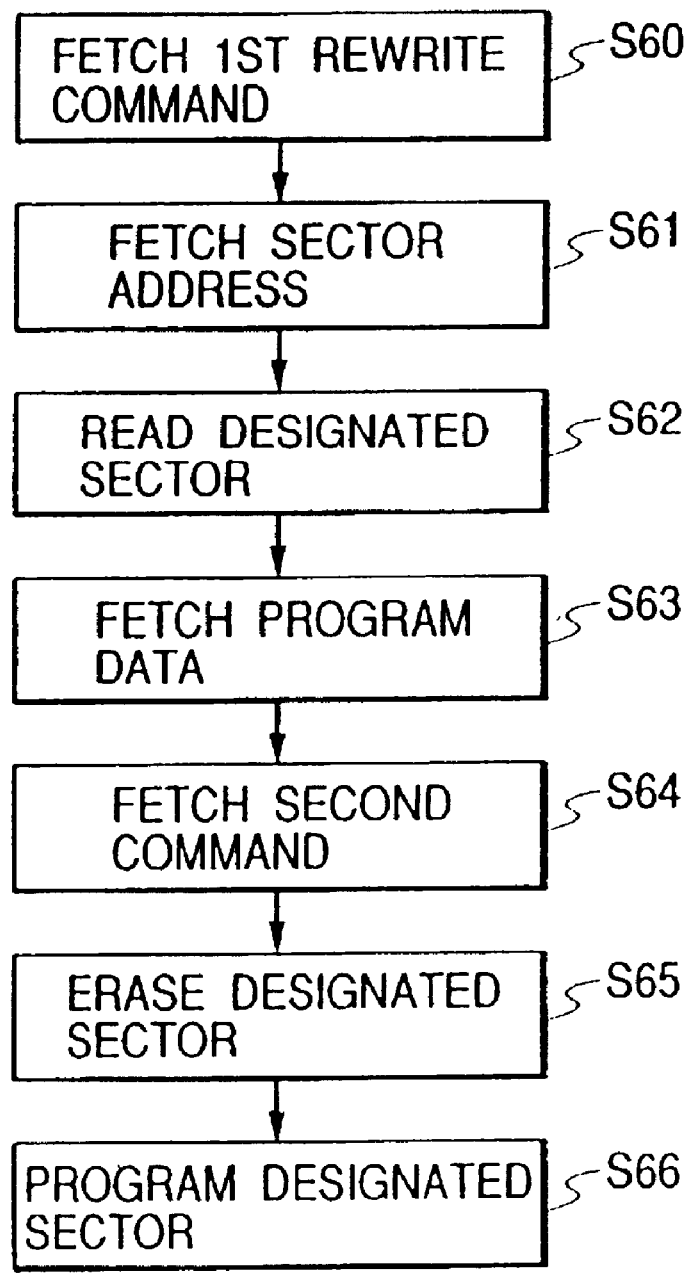
Figure 62:
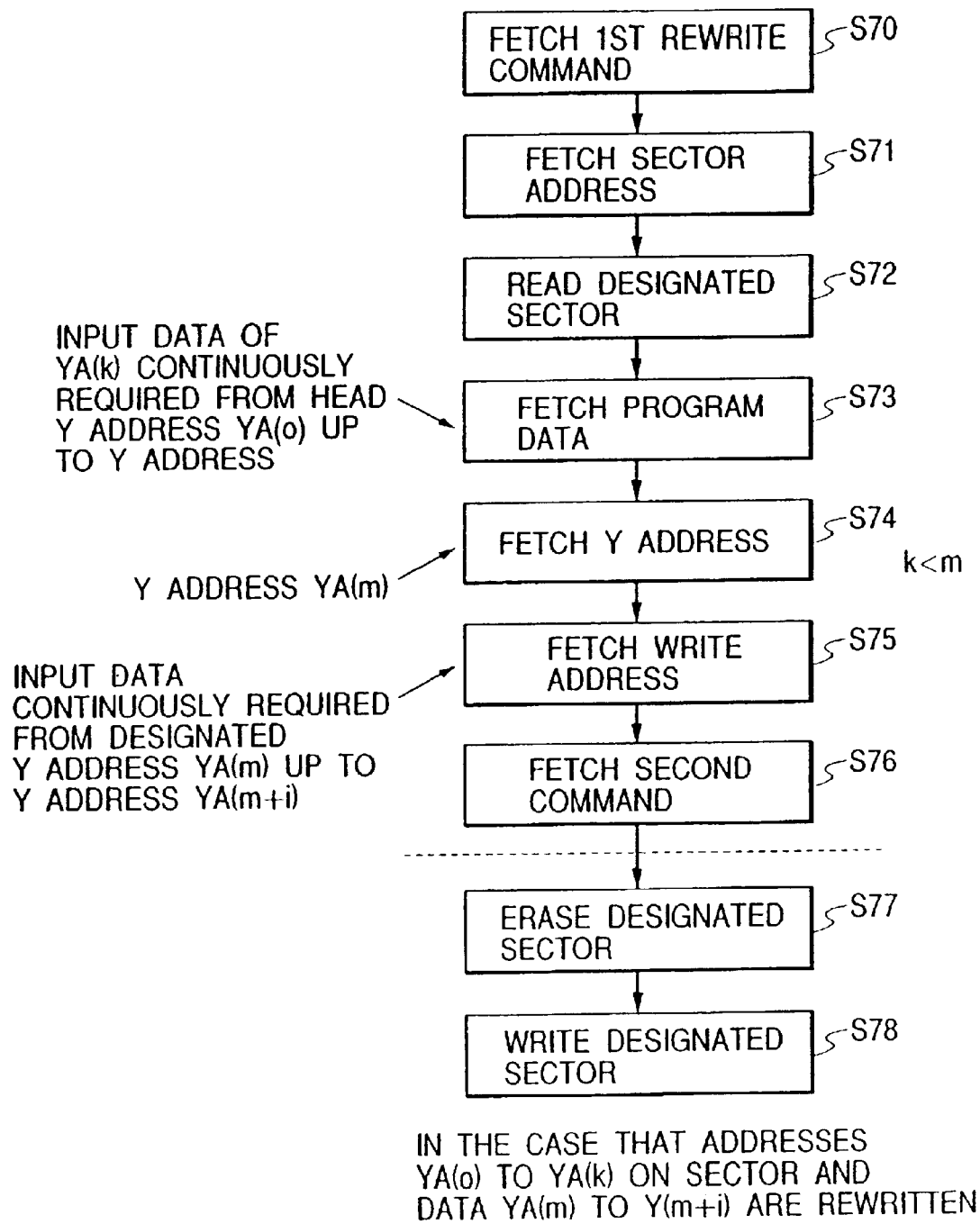
Figure 63:
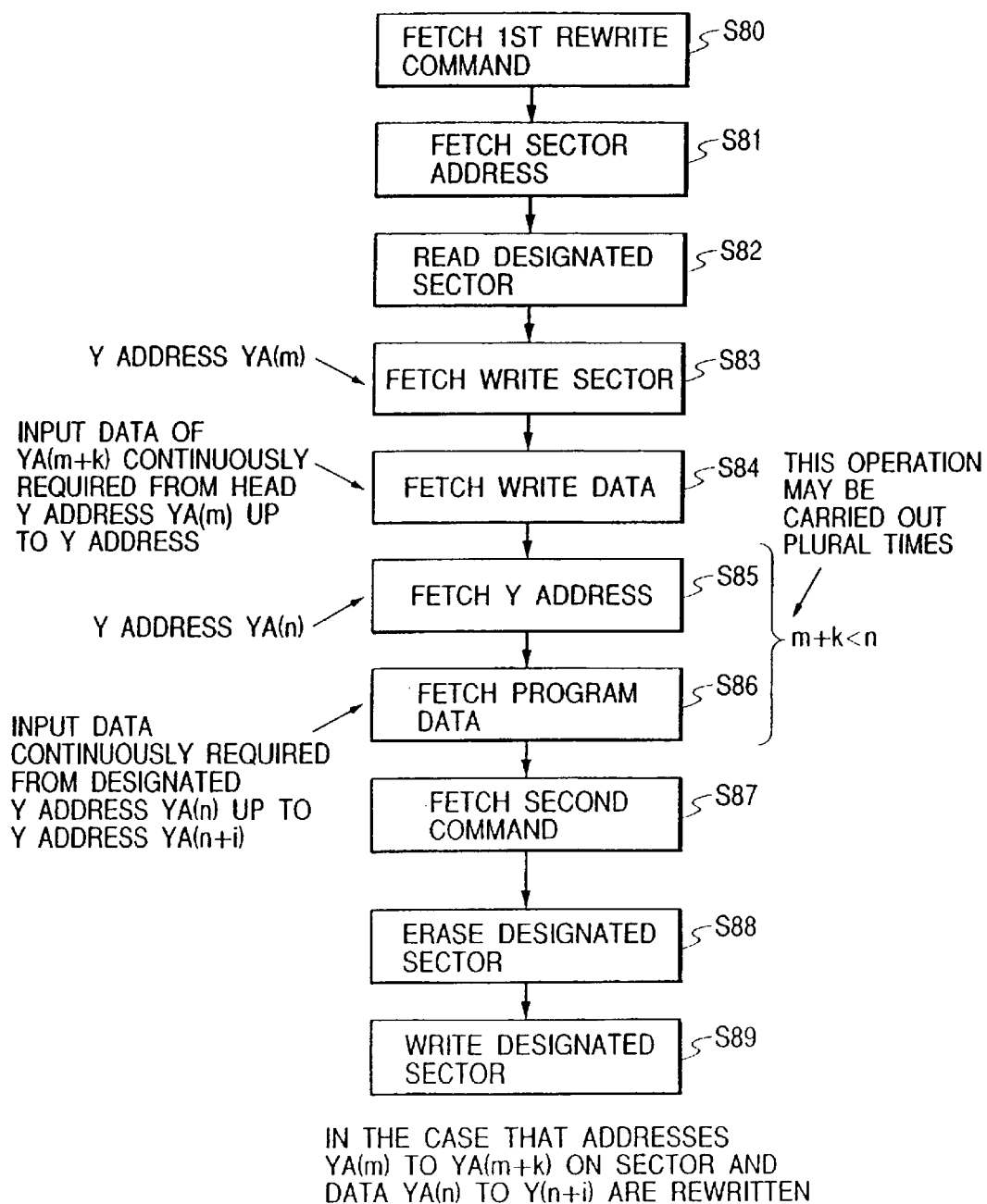
Figure 64:
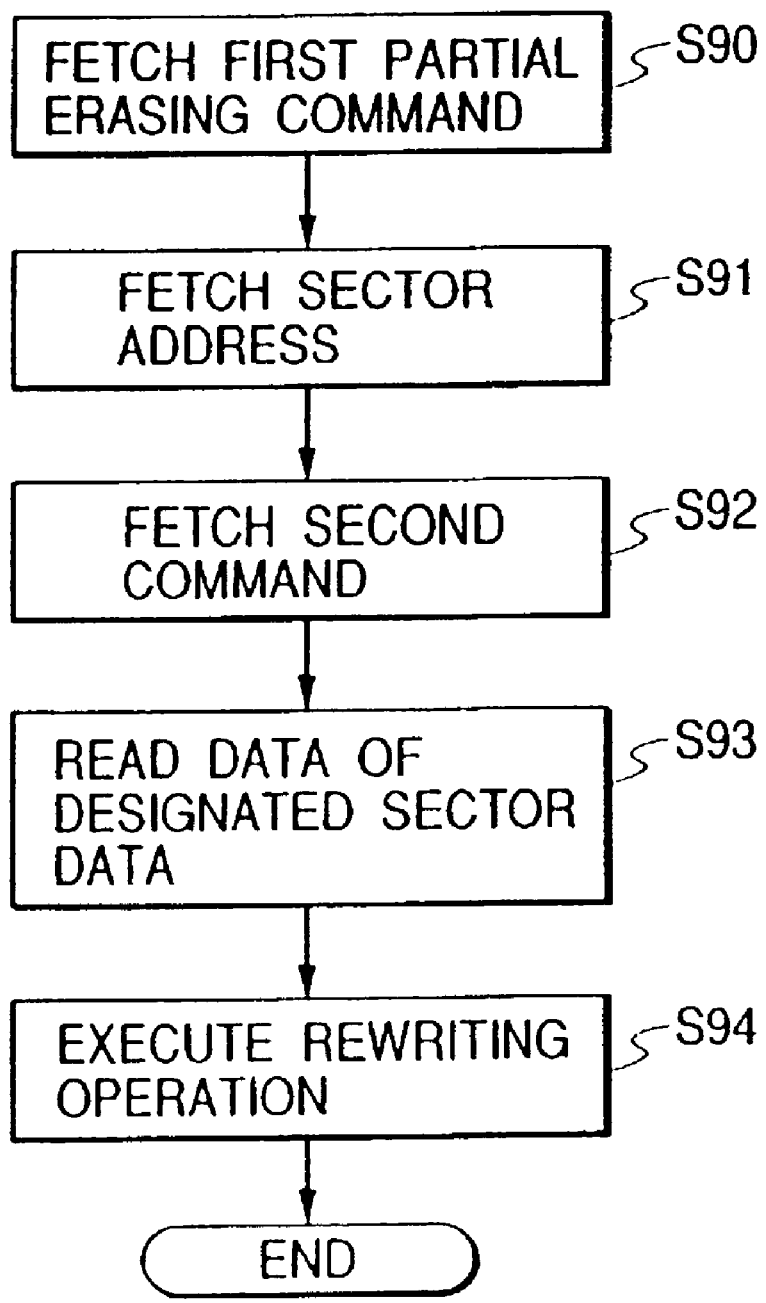
Figure 65:
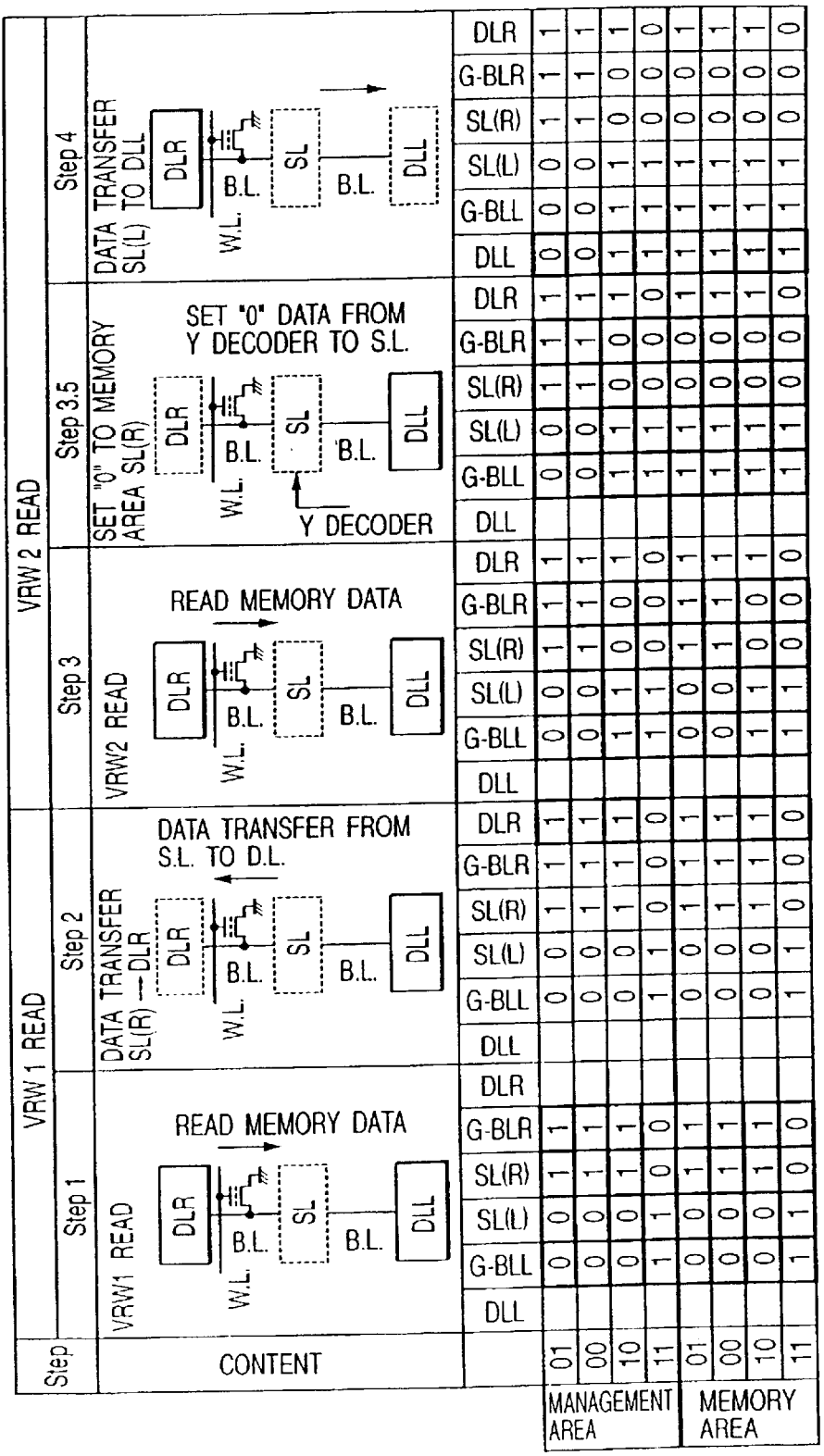
Figure 66:
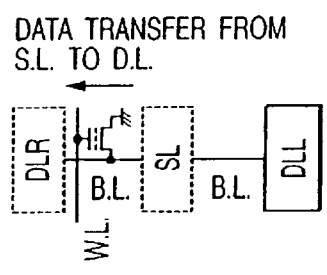
Figure 67:
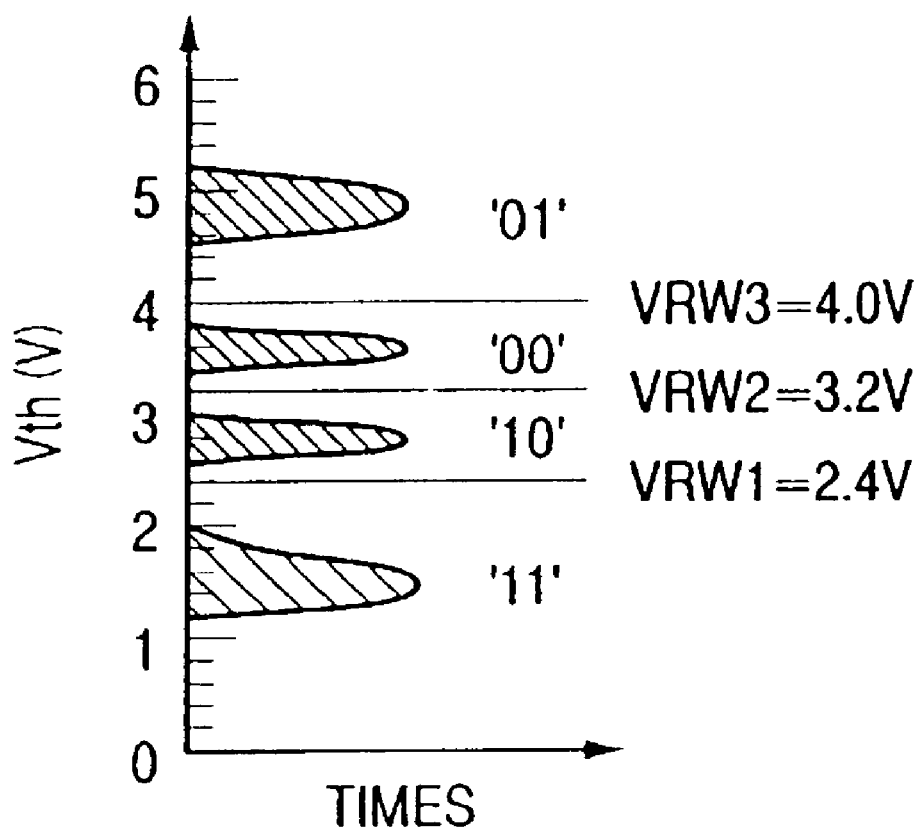

FIG. 5 illustratively represents an example of a connection relationship among a data latch circuit, a bit line, and a sense latch circuit contained in a memory array;

FIG. 6 is a explanatory diagram for showing an example of a corresponding relationship between the data latch circuit and the input/output terminals I/O4 and I/O0;

FIG. 7 illustratively shows as a threshold voltage distribution diagram, a relationship between 4 values of data and threshold voltages;

FIG. 8 is an explanatory diagram for showing an example of a programing voltage condition and a sector batch-erasing condition;

FIG. 9 is an explanatory diagram for explicitly showing various programing modes in a 4-value programing process;

FIG. 10 is a circuit diagram for indicating an example of a structure of the flash memory, which mainly shows a sense latch circuit and a data latch circuit;

FIG. 11 is a circuit diagram for showing an example of an AND type memory mat;

FIG. 12 is a circuit diagram for representing an example of a NOR type memory mat;

FIG. 13 is a circuit diagram for indicating an example of a DiNOR type memory mat;

FIG. 14 is a circuit diagram for showing an example of a NAND type memory mat;

FIG. 15 is a circuit diagram for representing an example of a HiCR type memory mat;

FIG. 16 is a flow chart for describing an example of a programing operation designated by a first command (1FH) and a second command (40H);

FIG. 17 is an explanatory diagram for schematically showing a "01" programing process operation TS1;

FIG. 18 is an explanatory diagram for schematically showing a "00" programing process operation TS2;

FIG. 19 is an explanatory diagram for schematically showing a "10" programing process operation TS3;

FIG. 20 is an explanatory diagram for indicating an erratic/disturb detecting process operation TS4;

FIG. 21 is an explanatory diagram for theoretically showing an example of a calculation content of a data latch processing operation;

FIG. 22 is an explanatory diagram for indicating a logic value of a calculation result with respect to logic values of data bits A and B in the case that the calculation logic shown in FIG. 21 is employed;

FIG. 23 is a flow chart for describing a detailed content of the "01" programing process operation TS1;

FIG. 24 is a flow chart for describing a detailed content of the "10" erratic detecting process operation;

FIG. 25 is an explanatory diagram for indicating an example of a "01" program data latch processing operation by the multi-sense method;

FIG. 26 is an explanatory diagram for representing an example of a "00" program data latch processing operation by the multi-sense method;

FIG. 27 is an explanatory diagram for indicating an example of a "10" program data latch processing operation by the multi-sense method;

FIG. 28 is an explanatory diagram for representing an example of a "00" erratic detection data latch processing operation by the multi-sense method;

FIG. 29 is an explanatory diagram for indicating an example of a "10" erratic detection data latch processing operation by the multi-sense method;

FIG. 30 is an explanatory diagram for representing an example of a "11" disturb detection data latch processing operation by the multi-sense method;

FIG. 31 is an explanatory diagram for showing a first detailed operation of a program bias application process operation S11 in the programing operation;

FIG. 32 is an explanatory diagram for indicating a final detailed operation of a program bias application process operation S11 in the programing operation;

FIG. 33 is an explanatory diagram for showing a detailed bit line precharge operation in a VWV 3 verify process operation;

FIG. 34 is an explanatory diagram for representing a detailed memory discharge operation in the VWV 3 verify process operation;

FIG. 35 is an explanatory diagram for showing a detrailed precharge operation for a sense latching operation in the VWV 3 verify process operation;

FIG. 36 is an explanatory diagram for showing a detailed sense latch operation in the VWV 3 verify process operation;

FIG. 37 is an explanatory diagram for representing a detailed all judgment operation in the VWV 3 verify process operation;

FIG. 38 is a timing chart for showing an example of operation timing in the program data latch processing operation;

FIG. 39 is a timing chart for representing an example of programing operation timing;

FIG. 40 is a timing chart for showing an example of operation timing in the program verify processing operation;

FIG. 41 is a timing chart for representing an example of all judging operation timing;

FIG. 42 is an explanatory diagram for explanatorily indicating "01" program data latch processing operation by the multi-power supply method;

FIG. 43 is an explanatory diagram for explanatorily showing "00" program data latch processing operation by the multi-power supply method;

FIG. 44 is an explanatory diagram for explanatorily representing "10" program data latch processing operation by the multi-power supply method;

FIG. 45 is an explanatory diagram for explanatorily indicating "00" erratic detection data latch processing operation by the multi-power supply method;

FIG. 46 is an explanatory diagram for explanatorily showing "10" erratic detection data latch processing operation by the multi-power supply method;

FIG. 47 is an explanatory diagram for explanatorily representing "11" disturb detection data latch processing operation by the multi-power supply method;

FIG. 48 shows an operation waveform chart of "01" program data latch processing operation by the multipower supply method;

FIG. 49 indicates an operation waveform chart of "00" program data latch processing operation by the multi-power supply method;

FIG. 50 represents an operation waveform chart of "10" program data latch processing operation by the multi-power supply method;

FIG. 51 shows an operation waveform chart of "00" erratic detection data latch processing operation by the multi-power supply method;

FIG. 52 indicates an operation waveform chart of "10" erratic detection data latch processing operation by the multi-power supply method;

FIG. 53 represents an operation waveform chart of "11" disturb detection data latch processing operation by the multi-power supply method;

FIG. 54 is an operation explanatory diagram for indicating various operation modes of the flash memory in connection with various voltage conditions;

FIG. 55 is a flow chart for indicating an example of a retry program function;

FIG. 56 is a flow chart for representing an example of a recovery function;

FIG. 57 shows a stage transition diagram for representing internal operations of the flash memory having the retry function and the recovery function;

FIG. 58 is a schematic block diagram for indicating an example of a memory card with using the flash memory;

FIG. 59 is a schematic block diagram for indicating an example of a data processing system with using the flash memory;

FIG. 60 is an explanatory diagram for explaining a concept of the retry function and the recovery function;

FIG. 61 is a flow chart for describing an example of a process operation by receiving a reprogram command;

FIG. 62 is a flow chart for describing an example of a process operation by receiving a reprogram command used to reprogram data with respect to a portion of a sector;

FIG. 63 is a flow chart for describing another example of a process operation by receiving a reprogram command used to reprogram data with respect to a portion of a sector;

FIG. 64 is a flow chart for explaining an example of a partial erase function;

FIG. 65 is an explanatory diagram for showing a detailed front half operation of a designated sector data reading operation of FIG. 64;

FIG. 66 is an explanatory diagram for indicating a detailed rear half operation of the designated sector data reading operation of FIG. 64; and FIG. 67 represents a relationship between a word line selecting level used to read designated sector data and a threshold voltage distribution.

DESCRIPTION OF THE PREFERRED EMBODIMENTS OVERALL STRUCRURE OF FLASH MEMORY

Figure 1:
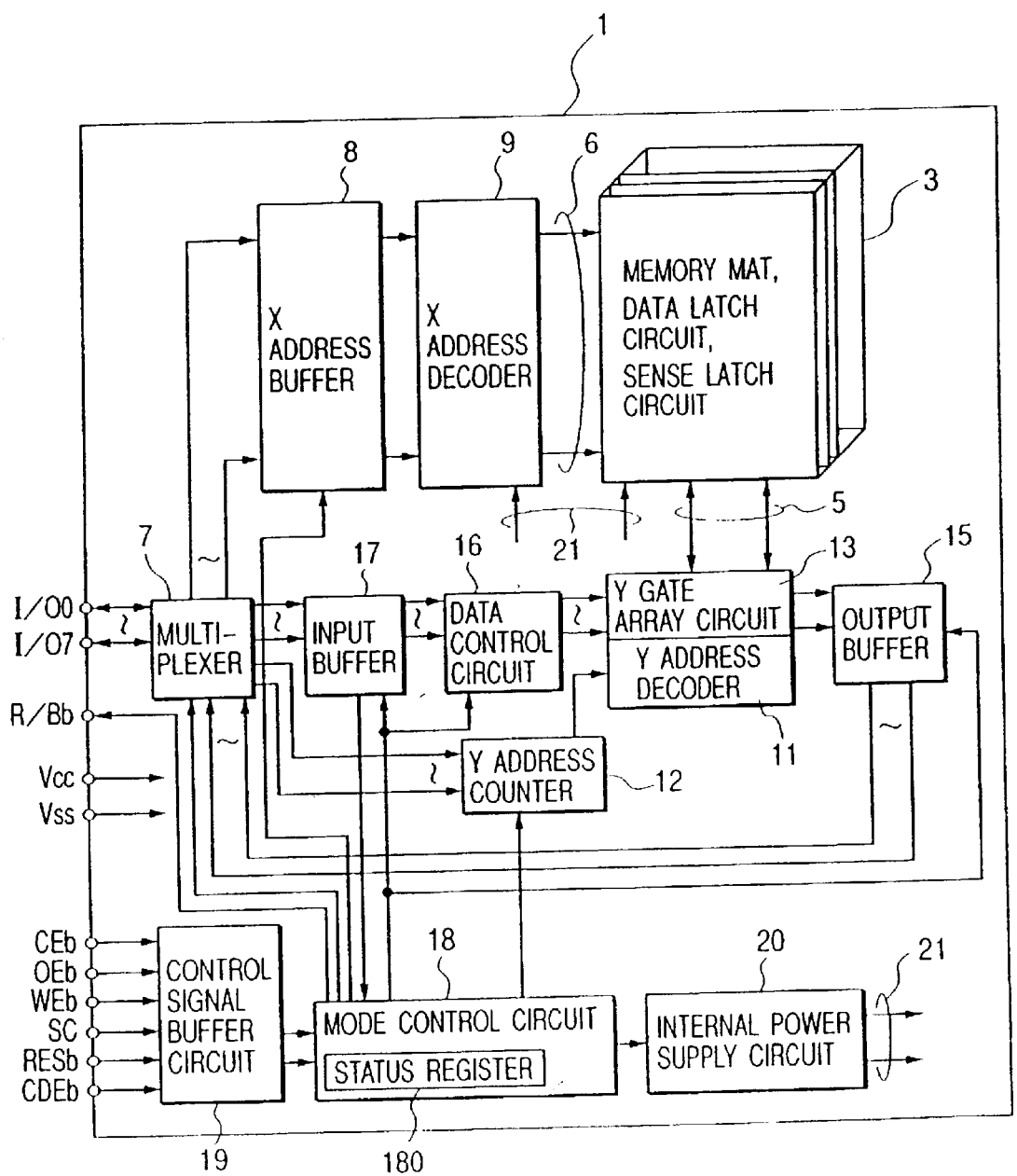
Figures 2, 3:
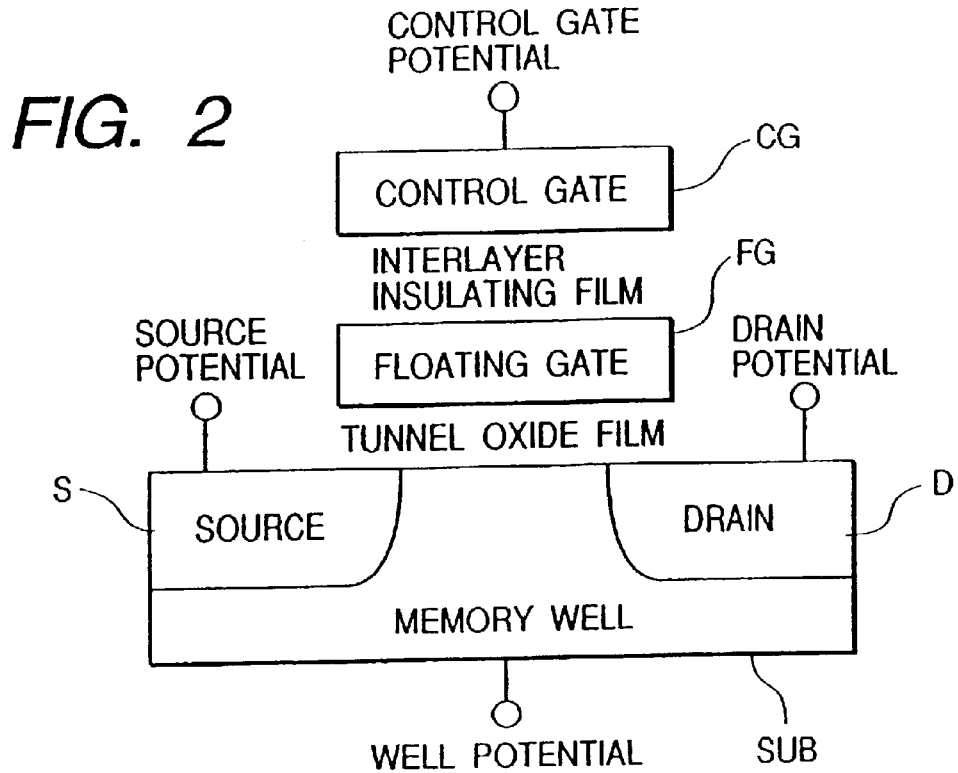
FIG. 3 is an explanatory diagram for showing an example of a command of the flash memory.

In FIG. 1, there is shown an overall structure of a flash memory 1 according to a first embodiment mode of the present invention. In this flash memory 1, 2 bits of information, or 2-bit data are programable in a single memory cell, and furthermore the 2-bit data are readable from this single memory cell, Reference numeral 3 shows a memory array containing a memory mat, a data latch circuit, and a sense latch circuit. The memory mat 3 contains a large number of electrically erasable/programable non-volatile memory cell transistors. For instance, as represented in FIG. 2, a memory cell transistor is constituted by employing a source "S" and a drain "D" formed in either a semiconductor substrate or a memory well "SUB"; a floating gate "FG" formed via a tunnel oxide film in a channel region; and also a control gate "CG" overlapped via an interlayer insulating film on the floating gate. The control gate CG is connected to a word line 6, the drain D is connected to a bit line 5, and the source S is connected to a source line (not shown in this drawing).

External input/output terminals I/O0 to I/O7 are commonly used as an address input terminal, a data input terminal, a data output terminal, and a command input terminal. X address signals inputted from the external input/output terminals I/O0 to I/O7 are supplied via a multiplexer 7 to an X address buffer 8. An X address decoder 9 decodes an internal complementary address signal output from the X address buffer 8 to drive the word line.

A sense latch circuit (not shown) is provided on one terminal side of the above-described bit line 5, and a data latch circuit (not shown either) is provided on the other terminal side of this bit line 5. In response to a selection signal outputted from a Y address decoder 11, the bit line 5 is selected by a Y gate array circuit 13. Y address signals entered from the external input/output terminals I/O0 to I/O7 are preset to a Y address counter 12, and Y address signals which are sequentially incremented while starting from a preset value are supplied to the Y address decoder 11.

A bit line selected by the Y gate array circuit 13 is conducted to an input terminal of an output buffer 15 when data is outputted, whereas this bit line is connected via a data control circuit 16 to an output terminal of an input buffer 17 when data is inputted. The connections between the output buffer 15, the input buffer 17, and the input/output terminals I/O0 to I/O7 are controlled by the multiplexer 7. Commands supplied from the input/output terminals I/O0 to I/O7 are supplied via the multiplexer 7 and the input buffer 17 to a mode control circuit 18. The above-explained data control circuit 16 may supply data of a logic value defined under control of the mode control circuit 18 to the memory array 3 in addition to the data supplied from the input/output terminals I/O0 to I/O7.

To a control signal buffer circuit 19, a chip enable signal CEb, an output enable signal OEb, a program enable signal WEb, a serial clock signal SC, a reset signal RESb, and a command enable signal CDEb are supplied as an access control signal. The mode control circuit 18 controls a signal interface function with respect to an external circuit in response to states of these signals, and also controls an internal operation in accordance with a command code. In the case that a command, or data is entered to the input/output terminals I/O0 to I/O7, the command enable signal CDEb is asserted. When a command is inputted into the input/output terminals, the program enable signal WEb is furthermore asserted. When data is entered to the input/output terminals, the program enable signal WEb is negated. When an address is inputted, the command enable signal CDEb is negated, and the program enable signal WEb is asserted. As a result, the mode control circuit 18 can discriminate the command, the data, and the address entered from the external input/output terminals I/O0 to I/O7 in a multiplex manner. While the erasing operation and the programing operation are performed, the mode control circuit 18 can assert ready/busy signals R/Bb and can notify this condition to the external circuit.

The internal power supply circuit 20 produces various sorts of operation power supply voltages 21 used to execute programing/erase-verifying/reading operations, and then supplies these operation power supply voltages to the X address decoder 9 and the memory cell array 3.

In response to a command, the mode control circuit 18 controls the overall arrangement of the flash memory 1. It should be noted that operations of the flash memory 1 are basically determined by commands.

Commands allocated to the flash memory 1 are exemplified in FIG. 3. That is, there are a read command, a recovery read command, an erase command, a program command, an additional program command, a retry program command, a partial erase command, and a reprogram command. In this drawing, a command code is expressed by the hexadecimal notation. Among the commands related to the reading operation (namely, read command, and recovery read command), and also the commands related to the programing operation, such a command (retry program command) to which the program data need not be supplied is constituted by a first command, and other commands are constituted by the first command and a second command. The contents of the respective commands will be described in detail.

The flash memory 1 contains a status register 180 used to indicate an internal status, or conditions of this flash memory 1. The content of the status register 180 can be read out via the input/output terminals I/O0 to I/O7 by asserting the output enable signal OEb. FIG. 4 shows a relationship between the contents of the respective bits of the status register 180 and the input/output terminals I/O0 to I/O7.

FIG. 5 represents a relationship between the data latch circuits and the sense latch circuits contained in the memory array 3. An array SLA of the sense latch circuit SL is arranged at a center of this drawing. A switch circuit/calculating circuit array 30L, a memory mat MML, another switch circuit/calculating circuit array 31L, and an array DLLA of an upper digit data latch circuit DLL are arranged on the side of one input/output node of the sense latch circuit SL. Similarly, a switch circuit/calculating circuit array 30R, a memory mat MMR, another switch circuit/calculating circuit array 31R, and an array DLRA of a lower digit data latch circuit DLR are arranged on the side of the other input/output node of the sense latch circuit SL. Furthermore, as shown in FIG. 5, when a structure is tried to be grasped while giving an attention to a pair of bit line, the data latch circuits DLL and DLR are provided via bit lines G-BLL and G-BLR at one pair of data input/output nodes SLL and SLR of a static latching type sense latch circuit SL. Both the data latch circuits DLL and DLR can latch program data bits supplied via the Y gate array circuit 13. In accordance with this example, since the flash memory 1 owns the 8-bit input/output terminals I/O0 to I/O7, the program data can be set to four pairs of bit lines of the data latch circuits DLL and DLR by entering the program data 1 time. As represented in the correspondence relationship between the data latch circuits DLL/DLR and the input/output terminals I/O4, I/O0 shown in FIG. 6, the modes of the data set are made constant. In this explanation, since the unit of the programing operation is set to the unit of the word line, after the program data have been set to the data latch circuits DLL and DLR, the programing operation is carried out by applying the programing voltages. These data latch circuits DLL and DLR are related to the bit line of all of the memory cells in which selection terminals are coupled to one word line.

In the multi-level information storage technique realized by the flash memory 1 shown in FIG. 1, an information storage state of a single memory cell is selected to be one of an erase state ("11"), a first program state ("10"), a second program state ("00"), and a third program state("01"). Four sets of these information storage states in total are such states determined by 2-bit data. In other words, such 2-bit data is stored into a single memory cell. A relationship between the data having four values and threshold voltages is indicated as in a threshold voltage distribution diagram of FIG. 7.

To achieve the threshold value distribution as indicated in FIG. 7, 3 different sorts of program verify voltages are set which are applied to the word line during the programing operation. Then, these three program verify voltages are sequentially switched, and the programing operations are carried out three times in the separate manner. In FIG. 7, symbols VWV1, VWV2, and VWV3 are program verify voltages employed when the first program state, the second program state, and the third program state are obtained, respectively.

FIG. 8 indicates an example of voltage applying conditions for the word line and the bit line during each of the three different programing operations. A voltage of 0 V is applied to a selected bit line, and a voltage of 6 V is applied to a non-selected bit line during a programing operation. Although the present invention is not limited to this example, for instance, a voltage of 17 V is applied to the word line. The longer the application time of the high program voltage is applied, the higher the threshold voltage of the memory cell is increased. The three sorts of program threshold voltages may be controlled by controlling the duration time of such high voltage conditions, and furthermore by controlling the level of the high voltage applied to the word line.

Whether 0 V, or 6 V is applied to the bit line may be determined based upon a logic value of program control information latched by the sense latch circuit SL. The program control information may be controlled in such a manner that when the data latched by the sense latch circuit SL owns the logic value of "1", the programing operation is not selected, whereas when the data latched by the sense latch circuit SL owns the logic value of "0", the programing operation is selected in the side of the programing operation selected memory mat (a detailed control operation thereof will be explained later). It should also be noted that a precharge circuit is contained in the above-explained switch circuit/calculating circuit. This precharge circuit is operated in such a way that when the data latched in the sense latch circuit is "1" and also 6 V is applied to the bit line, the bit line is previously precharged. As described above, since the bit line is precharged by the precharge circuit in advance, a peak current produced when 6 V is applied to the bit line can be reduced.

The latching operation of the program control information with respect to the sense latch circuit is controlled every time each of the three programing operations is carried out. This program control is performed by the mode control circuit 18. At this time, the program control information which should be latched by the sense latch circuit SL is produced by performing a calculation with using the program data bits saved by the data latch circuits DLL and DLR every programing operation. The produced program control information is latched by the sense latch circuit SL. For example, as indicated in FIG. 6, assuming now that the program data latched by the data latch circuits DLL and DLR is "01", this "01" state corresponds to the third program state (see FIG. 7). The program operation which has been subdivided into three program operations after the erase state - - - ???. In the case that such a programing sequence is employed so as to produce the program states in the order of the lower threshold voltages such as a second mode (Case 2) of FIG. 9, a calculation result by employing the program data ("01") of the data latch circuits DLL and DLR is set to a logic value "1" during the programing operation executed to obtain the first program state in the first time; a calculation result by employing the program data ("01") of the data latch circuits DLL and DLR is set to a logic value "1" during the programing operation executed to obtain the second program state in the second time; and a calculation result by employing the program data ("01") of the data latch circuits DLL and DLR is set to a logic value "0" during the programing operation executed to obtain the third program state in the third time. Such a calculation is performed by activating the above-described switch circuit/calculating circuit. As a consequence, the program voltage is applied only during the third programing operation, so that the third program state ("01") within the four values can be realized in this memory cell.

As previously explained, when the programing operations are carried out in the three different times, the program data which is firstly latched by the data latch circuits DLL and DLR is not destroyed, but may be maintained. This is because the following control sequence is employed. That is, the 2-bit program data latched by the data latch circuits DLL and DLR are used to be calculated every time the programing operation is carried out, and then the calculated results are set to the sense latch circuit SL every time the calculation is carried out.

It should also be noted that the order for changing the threshold voltage during the programing operation is not limited to the second state (Case 2) shown in FIG. 9, but may be modified. For example, as in the first mode (Case 1), the higher threshold voltage may be firstly set. Also, as in the third mode (Case 3), the changing rates of the threshold voltages obtained in a single programing operation may be made equal to each other as to any of the program states. Alternatively, the threshold voltages may be controlled as in the fourth mode (Case 4), or the fifth mode (Case 5).

When data is read out, three sorts of voltages are set as word line selection levels which are applied to the word line. While these three sorts of word line selection levels are sequentially changed, the reading operations are performed three times. The data having two values (namely, 1 bit data) which is read from the memory cell during each of the reading operations is latched by the sense latch circuit 4. Every time the data is latched, such a calculation is carried out that the sense-latched content is reflected onto the 2-bit information of the data latch circuit. The 2 bits acquired in the data latch circuits DLL and DLR as a result of the sense latching operations executed 3 times are set as data corresponding to the information having the 4 values saved in this memory cell.

DETAILED STRUCTURE OF MEMORY ARRAY

Next, a detailed structure of the above-explained memory array will now be explained. FIG. 10 shows an example of a circuit arrangement of the above-explained flash memory 1 which is mainly arranged by a sense latch circuit and a data latch circuit. As apparent from FIG. 10, circuit arrangements located in the vicinity of right/left bit lines G-BLR/G-BLL of the sense latch circuit SL are made of mirror-symmetrical structures while positioning the sense latch circuit SL as a center.

Memory mats MML and MMR contain a plurality of electrically programable memory cells MC (several memory cells are typically indicated). As indicated in FIG. 2, one memory cell MC is constituted by a single electrically programable transistor (memory cell transistor) having a control gate, a floating gate, a source and a drain. Although not limited to this example, a layout structure of a memory cell is a so-called "AND" type memory structure. As exemplified on the side of the memory mat MMR, in the AND type structure, a plurality of the above-described memory cell transistors are arranged in a parallel manner via the respective diffusion layers (semiconductor regions) which commonly constitute a source and a drain. The diffusion layer which constitutes the drain is coupled via a selection transistor M1 to the bit line G-BLR, and the diffusion layer which constitutes the source is coupled via another selection transistor M2 to a common source line VMMR. The AND type memory cell structure will be discussed more in detail. Symbol "SSi" shows a switch control signal of the selection transistor M2, and symbol "SDi" indicates a switch control signal of the selection transistor M1. Also, symbol "WL" represents a word line coupled to the control gate of the memory cell MC. It should be noted that another memory mat MML is constructed in a similar manner to that of the above-explained memory mat MMR. It should also be understood that a P-channel type MOS transistor is illustrated by giving an arrow to a gate of a substrate thereof in order to be discriminated from an N-channel type MOS transistor in the drawings attached to the specification of the present invention.

The sense latch circuit SL is constructed of a static latch circuit made of a pair of CMOS inverters, namely a circuit constituted by that an input terminal of one CMOS inverter is coupled to an output terminal of the other CMOS inverter. Symbols "SLR" and "SLL" indicate one pair of input/output nodes of the sense latch circuit SL. Symbols "SLP" and "SLN" represent operation power supplies of the sense latch circuit SL. Both a series circuit of MOS transistors M3L and M4L, and also another series circuit of MOS transistors M3R and M4R will constitute a column switch circuit which enters data into the sense latch circuit SL by way of a complementary signal. MOS transistors M5L and M5R selectively discharge the input/output nodes SLL and SLR.

The data latch circuit DLR is constructed of a static latch circuit made of a pair of CMOS inverters, namely a circuit constituted by that an input terminal of one CMOS inverter is coupled to an output terminal of the other CMOS inverter. Symbols "DLRR" and "DLRL" indicate one pair of input/output nodes of the data latch circuit DLR. Symbols "DLPR" and "DLNR" represent operation power supplies of the data latch circuit DLR. Both a series circuit of MOS transistors M6L and M7L, and also another series circuit of MOS transistors M6R and M7R will constitute a column switch circuit which enters data into the data latch circuit DLR by way of a complementary signal. MOS transistors M8L and M8R are transistors for selectively charging the input/output nodes DLRL and DLRR to a voltage FPC.

The data latch circuit DLL is constructed of a static latch circuit made of a pair of CMOS inverters, namely a circuit constituted by that an input terminal of one CMOS inverter is coupled to an output terminal of the other CMOS inverter. Symbols "DLLR" and "DLLL" indicate one pair of input/output nodes of the data latch circuit DLL. Symbols "DLPL" and "DLNL" represent operation power supplies of the data latch circuit DLL. Both a series circuit of MOS transistors M9L and M10L, and also another series circuit of MOS transistors M9R and M10R will constitute a column switch circuit which enters data into the data latch circuit DLL by way of a complementary signal. MOS transistors M11L and M11R are transistors for selectively charging the input/output nodes DLLL and DLLR to a voltage FPC.

The above-described switch circuit/calculating circuit 30R is arranged by MOS transistors M20R to M25R. The MOS transistor M20R receives a voltage level of the input/ output node SLR of the sense latch circuit SL at the gate thereof. When this voltage level is a high level, the voltage FPC is applied via the MOS transistor M21R to the bit line G-BLR. The supplied voltage level is determined by controlling a conductance of the MOS transistor M21R based upon the voltage level of the control signal PCR. The transistor M22R constitutes a transfer gate capable of selectively conducting both the input/output node SLR and the bit line G-BLR. The MOS transistor M23R is used to all judgment. The MOS transistors M24R and M25R are used to precharge and also discharge the bit line G-BLR. The switch circuit/calculating circuit 30L is similarly arranged by MOS transistors M20L to M25L. It should be noted that gate control signals for the MOS transistors M20L, M22L, M24L, and M25L are different from those for the MOS transistors M20R, M22R, M24R, and M25R.

The above-described switch circuit/calculating circuit 31R is arranged by MOS transistors M26R to M28R. The MOS transistor M26R receives a voltage level of the input/ output node DLRL of the data latch circuit DLR at the gate thereof. When this voltage level is a high level, the voltage FPC is applied via the MOS transistor M27R to the bit line G-BLR. The supplied voltage level is determined by controlling a conductance of the MOS transistor M27R based upon the voltage level of the control signal PCDR. The transistor M28R constitutes a transfer gate capable of selectively conducting both the input/output node DLRL and the bit line G-BLR. The switch circuit/calculating circuit 31L is similarly arranged by MOS transistors M26L to M28L. It should be noted that gate control signals for the MOS transistor M27L and M28L are different from those for the MOS transistors M27R and M28R.

In the circuit arrangement of FIG. 10, basic circuit operations during the reading operation and the programing operation will now be described. For example, in FIG. 10, in the case that the reading operation in the verify operation is executed with respect to the memory cell MC contained in the memory mat MMR, the set MOS transistor M5L provided on the side of the non-selected memory mat MML is brought into an ON state so as to activate the sense latch circuit SL, so that a high level is latched at the input/output node SLR of this sense latch circuit SL. Then, for example, the control signal PCR is controlled to be 1 V+Vth in order to precharge the bit line G-BLR to 1 V. On the other hand, on the side of the non-selected memory mat MML, the gate voltage RPCL of the MOS transistor M24L is controlled to 0.5 V+Vth so as to precharge the bit line G-BLL to 0.5 V. This voltage of 0.5 V is set to the reference level of the sense operation by the sense latch circuit SL. On the other hand, during the reading operation in response to the read command, the signal RPCR on the side of the selected memory mat (MMR) is set to 1 V+Vth, and also the signal RPCL on the side of the non-selected memory mat (MML) is set to 0.5 V+Vth so as to precharge the bit lines of the selected memory mat side to 1 V in the batch mode, and also precharge the bit lines of the non-selected memory mat side to 0.5 V in the batch mode. If the selected memory mat is equal to "MML" and further the non-selected memory mat is equal to "MMR", then the signal RPCR is apparently set to 0.5 V+Vth and the signal RPCL is set to 1 V+Vth. As previously explained, the precharged voltage of 0.5 V is used as the reference level. After the word line is selected, both the transfer MOS transistor M22L and the transfer MOS transistor M22R are turned ON. At this time, the sense latch circuit SL senses as to whether or not the level of the bit line G-BLR is higher than 0.5 V to latch the data read from the memory cell MC.

During the programing operation, after the program control information is latched by the sense latch circuit SL, both the gate control signals PCR and PCL of the MOS transistors M21R and M21L are controlled to high levels. As a result, the bit line coupled to the input/output node on the high level side of the sense latch circuit SL is precharged via either the MOS transistor M20R or the MOS transistor M20L to a high level. Thereafter, both the MOS transistor M22R and the MOS transistor M22L are brought into ON states, so that a voltage is applied from the power supply SLP of the sense latch circuit SL to the bit line coupled to the input/output nodes on the high level side of the sense latch circuit SL. At this time, a high program voltage is being applied to the word line of the program sector of such a memory mat which is selected for the programming operation. As a consequence, such a memory cell that the bit line thereof is set to a low level such as the ground voltage is to be written among the memory cells connected to the control gate to which the program voltage is applied on the side of the programing-operation selected memory mat.

The transistors M23L and M23R are used for the above-described all judgment. The gates of the MOS transistors M23L and M23R are coupled to the corresponding bit lines, and the sources thereof are coupled to the ground potential. In actual, there are provided a large number of the circuit arrangements related to the bit lines G-BLL and G-BLR where one sense latch circuit SL is typically arranged as a center, as shown in FIG. 10. While sandwiching the sense latch circuit SL, all of the drains of the MOS transistors M23L located on the left side of FIG. 10 are commonly connected to a terminal ECL, and a current will flow through this terminal ECL. This current is defined in response to a condition (level) of the left-sided bit line typically defined as the bit line G-BLL. Similarly, while sandwiching the sense latch circuit SL, all of the drains of the MOS transistors M23R located on the right side of FIG. 10 are commonly connected to another terminal ECR, and a current will flow through this terminal ECR. This current is defined in response to a condition (level) of the right-sided bit line typically defined as the bit line G-BLR. Although not shown in this drawing, a current sense type amplifier is provided. The current type amplifier may detect as to whether or not all of the conditions of the bit lines G-BLL (G-BLR) provided on the left-side (right-side) of the sense latch circuit SL are made equal to each other in response to a current change in the terminal ECL (ECR). This amplifier is employed so as to detect as to whether or not all of the memory cells which are to be processed by either the erase verify operation or the program verify operation become a preselected threshold voltage, namely, this amplifier is used for the all judgment.

The structures of the memory mats MMR and MML shown in FIG. 10 are an AND type structure. FIG. 11 shows further detailed structure of the AND type memory mat. Although not shown in this drawing, the memory cell indicated in FIG. 11 owns such a structure manufactured by a process operation with employment of two layers of metal wiring layers. A memory cell MC and selected MOS transistors M1 and M2 are formed at a position where a diffusion layer along a longitudinal direction is intersected with a control gate made of polysilicon elongated along a transverse direction. The memory cell MC of the flash memory is made of, for instance, an N-channel type MOS transistor formed on a P type substrate. The memory mat of the flash memory is not limited to the above-explained AND type memory mat, but may be manufactured by employing a NOR type memory mat shown in FIG. 12, a DiNOR type memory mat indicated in FIG. 13, a NAND type memory mat represented in FIG. 14, and an HiCR type memory mat indicated in FIG. 15. In any of these memory mat structures, the memory cells of the flash memories basically have the same structures. When the memory cells are arranged in an array shape, the features of the respective memory mats appear. Since the NOR type memory mat requires-the contacts with the bit line (metal wiring layers) every memory, the occupied area can be hardly reduced. To the contrary, since the contacts with the bit lines may be arranged every block in the NAND type memory mat, the DiNOR type memory mat, and the AND type memory mat, the occupied area can be reduced.

Detailed Programing Operation

FIG. 16 is a flow chart for describing an example of programming operations designated by a first command (1FH) and a second command (40H). In this programing operation, a word line is used as one unit (namely, sector programing operation).

First, when the first command (1FH) is fetched (step S1), the next input is fetched as a sector address (step S2). An input after the sector address has been fetched is acquired as program data (step S3) until the second command (40H) is fetched (step S4). The sector address acquired at the step S2 is an X address. In response to this X address, one word line to which a high program voltage is applied is selected. The program data acquisition repeatedly executed at the step S3 is carried out in a byte unit with respect to the data latch circuits DLL and DLR while sequentially incrementing the Y-address counter 12 from the initial value thereof. For example, as indicated in FIG. 5, the program data is latched by the data latch circuit arrays DLLA and DLRA which are allocated to one pair of memory mats MML and MMR related to one sense latch circuit array SLA. Assuming now that control gates of "n" pieces of memory cells are coupled to a single word line, n-bit program data are latched to each of the data latch circuit arrays DLLA and DLRA.

After the program data is latched, the "01" program process operation TS1, "00" program process operation TS2, "10" program process operation TS3, and further the erratic/disturb detection process operation TS4 are carried out.

As exemplified in FIG. 17, the above-described "01" program process operation TS1 corresponds to such a process operation that a threshold voltage of a memory cell MC is brought into the third program state ("01") with respect to the erase state ("11") equal to one state within 4 values. In this "01" program process operation TS1, VWV 3 is employed as a program verify voltage. As schematically indicated in FIG. 16, the "01" program process operation TS1 is mainly classified into a process operation in which in response to the 2-bit data of "01" latched in the data latch circuits DLL and DLR, program control data having an enable level is latched by the sense latch circuit SL ("01" data latching); another process operation in which in response to the latched program control data having the enable level, a programing operation corresponding to the data "01" is carried out for a memory cell transistor ("01" data programing); and furthermore another process operation in which a program verify operation by the verify voltage VWV 3 with respect to this programing operation is carried out (program verify VWV 3).

As exemplified in FIG. 18, the above-described "00" program process operation TS2 corresponds to such a process operation that a threshold voltage of a memory cell MC is brought into the second program state ("00") with respect to the erase state ("11") equal to one state within 4 values.

In this "00" program process operation TS2, VWV 2 is employed as a program verify voltage. As schematically indicated in FIG. 16, this "00" program process operation TS2 is mainly classified into a process operation in which in response to the 2-bit data of "00". latched in the data latch circuits DLL and DLR, program control data having an enable level is latched by the sense latch circuit SL ("00" data latching); another process operation in which in response to the latched program control data having the enable level, a programing operation corresponding to the data "00"is carried out for a memory cell transistor ("00" data programing); and furthermore another process operation in which a program verify operation by the verify voltage VWV 2 with respect to this programing operation is carried out (program verify VWV 2).

As exemplified in FIG. 19, the above-described "10" program process operation TS3 corresponds to such a process operation that a threshold voltage of a memory cell MC is brought into the first program state ("10") with respect to the erase state ("11") equal to one state within 4 values. In this 10" program process operation TS3, VWV 1 is employed as a program verify voltage. As schematically indicated in FIG. 16, the "10" program process operation TS3 is mainly classified into a process operation in which in response to the 2-bit data of "10" latched in the data latch circuits DLL and DLR, program control data having an enable level is latched by the sense latch circuit SL ("10" data latching); another process operation in which in response to the latched program control data having the enable level, a programing operation corresponding to the data "10" is carried out for a memory cell transistor ("10" data programing); and furthermore another process operation in which a program verify operation by the verify voltage VWV 1 with respect to this programing operation is carried out (program verify VWV 1). It should be understood that the above-explained program verify voltages are determined as follows:

VWV 3>VWV 2>VWV 1.

Also, as exemplified in FIG. 20, the above-explained erratic/disturb detection process operation TS4 corresponds to a disturb detection process operation ("11" word disturb detection VWDS of FIG. 16) for detecting as to whether or not a threshold voltage of a memory cell under erase state exceeds VWDS; and to such a process operation for detecting as to whether or not the threshold voltage of the memory cell transistor to which the data of "10" has been written exceeds VWE 1 ("10" erratic detection VWE 1 of FIG. 16); and also such an erratic detection process operation for detecting as to whether or not the threshold voltage of the memory cell transistor to which the data "00" has been written exceeds VWE 2 ("00" erratic detection VWE 2 of FIG. 16).

When a series of processed results obtained up to the erratic/disturb detection process TS4 is normal, a pass flag is set to the status register 180 (step S5), and then a series of programing process operations are accomplished (OK). To the contrary, when the detection result obtained in the erratic/disturb detection process TS4 is error, a judgment is made as to whether or not error occurrence times reach a preselected time (step S6). If the error occurrence times do not reach this preselected time, then the data of the program sector is erased (step S7), and a series of programing operations is again commenced from the "01" programing operation. While the retry time is saved in a counter means (not shown), a check is made as to whether or not the error occurrence times reach a preselected time based upon the count value of the counter means (step S6). When the error occurrence times reach a preselected time, a fail flag is set to the status register 180 (step S8), and a series of programing process operations is ended under abnormal condition (NG).

As apparent from FIG. 16, when the data programing operation is repeatedly performed by performing the reerasing operation, the program data of the program sector need not be fetched. This is because the program data for 1 sector, which has been once latched into the data latch circuits DLL and DLR at the previous step S3, is not electrically destroyed even when the above-described programing process operations TS1 to TS4 are carried out, but this program data is still left in the data latch circuits DLL and DLR.

This depends upon the above-explained latch operation control mode of the program control information with respect to the sense latch circuit SL. In other words, the program control information which should be latched by the sense latch circuit SL is produced every time the calculation with employment of the program data bit latched by the data latch circuits DLL and DLR is carried out with respect to each of the programing operations. Then, the produced program control information is latched by the sense latch circuit SL. For instance, as indicated in FIG. 6, assuming now that the program data latched in the data latch circuits DLL and DLR is equal to "01", the "01" state corresponds to the third program state as represented in FIG. 7. In such a case that the three-divided programing operations after the erasing state are carried out in the second mode (Case 2) of FIG. 9, a calculation result is a logic value of "1", which is obtained by employing the program data ("01") of the data latch circuits DLL and DLR when the programing operation for acquiring the first programing state is performed in the first time. Similarly, a calculation result is a logic value of "1", which is obtained by employing the program data ("01") of the data latch circuits DLL and DLR when the programing operation for acquiring the second programing state is performed in the second time. Also, a calculation result is a logic value of "0", which is obtained by employing the program data ("01") of the data latch circuits DLL and DLR when the programing operation for acquiring the third programing state is performed in the third time. Such a calculation is carried out by actuating the switch circuit/calculating circuit. As a result, only during the third programing operation, the programing high potential is applied between the drain of the memory cell transistor and the control gate thereof, so that the third program state ("01") among the four values may be realized in this memory cell transistor.

As previously explained, when the programing operation is carried out by subdividing this programing operation into three programing operations, the program data which has been latched into the data latch circuits DLL and DLR at the first time is not electrically destroyed, but is still maintained. This is because the following control sequence is employed. That is, the 2-bit program data latched in the data latch circuits DLL and DLR is used to be calculated and then the calculated program data is set to the sense latch circuit SL every time the programing operation is carried out. Similarly, even in the erratic/disturb detection process operation, since such a control sequence is employed that the calculation result obtained by employing the 2-bit program data latched by the data latch circuits DLL and DLR is set to the sense latch circuit SL every time the programing operation is carried out, the program data which has been latched into the data latch circuits DLL and DLR at the first time is not electrically destroyed, but is still remained.

It should be noted that there is a difference in the calculating methods for the process operations (data latch process operations) for latching the calculated results with employment of the 2-bit program data latched in the data latch circuits DLL and DLR in the sense latch circuit SL, because of a relationship between the data latch process operations and the present process operations in the steps TS1 to TS4.

FIG. 21 theoretically shows an example of calculation contents of the above-explained data latch process operations. The calculation contents shown in FIG. 21 are related to sense latch data on the side of the operation-selected memory mat (namely, input/output node data of sense latch circuit SL on the side of operation-selected memory mat). Although the concrete calculating method will be discussed later, both the multi-sense method and the multi-power supply method may be employed. The multi-sense method corresponds to such an operation that while bit line precharge voltages are selected as three levels of 0V, 0.5V, and 1.0V, the sense operations by the sense latch circuit SL are carried out plural times so as to latch subject data into the sense latch circuit SL. The multi-power supply method corresponds to such an operation that while bit line precharge voltages are selected as four levels of 0V, 0.5V, 1.0V and 2.0V, a single sense operation by the sense latch circuit SL is carried out so as to latch subject data into the sense latch circuit SL.

In FIG. 21, symbols "A" and "B" show 2-bit program data corresponding to a single sense latch circuit SL. Concretely speaking, symbol "A" indicates an upper digit data bit latched by the data latch circuit DLL, and symbol "B" shows a lower digit data bit latched by the data latch circuit DLR. In accordance with FIG. 21, when the "01" program data latch process operation is carried out, a logic OR gating operation between the data bit A and the inverted data of the data bit B is performed; when the "00" program data latch process operation is carried out, a logic OR gating operation between the data bit A and the data bit B is performed. Also, when the "10" program data latch process operation is carried out, a logic OR gating operation between the data bit B and the inverted data of the data bit A is performed; when the "00" erratic detection data latch process operation is carried out, a negative logic OR gating operation between the data bit A and the data bit B is performed. Also, when the "10" erratic detection data latch process operation is carried out, a logic AND gating operation between the data bit A and the inverted data of the data bit B is performed; and further when the "11" erratic detection data latch process operation is carried out, a logic AND gating operation between the data bit A and the data bit B is performed.

In the case that the calculation logic of FIG. 21 is employed, logic values of calculation results with respect to the logic values of the data bits A and B are given as shown in FIG. 22. As previously explained, the logic value "0" (namely, low level) of the sense latch data implies the application of the programing potential (program selection).

FIG. 23 is a flow chart for describing a more detailed operation of the above-described "01"programing process operation TS1. In accordance with this flow chart, the "01" programing process operation TS1 is constituted by the data latch process S10, the "01" program bias application process S11, the program verify process S12, and the all judgment process S13. In the data latch process S10, when the 2-bit program data "01" is latched in the two data latch circuits DLL and DLR corresponding thereto, a program enable bit is latched by the sense latch circuit SL, whereas when the program data other than the above-described program data "01" is latched in the two data latch circuits DLL and DLR, a program disable level is latched by the sense latch circuit SL. In the "01" program bias application process S11, when a program enable level is latched by the sense latch circuit SL, a high potential is required to be applied between the control gate and the bit line on the input/output node side of this enable level in the programing-operation selected memory mat. At the process step S12, the verify operation based upon the program verify voltage VWV3 is carried out. At the process step S13, a judgment is made as to whether or not the all judgment result fails. When the all judgment result fails, the "01" programing process operation is returned to the process step S11. When the all judgment result is normal the "01" programing process operation is ended. Since the calculation methods, the program bias voltages, and the program verify voltages for the data latch process operations are individually specific to the above-explained process operations TS2 and TS3, and also the schematic process sequential operations are identical to the process sequential operation of the process operation TS1 as described in the flow chart thereof, detailed process operations thereof are omitted.

FIG. 24 is a flow chart for describing a detailed operation of the above-explained "10" erratic detection process operation. In accordance with this flow chart, the "10" erratic detection process operation is arranged by a data latch process S20, an erratic verify process S21, and an all judgment process S22. In the data latch process S20, a latch process operation is carried in accordance with the calculation contents shown in FIG. 21 and FIG. 22. In the erratic verify process S21, the verification is carried out as to whether or not the threshold voltage exceeds VWE 1 with respect to the memory cell transistor to which "10" program data has been written. At the process step S22, a judgment is made as to whether or not the all judgment result fails. When the all judgment result fails, the "10" erratic detection process operation is advanced to the process step S6. When the all judgment result is normal, the "10" erratic detection process operation is ended. Since the calculation methods and the program verify voltages for the data latch process operations other than the erratic/disturb detection process TS4 are individually specific thereto TS2 and TS3, and also the schematic process sequential operations are identical to the process sequential operation of the "10" erratic detection process operation, detailed process operations thereof are omitted.

Data Latch Process Operations

FIG. 25 to FIG. 30 represent an example of calculating process methods of data latch process operations as typically defined in the above-explained steps S10 and S20. In these drawings, operation-selected memory mats are defined as right-sided memory mats (MMR) as viewed. Also the respective drawings, as to numeral numbers expressed in correspondence with either signals or nodes indicated in each of steps, a numeral number having a decimal point implies a voltage, whereas numeral number without a decimal point implies a logic value (high level implies "1", and low level implies "0"). Also, as to numeral numbers with brackets expressed in correspondence with the data latch circuits DLL and DLR, the numeral number outside the bracket implies a logic value of a left-sided input/output node, and the numeral number inside the bracket implies a logic value of a right-sided input/output node.

Referring now to FIG. 25, the "01" program data latch process operation S10 by the multi-sense method will be described in detail.

It is now assumed that data have been latched in the data latch circuits DLL and DLR. FIG. 25 represents such a case that the latched data are four different data, i.e., "01", "00", "10", and "11". At a step 2 of this drawing, the bit line G-BLL on the side of the non-selected memory mat is precharged via the transistor M24L to 0.5V (a). Also, the bit line G-BLR is precharged to either 0.0V or 1.0V by employing the transistors M26R and M27R in response to the data latched by the data latch circuit DLR (b).

At a step 3, in accordance with the results of the above conditions (a) and (b), the sense latch circuit SL is activated to execute the sense latch operation. As a result, the right/left input/output nodes SL (L) and SL (R) of the sense latch circuit SL are brought into conditions (c) and (d) shown in FIG. 25.

At a step 4, in accordance with the result of the condition (c), the voltage of the bit line G-BLL employs a voltage of (e). Also, the other bit line G-BLR is cleared to a logic value "0".

At a step 5, the transistor M26L is turned ON by the data having the logic value of "1" latched by the data latch circuit DLL, and the bit line G-BLL corresponding to the data latch circuit DLL for latching the logic value "1" is forcibly set to a low level via the transistors M27L and M26L (g). Also, both the input/output node SL (L) and the input/output node SL (R) of the sense latch circuit SL are cleared to the logic value of "0".

At a step 6, the bit line G-BLR on the side of the selected memory mat is precharged to 0.5V (i). Then, at a step 7, when the sense latch operation of the sense latch circuit SL is executed, either the input/output node SL (L) or the input/output node SL (R) on the side of the selected memory mat of the sense latch circuit SL latches the logic value of "0" only when "01" is latched in the data latch circuits DLL and DLR (j). FIG. 38 indicates an example of operation timing of the above-described program data latch process operation.

In such a case that the latched data of the input/output node on the side of the operation-selected memory mat in the sense latch circuit SL is equal to the logic value of "0", the level at the bit line connected to this input/output node is set to 0V, and a high program potential is applied between the drain (connected to this bit line) of the memory cell transistor and the control gate thereof, so that the programing operation with respect to the memory cell transistor is carried out.

FIG. 31 shows a detailed operation of the above-described program bias application process operation S11 in the programing operation when the program bias application is commenced. FIG. 32 indicates a detailed operation of the above-explained program bias application process operation S11 in the programing operation when the program bias application is ended. In other words, a program blocking voltage is conducted to the bit line of the programing-operation non-selected memory mat. In response to the latched data of the sense latch circuit SL, the bit line on the side of the programing-operation selected memory mat is brought into either 0V or 6V, and such a high voltage as 17V is applied to the word line, so that the program operation is carried out with respect to the memory cell transistor. After the programing operation is accomplished, the bit lines G-BLL and G-BLR are discharged. FIG. 39 shows an example of the program operation timing.

After the program bias has been applied, the above-explained program-verify process operation S12 is carried out. For example, as exemplified in FIG. 33, the bit line provided on the side of the programing-operation non-selected memory mat, for instance, G-BLL is precharged to the reference voltage 0.5V, and also the bit line provided on the side of the programing-operation selected memory mat, for instance, G-GLR is precharged to 1.0V. Thereafter, as exemplified in FIG. 34, the word line selecting operation with employment of the verify voltage is carried out. Since the word line selecting operation is performed, such a memory cell whose threshold voltage is lower than this verify voltage is turned ON, whereas such a memory cell whose threshold voltage is higher than this verify voltage is turned OFF. Then, a state change caused by a change in potentials of the bit line, which is caused by the above word line selecting operation, is detected by the sense latch circuit SL (see FIG. 35). Finally, the defined data is latched (see FIG. 36). FIG. 40 represents an example of operation timing of the program verification operation.

After the sense latch circuit SL has latched the defined data, the above-described all judgment process operation S13 is performed. In this all judgement process operation, a check is made as to whether or not the MOS transistor of the bit line provided on the side of the programing-operation non-selected memory mat, for example, the MOS transistor M23L is turned ON. If there is even one memory cell transistor in which the programing operation fails, the potentials at both the bit line connected to this transistor and the bit line located opposite to this bit line become high levels, so that the transistor M23L is turned ON, through which a current will flow (see FIG. 37). While the current flows, the programing operation fails. As previously explained, a bias voltage is again applied to the memory cell transistor. FIG. 41 indicates an example of operation timing of the all judgement process operation.

It should be noted that FIG. 26 indicates a detailed operation of the "00" program data latch process operation by the multi-sense method, and FIG. 27 represents a detailed operation of the "10" program data latch process operation by the multi-sense method. Also, FIG. 28 indicates a detailed operation of the "00" erratic detection data latch process operation by the multi-sense method, and FIG. 29 represents a detailed operation of the "10" erratic detection data latch process operation by the multi-sense method. Also, FIG. 30 shows a detailed operation of the "11" disturb detection data latch process operation by the multi-sense method. Precisely speaking, although concrete contents of these process operations are different from the concrete content of the data latch process operation shown in FIG. 25, these process operations commonly employ the precharge operations and the sense operations. Accordingly, since the contents of these process operations may be readily understood, a detailed description thereof is omitted.

FIG. 42 to FIG. 53 represent detailed operation data latch process operations in the case of the multi-power supply method. Similar to FIG. 42 to FIG. 47, and FIG. 25 to FIG. 30, in these drawings, program-operation selected memory mats are defined as right-sided memory mats as viewed. Also, the respective drawings, as to numeral numbers expressed in correspondence with either signals or nodes indicated in each of steps, a numeral number having a decimal point implies a voltage, whereas a numeral number without a decimal point implies a logic value (high level implies "1", and low level implies "0").

Referring now to FIG. 42, a detailed operation will be made of, for example, a "01" program data latch process operation by the multi-power supply method.

It is now assumed that data have been latched in the data latch circuits DLL and DLR. FIG. 42 represents such a case that the latched data are four different data, i.e., "01", "00", "10", and "11". At a step 1 of this drawing, the bit line G-BLL on the side of the non-selected memory mat is precharged via the transistor M24L to 1.0V (a). Also, the bit line G-BLR on the side of the selected memory mat is precharged via the transistor M24R to 2.0V(b).

At a step 2, the transistor M26L is turned ON by the data having the logic value of "1" latched by the data latch circuit DLL, and the bit line G-BLL corresponding to the data latch circuit DLL for latching the logic value "1" is forcibly set to a low level via the transistors M27L and M26L (c). Similarly, the transistor M26R is turned ON by the data having the logic value of "1" latched by the data latch circuit DLR, and the bit line G-BLR corresponding to the data latch circuit DLR for latching the logic value "1" is forcibly set to a low level via the transistors M27R and M26R (d).

At a step 3, the bit line G-BLR of 0.0V is precharged to 0.5V (e). Then, at a step 4, when the sense latch operation of the sense latch circuit SL is executed, either the input/output node SL (L) or the input/output node SL (R) on the side of the selected memory mat of the sense latch circuit SL latches the logic value of "0" only when "01" is latched in the data latch circuits DLL and DLR (f). FIG. 48 indicates an example of operation timing of the above-described "01" program data latch process operation. In such a case that the latched data of the input/output node on the side of the operation-selected memory mat in the sense latch circuit SL is equal to the logic value of "0", the level at the bit line as connected to this input/output node is set to 0V, and a high program potential is applied between the drain (connected to this bit line) of the memory cell transistor and the control gate thereof, so that the programing operation with respect to the memory cell transistor is carried out.

FIG. 43 shows a detailed operation of the above-described "00" program data latch process operation by the multi-power supply method. FIG. 49 shows an example of operation waveforms of this "00" program data latch process operation. FIG. 44 represents a detailed operation of a "10" program data latch process operation by the multi-power supply method, and FIG. 50 indicates an example of operation waveforms of this "10" program data latch process operation. Also, FIG. 45 shows a detailed operation of a "00", erratic detection data latch process operation by the multi-power supply method, and FIG. 51 shows an example of operation waveforms of this "00" erratic detection data latch process operation. FIG. 46 shows a detailed operation of a "10" erratic detection data latch process operation by the multi-power supply method, and FIG. 52 shows an example of operation waveforms of this "10" erratic detection data latch process operation. FIG. 47 represents a detailed operation of a "11" disturb detection data latch process operation by the multi-power supply method, and FIG. 53 indicates an example of operation waveforms of this "11" disturb detection data latch process operation. Precisely speaking, although concrete contents of these process operations are different from the concrete content of the data latch process operation shown in FIG. 42, these process operations commonly employ the precharge operations and the sense operations. Accordingly, since the contents of these process operations may be readily understood, a detailed description thereof is omitted.

FIG. 54 represents various voltage conditions with respect to the respective operation modes of the above-explained flash memory. In FIG. 54, a voltage of a word line used to read "11" data is 2.4V, a voltage of a word line used to read "10" data is 3.2V, and a voltage of a word line used to read "00" data is 4.0V. Also, a voltage of a word line used to program "10" data is 15.1V, a voltage of a word line used to program "00" data is 15.8V, and a voltage of a word line used to program "01" data is 17.0V. Also, a voltage of a word line used to verify "10" data is 2.8V, a voltage of a word line used to verify "00" data is 3.6V, and a voltage of a word line used to verify "01" data is 4.5V. Also, a "11" word disturb detection voltage is 2.1V, a "10" word disturb detection voltage is 3.1V, and a "00" word disturb detection voltage is 3.9V.

Retry Function and Recovery Function

As apparent from the flow chart shown in FIG. 16, even when a programing operation of the above-described flash memory 1 fails, the program data appearing at this time is saved in the data latch circuits DLL and DLR. When the flash memory 1 receives a retry program command after the failure programing operation is accomplished, the program data which has been saved in the data latch circuits DLL and DLR can be written at an address supplied in combination with this retry program command. In other words, as indicated in a flow chart of FIG. 55, when a retry program command (10H) is entered into the flash memory 1 (step S30), a sector address is subsequently entered (steps S31 and S32). Then, the program data which has been latched in the data latch circuits DLL and DLR is written at the entered sector address (word line address). This data programing operation is carried out within the flash memory 1 (step S33).

Also, the above-described flash memory 1 has conducted the reprogram process operation to another flash memory as the reprograming operation after the programing operation failed. That is to say, as indicated in a flow chart of FIG. 56, after the programing operation has failed, when the flash memory 1 receives a recovery read command (01H) (step S40), the program data saved in the data latch circuits DLL and DLR can be outputted via the output buffer 15 and the multiplexer 7 to the input/output terminals I/O0 to I/O7 (step S41).

FIG. 57 indicates a transition state of internal operations in the flash memory having the above-explained retry function and recovery function. When the power supply is turned ON, the flash memory is brought into a deep standby condition, and when a reset signal is negated, this flash memory is brought into a standby condition. When the flash memory is transferred from the standby condition to a chip select condition, this flash memory is brought into an output disable condition, so that the flash memory is operable in response to a command input. The command responding operations are mainly classified into a read setup, a sector erase setup, and a program setup. When an error happens to occur in the erase setup, or the program setup, this flash memory can accept a recovery read setup command and a retry program setup command.

FIG. 58 schematically represents an example of a memory card with employment of the above-described flash memory 1. A memory card 200 shown in this drawing is constituted by that a local memory 201, a memory controller 202, a buffer memory 203, and an external interface circuit 204 are packaged on a card board. A large number of the above-explained flash memories 1 are packaged on this local memory 200. The memory controller 202 contains a control signal controller 210, an address controller 211, and a data I/O controller 212. The control signal controller 210 produces an access control signal of the flash memory 1 and also an access control signal of the buffer memory 203. The address controller 211 performs a chip selection control with respect to the flash memory 1 and the buffer memory 203. The data I/O controller 212 interface-controls data, a command, and an address with respect to the flash memory 1 and the buffer memory 203. The external interface circuit 204 owns such a structure standardized to, for instance, the PC card interface.

In FIG. 59, there is shown an example of a data processing system with employment of the above-explained flash memory 1. This data processing system of FIG. 59 owns the following different point, as compared with that of FIG. 58. The above-explained memory controller 202 is arranged as one peripheral circuit to a control bus CBUS, an address bus ABUS, and a data bus DBUS, to which either a CPU or a microprocessor 230 is connected, similar to a ROM 231 and a RAM 232.

Since the flash memory 1 owns the above-explained retry function, either the memory controller 210 or the microprocessor 230, which controls the access operation to this flash memory 1, can readily perform the reprograming operation by changing either a program address or a sector address with respect to another flash memory in which a programing operation has failed.

Also, the control apparatus can readily perform the reprograming operation with respect to another flash memory other than such a flash memory that a programing operation has failed even when this control apparatus need not store thereinto the program data. This control apparatus access-controls either a memory controller of a memory card or this memory card constituted by a plurality of flash memories due to this recovery function.

FIG. 60 indicates a conceptional diagram of the above-explained retry function and also of the above-described recovery function. For example, as shown in FIG. 60(A), both the program data and the sector address are supplied from the buffer memory 203 to the flash memory 1 under control of the memory controller 202. As a consequence, the flash memory 1 executes such an operation for programing the data at the supplied sector address. When an error happens to occur in this programing operation, the flash memory 1 sets an error flag to the control register 180. As shown in FIG. 60(B), the error flag is transferred via the memory controller 202 to the microprocessor 230 and the like. As a result, as represented in FIG. 60(C), when a recovery command is outputted from the memory controller 202 to the flash memory 1, the flash memory 1 outputs the program data latched by the data latch circuits DLL and DLR as indicated in FIG. 60(D). Also, as shown in FIG. 60(E), when the memory controller 202 supplies both a retry program command and a sector address to the flash memory 1, as indicated in FIG. 60(F), the flash memory 1 executes the programing operation in such a manner that the program data already latched to the data latch circuits DLL and DLR is written into a newly designated sector address.

Reprogram Function

A reprograming operation may be realized by that after data is erased by receiving an erase command, data is written by receiving a program command. In accordance with FIG. 3, after the erase command is performed, a program command is executed. The flash memory 1 may realize such a reprograming process operation by using a single command, namely a reprogram command.

FIG. 61 is a flow chart for explaining an example of a process operation by receiving a reprogram command. That is, when a first reprogram command is supplied (step S60), a sector address to be rewritten is fetched (step S61), and then data at the fetched sector address is read to be latched into the data latch circuits DLL and DLR (step S62). Thereafter, the program data is acquired to the data latch circuits DLL and DLR (step S63). After a second reprogram command is supplied (step S64), the data of the sector designated by the above-explained reprogram sector address is erased (step S65). Next, a programing operation of the designated sector is carried out by employing the data saved in the data latch circuits DLL and DLR (step S66). This programing operation of the designated sector is the same as that as explained in FIG. 16. While using this reprogram command, namely a single command, all of the data stored in the sector can be rewritten.

Alternatively, data stored in a portion of one sector may be rewritten by using a single command. That is, as indicated in FIG. 62, when a first reprogram command is supplied (step S70), a sector address to be rewritten is fetched (step S71), and data is saved from a memory cell of the acquired sector address into the data latch circuits DLL and DLR (step S72). Thereafter, such data which are continuously required from a head Y address YA(o) of the sector up to a Y address YA(k) are latched into the data latch circuits DLL and DLR (step S73). Furthermore, if necessary, such a Y address YA(m) where k<m is acquired (step S74), and such data which are continuously required from the acquired Y address YA(m) up to a Y address YA(m+1) are latched into the data latch circuits DLL and DLR (step S75). When a second reprogram command is supplied (step S76), the data of the sector designated by the above-explained reprogram sector address is erased. Next, a programing operation of the designated sector is carried out based upon the data latched in the data latch circuits DLL and DLR (step S78). This programing operation of the designated sector is the same as that as explained in FIG. 16.

Alternatively, data stored in a portion of one sector may be rewritten in accordance with a flow chart as indicated in FIG. 63. That is, when a first reprogram command is supplied (step S80), a sector address to be rewritten is fetched (step S81), and data is saved from a memory cell of the acquired sector address into the data latch circuits DLL and DLR (step S82). Thereafter, a head Y address YA(m) of the sector is fetched (step S83), and such data which are continuously required from the head Y address YA(m) of the sector up to a Y address YA(m+k) are latched into the data latch circuits DLL and DLR (step S84). Furthermore, if necessary, such a Y address YA(n) where m+k<n is acquired (step S85), and such data which are continuously required from the acquired Y address YA(n) up to a Y address YA(n+1) are latched into the data latch circuits DLL and DLR (step S86). It should be understood that the above-explained process operations defined at the steps S85 and S86 may be repeatedly performed plural times, if required. When a second reprogram command is supplied (step S87), the data of the sector designated by the above-described reprogram sector address is erased (step S88). Next, a programing operation of the designated sector is carried out by employing the data saved in the data latch circuits DLL and DLR (step S89). This programing operation of the designated sector is the same as that as explained in FIG. 16.

Partial Erasing Function

In the case that the flash memory 1 is utilized as a file memory, a management area may be allocated to a sector, and the remaining portion may be opened as a user area. For example, such information as reprogram times and good/fail sectors is stored into the management area, and also when a management area is erased in unit of a sector by a user, a command capable of automatically bringing a management area out of erasing is supported. This may cause the flash memory 1, and moreover the file memory to be readily used. In view of this technical point, the flash memory 1 may support the above-described partial erasing command. In other words, in the flow chart of FIG. 64 for indicating the partial erasing function, when a first partial erasing command is supplied (step S90), a sector address is acquired (step S91). Subsequently, when a second partial erasing command is supplied (step S92), data of a predetermined area (for example, management area) within a sector designated by said sector address is saved in the data latch circuits DLL and DLR corresponding to this predetermined area, and also data for instructing an erasing state is set to data latch circuits DLL and DLR corresponding to other areas within this sector (step S93). As a result, the read data is saved into the data latch circuits DLL and DLR corresponding to the management area of the designated sector, whereas "11" data corresponding to the erasing state is set to the data latch circuits DLL and DLR corresponding to other areas of this sector. Then, after the data for the sector designated by the sector address is erased, a programming operation is carried out based upon the data set to the data latch circuits DLL and DLR (step S94). It should also be noted that the programing operation of the designated sector is identical to the programing operation as explained with reference to FIG. 16.

FIG. 65 and FIG. 66 schematically show a detailed overall operation of the above-described "designated sector data reading" operation defined at the step S93. The process operation indicated in FIG. 66 succeeds to the process operation shown in FIG. 65. In FIG. 65 and FIG. 66, numeral "1" implies such a case that a potential at a corresponding node is high, and numeral "0" implies such a case that a potential at a corresponding node is low. The process operations shown in FIG. 65 and FIG. 66 are performed in such an assumption that a right-sided memory mat is an operation selected memory mat. FIG. 67 indicates relationship between word line selection levels VRW1, VRW2, VRW3 and a threshold voltage distribution. These word line selection levels are used to read data at a designated sector.

At a step 1 of FIG. 65, while the word line level is selected to be VRW1, data stored in a memory cell of a designated sector is read, and then the read data is latched to the sense latch circuit SL. At a step 2, data of a right-sided node of the sense latch circuit SL is internally transferred to the data latch circuit DLR. At a step 3, while the word line level is selected to be VRW2, data stored in a memory cell of a designated sector is read, and the read data is latched to the sense latch circuit SL. Then, at a step 3.5, data "0" is set to a right-sided input/output node of a sense latch circuit SL except for a management area selected by a Y address decoder. Then, at a step 4, data of a left-sided node of the sense latch circuit SL is internally transferred to the data latch circuit DLL. As a consequence, only a portion of the required read data can be saved in the data latch circuit DLL.

At a step 5, while the word line level is selected to be VRW3, data stored in a memory cell of a designated sector is read, and the read data is latched to the sense latch circuit SL. Then, at a step 5.5, data "1" is set to the right-sided input/output node of the sense latch circuit SL except for the management area selected by the Y address decoder. Then, at a step 6, the data latched by the data latch circuit DLR is internally transferred via the transistor M28R to the bit line G-BLR. Then, at a step 7, a right-sided bit line G-BLR corresponding to the sense latch circuit SL in which the data "1" is set to the right-sided input/output node SLR is controlled to a low level. At a step 8, the data is transferred from the sense latch circuit SL to the data latch circuit DLR. As a result, the 4-value information of the read data of the designated sector is stored in the data latch circuits DLL and DLR of the management area, and data indicative of an erasing condition is stored in the data latch circuits DLL and DLR corresponding to another area (namely, memory area) of the designated sector.

In accordance with the above-described flash memory, memory card, and data processing system, the below-mentioned effects can be achieved:

[1] The externally supplied program data is latched into the data latch circuits DLL and DLR, and a judgment is carried out as to whether or not the latched program data corresponds to which threshold value of the multi-levels every time the programing operation of the plural stages is performed. Then, the program information corresponding to this judgment result is latched into the sense latch circuit SL. In response to the program information latched in the sense latch circuit SL, the programing operation for setting the threshold voltages of the multi-levels to the memory cell is carried out in a stepwise manner. As a consequence, even when the programing operation is accomplished, the program data which has been originally and externally supplied is left in the data latch circuits DLL and DLR. Accordingly, even when the programing operation of the multi-levels information with respect to the memory cell MC based upon the detection result of the word disturb detecting operation, or the detector result of the erratic detecting operation is again carried out, the program data is no longer again accepted from the external devices.

[2] Even when the programing operation fails, sine the program data at this time is saved in the data latch circuits DLL and DLR within the flash memory, in the case that the retry program command is accepted after the failure programing operation has been accomplished, the program data already saved in the data latch circuits can be written to the address supplied in connection with this retry program command. Since the flash memory owns such a retry function, the memory controller for access-controlling this flash memory changes either the program address or the sector address with respect to the semiconductor device in which the programing operation has failed, so that the memory controller can readily perform the reprograming operation.

[3] When the flash memory receives the recovery read command after the programing operation has failed, this flash memory outputs the program data saved in the data latch circuits DLL and DLR to the external device. Due to this recovery function, the control apparatus can readily reprogram the same data into another flash memory other than such a flash memory where the programing operation has failed. This control apparatus access-controls either the memory controller of the memory card, or the memory card constituted by the plurality of semiconductor devices.

[4] When the first reprogram command is supplied, the reprogram address is fetched, and also the program data is fetched by the data latch circuit. After the second reprogram command is supplied, the area designated by the reprogram address is erased. Subsequently, the programing operation is controlled based upon the data saved in the data latch circuits. As a result, all of the data in a sector can be rewritten by way of a single command.

[5] Since the partial erasing command is supported, the management area of the sector can be automatically derived from the area to the erased.

While the present invention by the inventors has been described with reference to the various preferred embodiments in detail, the present invention is not limited to these embodiments, but may be apparently modified, changed, or substituted without departing from the technical spirit and scope of the invention.

For example, the information saved in a single memory cell is not limited to 4 values, but may be more values. In such an example case that 8 values are saved in a single memory cell, a total number of data latch circuits connected to bit lines may be furthermore increased. The calculation method for the data latch process operation is not limited to the above-explained calculation method, but may be properly changed. Furthermore, a total number of memory mats, the programing voltage condition, the erasing voltage condition, and the verify voltage condition may be properly changed. Also, both the erasing state and the programing state may be defined based upon the definition opposite to the above-explained definition. Also, the semiconductor device according to the present invention is not limited to the memory chip such as the flash memory, but also may be widely applied to a data processing semiconductor device, or a logic operation semiconductor device such as a flash memory built-in type microcomputer. Furthermore, the present invention may be applied to an EEPROM.

The advantages achieved by the typical disclosed invention will now be simply explained as follows:

That is to say, the program data does not disappear even during the programing operation, and this program data is externally supplied to the data latch circuits in order to program the information having the multi-levels into each of the memory cells. As a consequence, even when the programing operation is accomplished, the originally and externally supplied program data is left in the data latch circuits. As a consequence, even when the programing operation of the multi-level information is retried with respect to the memory cell, the program data is no longer again received from the external circuit based on the word disturb detection result, or the erratic detection result.

Also, in such a case that the programing operation of the multi-level information is again carried out with resect to the memory cell, the program data need not be again received from the external circuit.

When the programing operation has failed, the program data which has been internally saved at this failure end can be rewritten by designating another memory address.

Also, when the programing operation has failed, the program data obtained at this failure end can be outputted outside the flash memory.

We claim:

1. A nonvolatile memory system comprising:

a control device; and a plurality of nonvolatile memory devices each of which has a plurality of memory cells and a plurality of data latches;

wherein said control device supplies a plurality of commands to said nonvolatile memory devices, which commands comprise a write command, a first read command and a second read command, wherein, when said control device supplies said write command with write address information and data for storing in said nonvolatile memory device, said nonvolatile memory device stores data to said data latches, stores said data in said data latches to ones of said memory cells and verifies whether said write data has been stored in said memory cells or not, wherein, when said control device supplies said first read command with read address information, said nonvolatile memory device reads data stored in ones of said memory cells to said data latches and outputs said data in said data latches to said control device, and wherein, when said control device supplies said second read command, said nonvolatile memory device outputs data in said data latches to said control device.

2. A nonvolatile memory system according to claim 1, wherein, in an operation of said write command, said nonvolatile memory device supplies information to said control device as to whether the data storing is a success or a failure, and wherein said control device is capable of supplying said second read command when said control device is supplied with said information indicating the data storing being a failure.

3. A nonvolatile memory system according to claim 2, wherein said control device is capable of supplying said write command and received data from said nonvolatile memory device by said second read command to another nonvolatile memory device.

4. A nonvolatile memory system according to claim 2, wherein said control device is capable of supplying said write command with address information different from said write address information and received data from said nonvolatile memory device by said second read command.

* * * * *